(12) United States Patent
Lee et al.

(10) Patent No.: US 11,314,349 B2
(45) Date of Patent: Apr. 26, 2022

(54) TOUCH DISPLAY DEVICE

(71) Applicant: LG DISPLAY CO., LTD., Seoul (KR)

(72) Inventors: HwiDeuk Lee, Gumi-si (KR); Yangsik Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/922,409

(22) Filed: Jul. 7, 2020

(65) Prior Publication Data
US 2021/0026478 A1 Jan. 28, 2021

(30) Foreign Application Priority Data
Jul. 22, 2019 (KR) .................. 10-2019-0088386

(51) Int. Cl.
*G06F 3/041* (2006.01)
*G06F 3/044* (2006.01)
*H01L 27/32* (2006.01)
*H01L 51/52* (2006.01)
*G09G 3/3266* (2016.01)

(52) U.S. Cl.
CPC .......... *G06F 3/0412* (2013.01); *G06F 3/0445* (2019.05); *G06F 3/0446* (2019.05); *G06F 3/04164* (2019.05); *H01L 27/323* (2013.01); *H01L 27/3276* (2013.01); *H01L 51/5253* (2013.01); *G06F 2203/04111* (2013.01); *G06F 2203/04112* (2013.01); *G09G 3/3266* (2013.01)

(58) Field of Classification Search
CPC ............... G06F 3/0412; G06F 3/04164; G06F 3/044–0448; G06F 3/047; G06F 3/0416; G06F 2203/04111; G06F 2203/04112; G06F 2203/04103; G09G 3/3266; G09G 3/3225; G09G 3/3233; G09G 2300/023; G09G 2300/0426; G09G 2300/0819; G09G 2300/0842; G09G 2300/0861; G09G 2310/0281; G09G 2354/00; H01L 27/3276; H01L 27/323; H01L 51/5253
See application file for complete search history.

(56) References Cited

U.S. PATENT DOCUMENTS

| | | | |
|---|---|---|---|
| 2015/0185903 A1* | 7/2015 | Park | G06F 3/0446 345/173 |
| 2018/0033830 A1* | 2/2018 | Kim | G06F 3/0446 |
| 2019/0103443 A1* | 4/2019 | Kim | H01L 51/5253 |
| 2019/0129551 A1* | 5/2019 | Lee | G06F 3/0412 |
| 2019/0155428 A1* | 5/2019 | Lee | G06F 1/1688 |
| 2020/0161398 A1* | 5/2020 | Bang | H01L 27/3279 |

\* cited by examiner

*Primary Examiner* — David Tung
(74) *Attorney, Agent, or Firm* — Birch, Stewart, Kolasch & Birch, LLP

(57) ABSTRACT

Embodiments of the present disclosure relate to a touch display device, and more particularly, to a touch display device which can have a small bezel size even when touch routing lines connecting a touch sensor to a touch sensing circuit are disposed in a non-display area and which can improve touch sensitivity by preventing or minimizing the formation of parasitic capacitance that can be caused by the touch routing lines.

26 Claims, 42 Drawing Sheets

TOUCH DISPLAY DEVICE

CROSS REFERENCE TO RELATED APPLICATION

This application claims priority to Korean Patent Application No. 10-2019-0088386, filed on Jul. 22, 2019 in the Republic of Korea, the entire contents of which are hereby incorporated by reference for all purposes as if fully set forth herein into the present application.

BACKGROUND OF THE INVENTION

1. Field of the Invention

Embodiments of the present disclosure relate to a touch display device.

2. Discussion of Related Art

Touch display devices are devices capable of providing a touch-based input function that allows a user to easily input information or commands intuitively and conveniently, in addition to a display function of displaying a video or an image.

In order to provide the touch-based input function, such touch display devices need to identify the presence or absence of a user's touch and accurately sense touch coordinates. To this end, the touch display device includes a touch sensor, a touch sensing circuit, touch routing lines connecting the touch sensor to the touch sensing circuit, and the like.

Recently, display panels including a touch sensor embedded therein have been developed for various reasons. In the case of such display panels, due to the embedded touch sensor, there may arise a limitation in that a bezel becomes larger or parasitic capacitance is increased.

SUMMARY OF THE INVENTION

Embodiments of the present disclosure are directed to providing a touch display device including a small-sized bezel even when touch routing lines connecting a touch sensor to a touch sensing circuit are disposed in a non-display area.

Embodiments of the present disclosure are also directed to providing a touch display device capable of improving touch sensitivity by preventing or minimizing the formation of parasitic capacitance, which can be caused by touch routing lines connecting a touch sensor to a touch sensing circuit, from being formed.

Embodiments of the present disclosure are also directed to providing a touch display device including touch routing lines having an improved arrangement structure suitable for a double routing structure.

Embodiments of the present disclosure are also directed to providing a touch display device including touch routing lines having an improved arrangement structure suitable for a single routing structure.

Embodiments of the present disclosure are also directed to providing a touch display device including touch routing lines having an improved arrangement structure suitable for a half-single routing structure.

According to an aspect of the present disclosure, there is provided a touch display device including a plurality of pixel electrodes each disposed for each of a plurality of subpixel areas on a substrate, a common electrode disposed on the plurality of pixel electrodes and to which a common voltage is applied, an encapsulation layer disposed to cover the common electrode, and a touch sensor including n first touch electrode lines and m second touch electrode lines disposed on the encapsulation layer in a display area, wherein each of the n first touch electrode lines and the m second touch electrode lines includes one or more touch sensor metals. Here, n and m can be natural numbers, e.g., positive numbers.

The touch display device can further include a touch pad part disposed in a first non-display area, which is located at an outer periphery of the display area in a first direction, among non-display areas that are outer areas of the display area and including 2n first touch pads and 2m second touch pads.

The touch display device can include 2n first touch routing lines coming or extending downward along an inclined surface of the encapsulation layer and electrically connecting one ends and the other ends of the n first touch electrode lines to the 2n first touch pads disposed in the first non-display area, respectively, and 2m second touch routing lines coming or extending downward along the inclined surface of the encapsulation layer and electrically connecting one ends and the other ends of the m second touch electrode lines to the 2m second touch pads disposed in the first non-display area, respectively.

Two or more first touch routing lines among the 2n first touch routing lines and two or more second touch routing lines among the 2m second touch routing lines can pass through a second non-display area located at an outer periphery of the display area in a second direction.

The two or more first touch routing lines passing through the second non-display area can include one or more first touch routing lines including the touch sensor metal and one or more first touch routing lines including a first metal different from the touch sensor metal.

The two or more second touch routing lines passing through the second non-display area can include one or more second touch routing lines including the touch sensor metal and one or more second touch routing lines including the first metal.

The first metal can be a metal different from the touch sensor metal and can include at least one of a source-drain metal included in source and drain electrodes of transistors disposed in the display area and a gate metal included in gate electrodes of the transistors disposed in the display area.

In the two or more first touch routing lines passing through the second non-display area, the one or more first touch routing lines including the touch sensor metal and the one or more first touch routing lines including the first metal can be disposed to be staggered on different layers.

In the two or more second touch routing lines passing through the second non-display area, the one or more second touch routing lines including the touch sensor metal and the one or more second touch routing lines including the first metal can be disposed to be staggered on different layers.

The touch display device can further include a gate driving circuit electrically connected to a plurality of gate lines disposed in the display area, disposed in the second non-display area, and including transistors including the first metal.

The touch display device can further include a power transmission pattern disposed in the second non-display area and configured to transmit the common voltage to the common electrode.

The power transmission pattern can include the first metal different from the touch sensor metal.

The power transmission pattern can be disposed to be closer to the display area than the gate driving circuit.

The common electrode extending from the display area to the second non-display area can overlap the gate driving circuit.

The common electrode can be open so that the gate driving circuit is exposed.

The two or more first touch routing lines passing through the second non-display area and the two or more second touch routing lines passing through the second non-display area can be disposed without overlapping the common electrode extending from the display area to the second non-display area.

The two or more second touch routing lines passing through the second non-display area can be disposed further outward than the two or more first touch routing lines passing through the second non-display area.

The one or more first touch routing lines, which include the touch sensor metal, among the two or more first touch routing lines passing through the second non-display area can be disposed on the encapsulation layer, and the one or more first touch routing lines, which include the first metal, among the two or more first touch routing lines passing through the second non-display area can be disposed below the encapsulation layer.

Some of the one or more first touch routing lines, which include the touch sensor metal, among the two or more first touch routing lines passing through the second non-display area can overlap the inclined surface of the encapsulation layer in the second non-display area.

Each of the two or more first touch routing lines passing through the second non-display area can include an upper line including the touch sensor metal and a lower line including the first metal, one end of the upper line can be in contact with one end of the lower line at a first point located at an outer periphery of an end portion of the encapsulation layer in the first direction, and the other end of the upper line can be in contact with the other end of the lower line at a third point located at an outer periphery of an opposite end portion of the encapsulation layer in a direction opposite to the first direction.

One first touch routing line among the two or more first touch routing lines passing through the second non-display area can be connected to the corresponding first touch electrode line through a metal disposed above or below another first touch routing line.

The n first touch electrode lines can be transmission electrode lines to which a driving signal is applied by a touch sensing circuit, and the m second touch electrode lines can be receiving electrode lines from which a signal is detected by the touch sensing circuit.

Alternatively, the n first touch electrode lines can be receiving electrode lines from which a signal is detected by a touch sensing circuit, and the m second touch electrode lines can be transmission electrode lines to which a driving signal is applied by the touch sensing circuit.

The common electrode can be disposed in the display area and can extend to a partial area of the non-display area, and the encapsulation layer can be disposed in the display area and can extend to a partial area of the non-display area further outward than the common electrode.

Advantageous Effects

According to the embodiments of the present disclosure, a bezel size can be reduced through the multilayer structure of touch routing lines connecting a touch sensor to a touch sensing circuit even when the touch routing lines are disposed in a non-display area.

According to the embodiments of the present disclosure, parasitic capacitance which can be caused by the touch routing lines can be prevented from being formed by changing the arrangement structure of touch routing lines connecting a touch sensor to a touch sensing circuit in consideration of the location of a common electrode, so that touch sensitivity can be improved.

According to the embodiments of the present disclosure, it is possible to provide a touch display device having an improved arrangement structure of touch routing lines suitable for a double routing structure.

According to the embodiments of the present disclosure, it is possible to provide a touch display device having an improved arrangement structure of touch routing lines suitable for a single routing structure.

According to the embodiments of the present disclosure, it is possible to provide a touch display device having an improved arrangement structure of touch routing lines suitable for a half-single routing structure.

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION OF THE PREFERRED EMBODIMENTS

Figure 1:
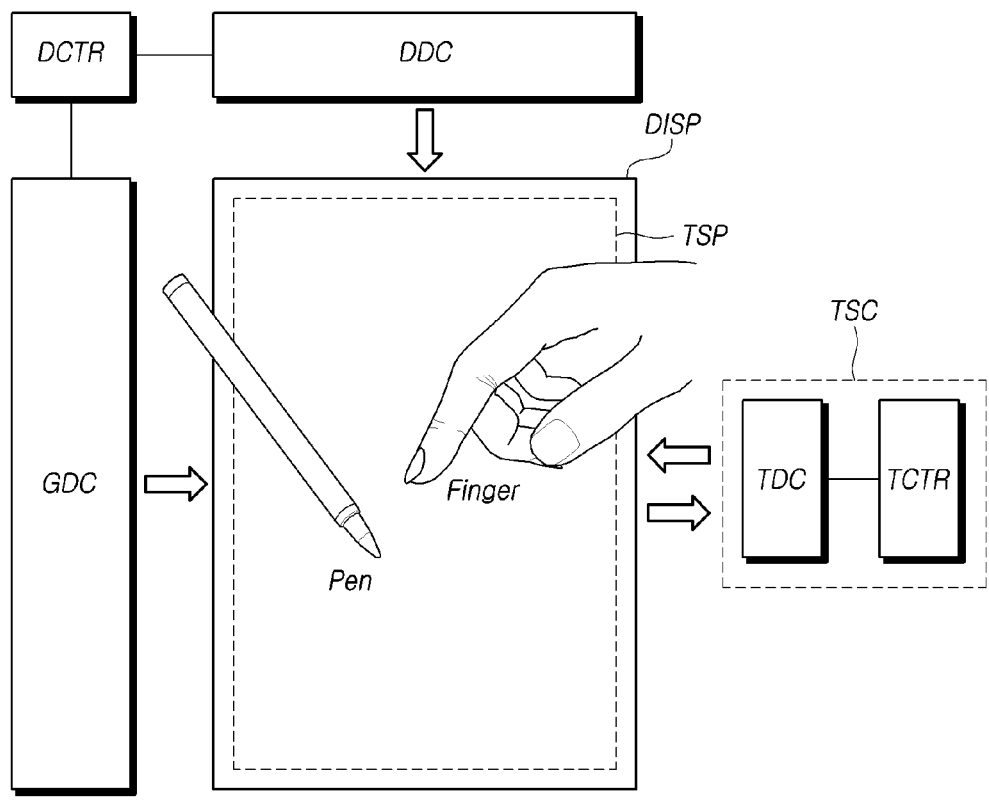
FIG. 1 is a diagram illustrating a system configuration of a touch display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and symbols can be used to designate the same or like components even when they are shown in different accompanying drawings from one another. Further, in the following description of examples or embodiments of the present disclosure, detailed descriptions of well-known functions and components incorporated herein will be omitted when it is determined that the description can make the subject matter in some embodiments of the present disclosure rather unclear. The terms such as "including", "having", "containing", "constituting" "made up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

FIG. 1 is a diagram illustrating a system configuration of a touch display device according to embodiments of the present disclosure. All the components of the touch display device according to all embodiments of the present disclosure are operatively couple and configured.

Referring to FIG. 1, the touch display device according to the embodiments of the present disclosure can provide both an image display function for displaying an image and a touch sensing function for sensing the presence or absence of a touch and/or touch coordinates with respect to a touch operation by a touch object such as a user's finger, a pen, or the like.

In order to provide the image display function, the touch display device according to the embodiments of the present disclosure can include a display panel DISP in which a plurality of data lines and a plurality of gate lines are disposed and a plurality of subpixels defined by the plurality of data lines and the plurality of gate lines are arranged, a data driving circuit DDC configured to drive the plurality of data lines, a gate driving circuit GDC configured to drive the plurality of gate lines, a display controller DCTR configured to control the operation of each of the data driving circuit DDC and the gate driving circuit GDC, and the like.

Each of the data driving circuit DDC, the gate driving circuit GDC, and the display controller DCTR can be implemented as one or more separate components. In some cases, two or more of the data driving circuit DDC, the gate driving circuit GDC, and the display controller DCTR can be implemented by being integrated into one component. For example, the data driving circuit DDC and the display controller DCTR can be implemented as one integrated circuit chip (IC chip).

In order to provide the touch sensing function, the touch display device according to the embodiments of the present disclosure can include a touch panel TSP including a touch sensor, and a touch sensing circuit TSC configured to supply a touch driving signal to the touch panel TSP, detect a touch-sensing signal from the touch panel TSP, and sense the presence or absence of a user's touch or touch positions (touch coordinates) on the touch panel TSP based on the detected touch-sensing signal.

As an example, the touch sensing circuit TSC can include a touch driving circuit TDC configured to supply the touch driving signal to the touch panel TSP and detect the touch-sensing signal from the touch panel TSP, a touch controller TCTR configured to sense the presence or absence of a user's touch and/or the touch positions on the touch panel TSP based on the touch-sensing signal detected by the touch driving circuit TDC, and the like.

The touch driving circuit TDC can include a first circuit part configured to supply the touch driving signal to the touch panel TSP and a second circuit part configured to detect the touch-sensing signal from the touch panel TSP.

The touch driving circuit TDC and the touch controller TCTR can be implemented as separate components, or in some cases, implemented by being integrated into one component.

Meanwhile, each of the data driving circuit DDC, the gate driving circuit GDC, and the touch driving circuit TDC can be implemented as one or more integrated circuits and can be implemented as a chip-on-glass (COG) type, a chip-on-film (COF) type, or a tape carrier package (TCP) type in view of the electrical connection with the display panel DISP. In addition, the gate driving circuit GDC can also be implemented as a gate-in-panel (GIP) type. However, hereinafter, the case in which the gate driving circuit GDC is implemented as a GIP type will be described as an example.

Meanwhile, each of the circuit configurations DDC, GDC, and DCTR for driving the display and the circuit configurations TDC and TCTR for touch sensing can be implemented as one or more separate components. In some cases, at least one of the circuit configurations DDC, GDC, and DCTR for driving the display and at least one of the circuit configurations TDC and TCTR for touch sensing can be implemented as one or more components by being functionally integrated.

For example, the data driving circuit DDC and the touch driving circuit TDC can be implemented by being integrated into one or two or more IC chips. When the data driving circuit DDC and the touch driving circuit TDC are implemented by being integrated into two or more IC chips, each of the two or more IC chips can have a data driving function and a touch driving function.

Meanwhile, the touch display device according to the embodiments of the present disclosure can be various types such as an organic light-emitting display device, a liquid crystal display device, and the like. Hereinafter, for convenience of description, the touch display device and the display panel DISP will be described as an organic light-emitting display device and an organic light-emitting display panel, respectively, as an example only and other variations are possible and encompassed by the present disclosure.

Meanwhile, as will be described below, the touch panel TSP can include a touch sensor to which the touch driving signal can be applied or by which the touch-sensing signal can be detected, and can further include touch routing lines for electrically connecting the touch sensor to the touch driving circuit TDC.

The touch sensor can include touch electrode lines. Each of the touch electrode lines can be one bar-shaped electrode or a type in which a plurality of touch electrodes are connected to each other. When each touch electrode line formed in the type in which a plurality of touch electrodes are connected to each other, each touch electrode line can include a bridge pattern(s) that connects the plurality of touch electrodes thereto. The touch sensor can include a touch sensor metal. Here, the touch sensor metal can include an electrode metal included in the touch electrode, a bridge metal included in the bridge pattern, and the like. The touch routing line can include at least one of the electrode metal and the bridge metal. In some cases, the touch sensor can further include the touch routing lines as well as the touch electrode lines.

The touch panel TSP can be present outside the display panel DISP. For example, the touch panel TSP and the display panel DISP can be separately manufactured and combined. The touch panel TSP is referred to herein as an external type or an add-on type.

Alternatively, the touch panel TSP can be embedded inside the display panel DISP. For example, when the display panel DISP is manufactured, the touch sensor constituting the touch panel TSP can be formed together with electrodes and signal lines for driving the display. The touch panel TSP is also referred to herein as a built-in type. Hereinafter, for convenience of description, the case in which the touch panel TSP is a built-in type will be described as an example only and other variations are possible.

Figure 2:
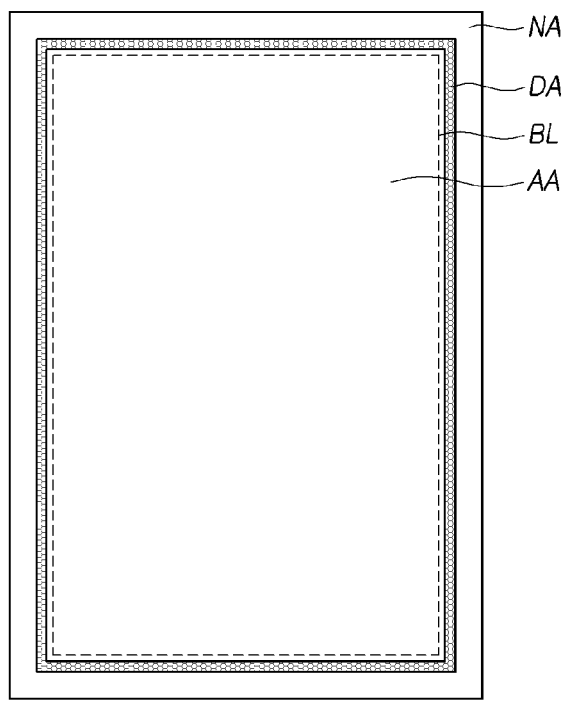
FIG. 2 is a diagram schematically illustrating a display panel of the touch display device according to embodiments of the present disclosure.

FIG. 2 is a diagram schematically illustrating the display panel DISP of the touch display device according to the embodiments of the present disclosure.

Referring to FIG. 2, the display panel DISP can include a display area AA in which an image is displayed, and a non-display area NA which is an outer area of an outer boundary line BL of the display area AA.

In the display area AA of the display panel DISP, the plurality of subpixels for displaying an image are arranged, and various electrodes and signal lines for driving the display are disposed.

In the display area AA of the display panel DISP, the touch sensor for touch sensing, the plurality of touch routing lines electrically connected to the touch sensor, and the like can be disposed. Accordingly, the display area AA can also be referred to herein as a touch sensing area capable of touch sensing.

In the non-display area NA of the display panel DISP, link lines extending from various signal lines disposed in the display area AA or link lines electrically connected to various signal lines disposed in the display area AA and display pads electrically connected to the link lines can be disposed. The display pads disposed in the non-display area NA can be bonded or electrically connected to the display driving circuit DDC, GDC, or the like. For example, the display pads disposed in the non-display area NA can include data pads connected to data link lines to which the data lines are extended or connected.

In the non-display area NA of the display panel DISP, the touch routing lines electrically connected to the touch sensor disposed in the display area AA and touch pads to which the touch routing lines are electrically connected can be disposed. The pads disposed in the non-display area NA can be bonded or electrically connected to the touch driving circuit TDC.

Some of the plurality of touch electrode lines disposed in the display area AA can be extended to the non-display area NA, and at least one electrode (touch electrode) of the same material as the plurality of touch electrode lines disposed in the display area AA can be further disposed in the non-display area NA. A portion of the outermost touch electrode among the plurality of touch electrodes included in each of the plurality of touch electrode lines disposed in the display area AA can be extended to the non-display area NA, and at least one electrode (touch electrode) of the same material as the plurality of touch electrodes included in each of the plurality of touch electrode lines disposed in the display area AA can be further disposed.

For example, the touch sensor can all be present in the display area AA, most of the touch sensor can be present in the display area AA and some thereof can be present in the non-display area NA, or the touch sensor can be present across the display area AA and the non-display area NA.

Meanwhile, referring to FIG. 2, the display panel DISP of the touch display device according to the embodiments of the present disclosure can include a dam area DA in which at least one dam for preventing any layer (for example, an encapsulation layer) in the display area AA from collapsing is disposed.

The dam area DA can be present at a boundary point between the display area AA and the non-display area NA or near the boundary point. For example, the dam area DA can be a peripheral area of a point that goes inward from the outer periphery then suddenly rises. Alternatively, the dam area DA can refer to a peripheral area of a point that is lowered along an inclined surface of the encapsulation layer and changed in a direction in which the slope of the encapsulation layer suddenly becomes gentle or increases again.

At least one dam disposed in the dam area DA can be disposed to surround all directions (e.g., four directions) of the display area AA, or can be disposed only in one to three directions (e.g., a direction in which there is a fragile layer) among all directions (e.g., four directions) of the display area AA.

At least one dam disposed in the dam area DA can be one pattern connected all together, or can be formed of two or more patterns that are disconnected.

When two or more dams are disposed in the dam area DA, the dams can be referred to herein as a first dam, a second dam, and the like from the dam closest to the display area AA. In the dam area DA, there can be only the first dam in any one direction and both the first dam and the second dam in any other direction.

Figure 3:
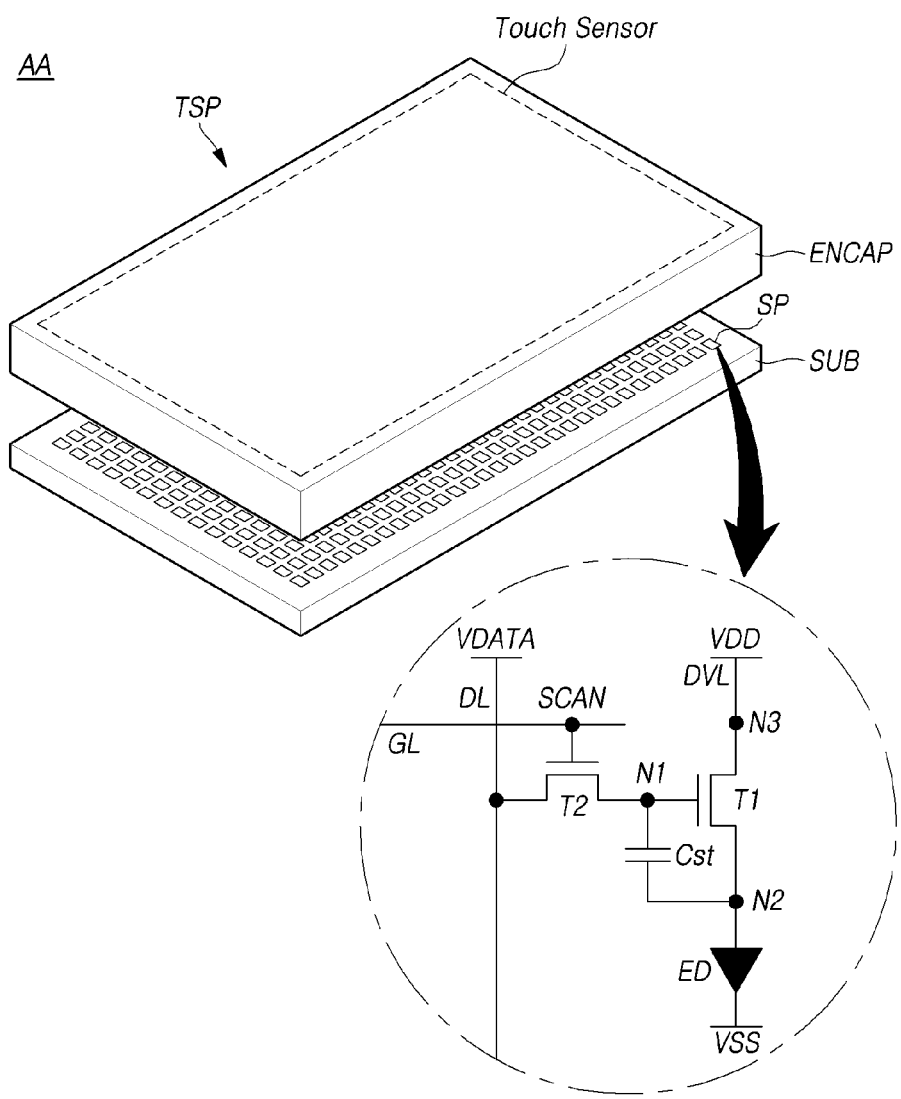
FIG. 3 is an exemplary diagram illustrating a structure in which a touch panel is embedded in the display panel according to embodiments of the present disclosure.

FIG. 3 an exemplary diagram illustrating a structure in which the touch panel is embedded in the display panel DISP according to the embodiments of the present disclosure.

Referring to FIG. 3, in the display area AA of the display panel DISP, a plurality of subpixels SP are arranged on a substrate SUB.

Each of the subpixels SP can include a light-emitting element ED, a first transistor T1 configured to drive the light-emitting element ED, a second transistor T2 configured to transfer a data voltage VDATA to a first node N1 of the first transistor T1, a storage capacitor Cst configured to maintain a constant voltage for one frame, and the like. In all the embodiments, each transistor can be a thin film transistor or any other suitable type.

The first transistor T1 can include the first node N1 to which the data voltage can be applied, a second node N2 electrically connected to the light-emitting element ED, and a third node N3 to which a driving voltage VDD from a driving voltage line DVL is applied. The first node N1 can be a gate node, the second node N2 can be a source node or a drain node, and the third node N3 can be a drain node or a source node. The first transistor T1 can also be referred to herein as a driving transistor for driving the light-emitting element ED.

The light-emitting element ED can include a pixel electrode (e.g., an anode), a light-emitting layer, and a common electrode (e.g., a cathode). The pixel electrode can have the data voltage VDATA corresponding to a different pixel voltage for each subpixel SP applied thereto and can be electrically connected to the second node N2 of the first transistor T1, and a base voltage VSS corresponding to a common voltage commonly applied to all subpixels SP can be applied to the common electrode.

The light-emitting element ED can be a light-emitting element ED using an organic material or a light-emitting element ED using an inorganic material. In the light-emitting element ED using an organic material, the light-emitting layer can include an organic light-emitting layer containing an organic material, and in this case, the light-emitting element ED is referred to herein as an organic light-emitting diode (OLED).

The second transistor T2 can be turned on and off in response to a scan signal SCAN applied through a gate line GL and can be electrically connected between the first node N1 of the first transistor T1 and a data line DL. The second transistor T2 is also referred to herein as a switching transistor.

The second transistor T2 is turned on in response to the scan signal SCAN and transfers the data voltage VDATA supplied from the data line DL to the first node N1 of the first transistor T1.

The storage capacitor Cst can be electrically connected between the first node N1 and the second node N2 of the first transistor T1.

Each subpixel SP can have a two transistor-one capacitor (2T1C) structure including two transistors T1 and T2 and one capacitor Cst as shown in FIG. 3, and in some cases, can further include one or more transistors or one or more capacitors.

The storage capacitor Cst may not be a parasitic capacitor (e.g., Cgs and Cgd) that is an internal capacitor, which can be present between the first node N1 and the second node N2 of the first transistor T1, but can be an external capacitor intentionally designed outside the first transistor T1.

Each of the first transistor T1 and the second transistor T2 can be an n-type transistor or a p-type transistor.

Meanwhile, as described above, the circuit elements such as the light-emitting element ED, two or more transistors T1 and T2 and one or more capacitors Cst, and the like can be disposed on the display panel DISP. Such circuit elements (in particular, the light-emitting element ED) can be vulnerable to external moisture or oxygen, and thus, an encapsulation layer ENCAP for preventing external moisture or oxygen from being introduced into the circuit element (in particular, the light-emitting element ED) can be disposed on the display panel DISP.

The encapsulation layer ENCAP can be formed of a single layer or a plurality of layers. For example, in the case that the encapsulation layer ENCAP is formed of a plurality of layers, the encapsulation layer ENCAP can include one or more inorganic encapsulation layers and one or more organic encapsulation layers. As a specific example, the encapsulation layer ENCAP can include a first inorganic encapsulation layer, an organic encapsulation layer, and a second inorganic encapsulation layer. Here, the organic encapsulation layer can be located between the first inorganic encapsulation layer and the second inorganic encapsulation layer.

The first inorganic encapsulation layer can be formed on the common electrode (e.g., the cathode) so as to be closest to the light-emitting element ED. The first inorganic encapsulation layer can be made of an inorganic insulating material capable of being deposited at a low-temperature such as silicon nitride ($SiN_x$), silicon oxide ($SiO_x$), silicon oxynitride (SiON), aluminum oxide ($Al_2O_3$), or the like. Accordingly, since the first inorganic encapsulation layer is deposited in a low-temperature atmosphere, damage to the light-emitting layer (organic light-emitting layer) vulnerable to a high-temperature atmosphere can be prevented during the process of depositing the first inorganic encapsulation layer.

The organic encapsulation layer can be formed to have an area smaller than that of the first inorganic encapsulation layer and can be formed to expose both ends of the first inorganic encapsulation layer. The organic encapsulation layer can act as a buffer to mitigate the stress between the respective layers due to the bending of the touch display device and can enhance planarization performance. The organic encapsulation layer can be formed of, for example, an organic insulating material such as an acrylic resin, an epoxy resin, polyimide, polyethylene, silicon oxycarbide (SiOC), or the like.

The second inorganic encapsulation layer can be formed on the organic encapsulation layer so as to cover an upper surface and side surfaces of each of the organic encapsulation layer and the first inorganic encapsulation layer. Accordingly, the second inorganic encapsulation layer can minimize or block external moisture or oxygen from penetrating into the first inorganic encapsulation layer and the organic encapsulation layer. The second inorganic encapsulation layer can be made of, for example, an inorganic insulating material such as silicon nitride ($SiN_x$), silicon oxide ($SiO_x$), silicon oxynitride (SiON), aluminum oxide ($Al_2O_3$), or the like.

Meanwhile, in the touch display device according to the embodiments of the present disclosure, the touch panel TSP can be formed on the encapsulation layer ENCAP.

For example, in the touch display device, the touch sensor included in the touch panel TSP can be disposed on the encapsulation layer ENCAP. This structure is referred to herein as a touch sensor-on-encapsulation layer (TOE) structure.

In the touch sensing, the touch signal (the touch driving signal or the touch-sensing signal) can be applied to the touch sensor. Accordingly, in the touch sensing, a potential difference caused by the touch signal and the common voltage VSS (or base voltage) can be formed between the touch sensor and the common electrode disposed with the encapsulation layer ENCAP therebetween, and thus unnecessary parasitic capacitance, from the point of view of touch sensing, can be formed. Such parasitic capacitance can lower touch sensitivity, and thus, in order to decrease the parasitic capacitance, the distance between the touch sensor and the common electrode can be designed to be greater than a predetermined value (for example, 5 μm) in consideration of a panel thickness, a panel manufacturing process, touch sensing performance, display performance, and the like. The distance between the touch sensor and the common electrode is proportional to the thickness of the encapsulation layer ENCAP. Thus, for example, in order to decrease and prevent the parasitic capacitance, the thickness of the encapsulation layer ENCAP can be designed to be greater than or equal to 5 μm.

The touch display device according to the embodiments of the present disclosure can obtain the presence or absence of a touch and/or touch coordinates based on a change in self-capacitance using the touch sensor, and can also obtain the presence or absence of a touch and/or touch coordinates based on a change in mutual capacitance in the touch sensor. Hereinafter, for convenience of description, the case in which the touch display device according to the embodiments of the present disclosure senses a touch based on mutual capacitance is illustrated as an example.

Figure 4:
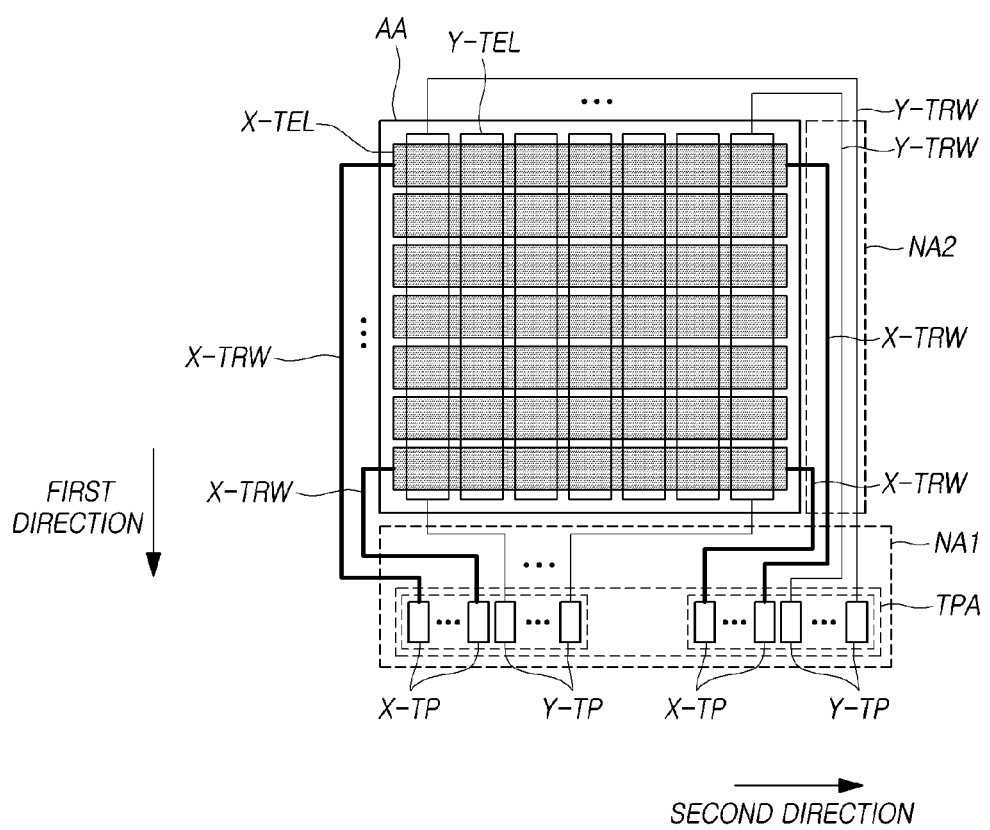
FIGS. 4 to 6 are views schematically illustrating a touch sensor structure on the display panel according to embodiments of the present disclosure.
Figure 5:
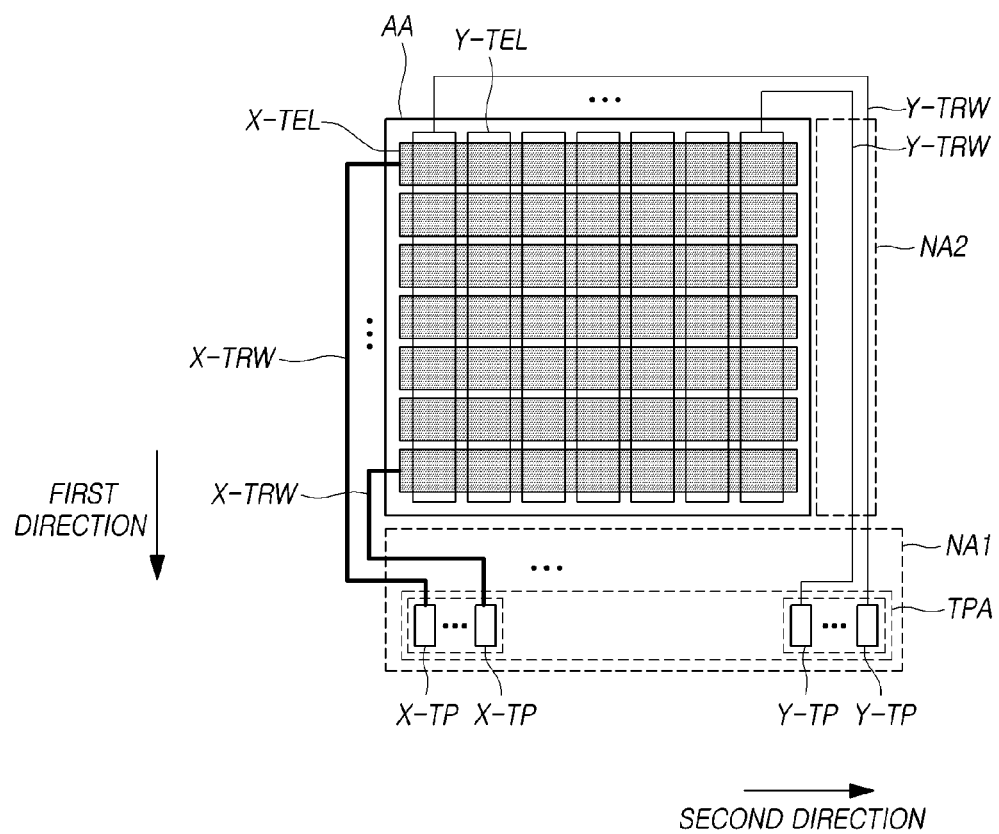
Figure 6:
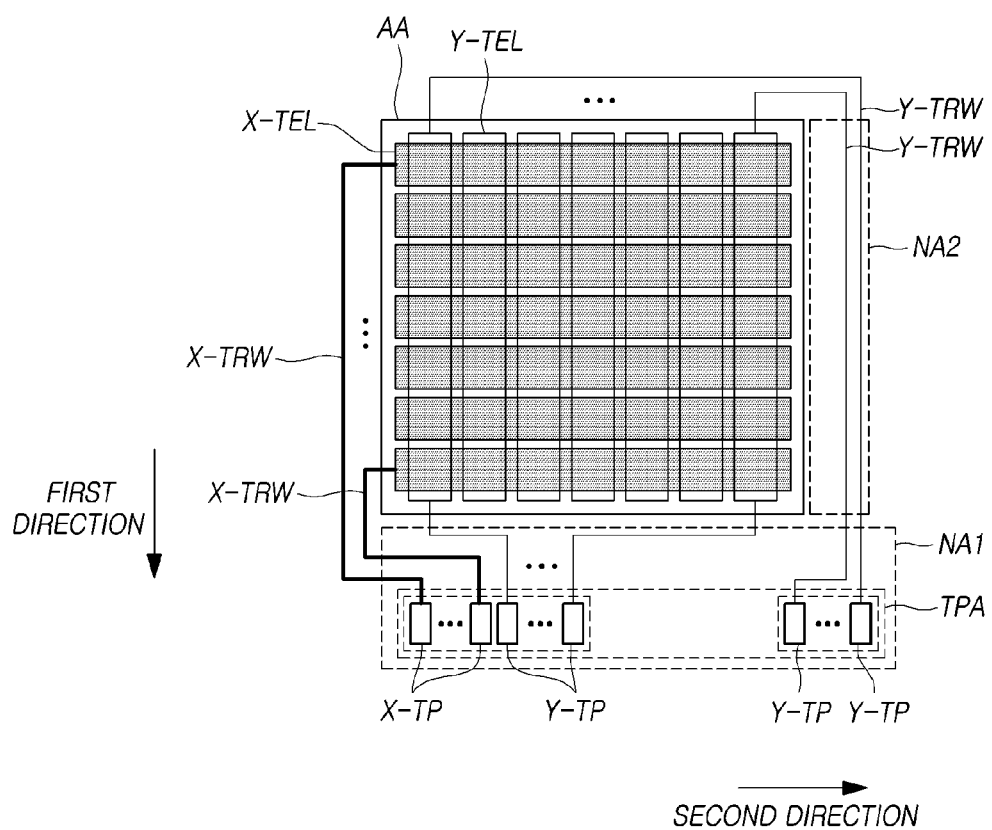
Figure 7:
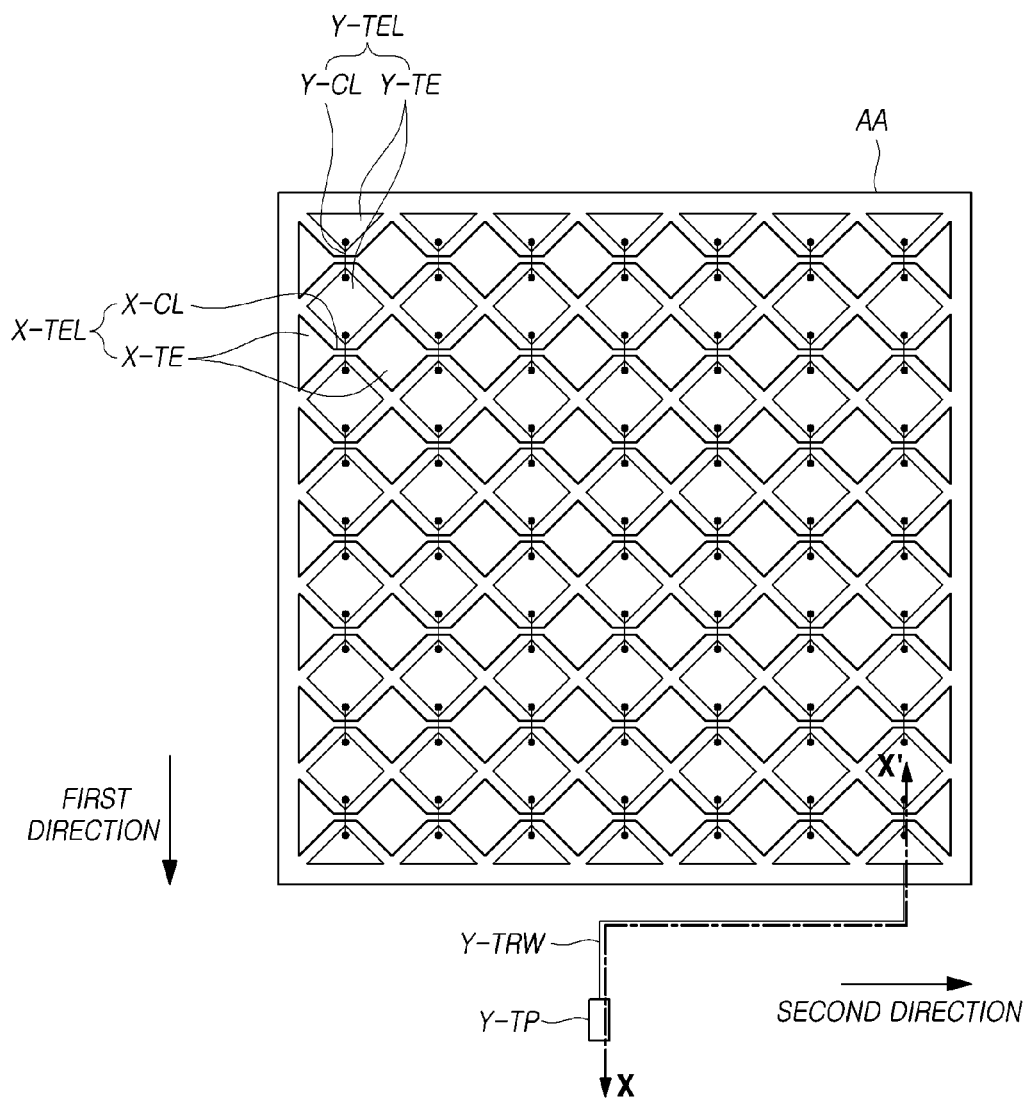
FIG. 7 is another exemplary diagram of a touch sensor structure on the display panel according to embodiments of the present disclosure.

FIGS. 4 to 6 are views schematically illustrating a touch sensor structure on the display panel DISP according to the embodiments of the present disclosure. FIG. 7 is another exemplary diagram of a touch sensor structure on the display panel according to the embodiments of the present disclosure.

Referring to FIGS. 4 to 6, the touch display device according to the embodiments of the present disclosure can include a touch sensor, a touch pad part TPA, touch routing lines X-TRW and Y-TRW, and the like.

The touch sensor can include a plurality of first touch electrode lines X-TEL and a plurality of second touch electrode lines Y-TEL, which are disposed on the encapsulation layer ENCAP in the display area AA. Each of the plurality of first touch electrode lines X-TEL and the plurality of second touch electrode lines Y-TEL can include one or more touch sensor metals.

The touch pad part TPA can be disposed in a first non-display area NA1 located at an outer periphery of the display area AA in a first direction. The touch pad part TPA can include a plurality of first touch pads X-TP and a plurality of second touch pads Y-TP.

The touch routing lines X-TRW and Y-TRW can include a plurality of first touch routing lines X-TRW and a plurality of second touch routing lines Y-TRW. The plurality of first touch routing lines X-TRW can come downward along the inclined surface of the encapsulation layer ENCAP and electrically connect the plurality of first touch electrode lines X-TEL to the plurality of first touch pads X-TP disposed in the first non-display area NA1. The plurality of second touch routing lines Y-TRW can come downward along the inclined surface of the encapsulation layer ENCAP and electrically connect the plurality of second touch electrode lines Y-TEL to the plurality of second touch pads Y-TP disposed in the first non-display area.

It can be interpreted that the touch sensor includes the plurality of first touch electrode lines X-TEL and the plurality of second touch electrode lines Y-TEL, as well as the touch routing lines X-TRW and Y-TRW.

The touch display device according to the embodiments of the present disclosure can detect a change in mutual capacitance between the first touch electrode line X-TEL and the second touch electrode line Y-TEL, and based on the change, a finger touch or a pen touch can be sensed.

Each of the plurality of first touch electrode lines X-TEL can be disposed in a second direction, and each of the plurality of second touch electrode lines Y-TEL can be disposed in a first direction different from the second direction.

In the present specification, the first direction and the second direction can be directions relatively different from each other, and as an example, the first direction can be a y-axis direction and the second direction can be an x-axis direction. In another example, the first direction can be an x-axis direction and the second direction can be a y-axis direction. In addition, the first direction and the second direction may or may not be orthogonal to each other. Also, in the present specification, the first direction and the second direction are relative to each other and can be changed according to a viewpoint of the viewer, and rows and columns are relative and can be changed according to a viewpoint of the viewer.

Referring to FIGS. 4 to 6, each of the plurality of first touch electrode lines X-TEL can be one bar-shaped electrode, and each of the plurality of second touch electrode lines Y-TEL can be one bar-shaped electrode.

In this case, the plurality of first touch electrode lines X-TEL and the plurality of second touch electrode lines Y-TEL can be disposed on the same layer or on different layers.

Referring to FIG. 7, each of the plurality of first touch electrode lines X-TEL can be configured as a plurality of first touch electrodes X-TE connected through first bridge patterns X-CL. For example, each of the first touch electrode lines X-TEL can include two or more first touch electrodes X-TE arranged in the same row (the same line in the second direction) and one or more first bridge patterns X-CL for electrically connecting the adjacent first touch electrodes X-TE to each other. The one or more first bridge patterns X-CL can be a pattern located on the same layer as the two or more first touch electrodes X-TE and integrated with the two or more first touch electrodes X-TE. Alternatively, the one or more first bridge patterns X-CL can also be a pattern located on a different layer from the two or more first touch electrodes X-TE and formed differently from the two or more first touch electrodes X-TE to be connected to the two or more first touch electrodes X-TE.

Referring to FIG. 7, each of the plurality of second touch electrode lines Y-TEL can be configured as a plurality of second touch electrodes Y-TE connected through second bridge patterns Y-CL. For example, each of the second touch electrode lines Y-TEL can include two or more second touch electrodes Y-TE arranged in the same row (the same line in the first direction) and one or more second bridge patterns Y-CL for electrically connecting the adjacent second touch electrodes Y-TE to each other. The one or more second bridge patterns Y-CL can be a pattern located on the same layer as the two or more second touch electrodes Y-TE and integrated with the two or more second touch electrodes Y-TE. Alternatively, the one or more second bridge patterns Y-CL can also be a pattern located on a different layer from the two or more second touch electrodes Y-TE and formed differently from the two or more second touch electrodes Y-TE to be connected to the two or more second touch electrodes Y-TE.

In an area (a touch electrode line intersection area) in which the first touch electrode line X-TEL and the second touch electrode line Y-TEL intersect, the first bridge pattern X-CL and the second bridge pattern Y-CL can intersect with each other. For example, in the area (the touch electrode line intersection area) in which the first touch electrode line X-TEL and the second touch electrode line Y-TEL intersect, the first bridge pattern X-CL and the second bridge pattern Y-CL can intersect with each other.

As described above, in the case that the first bridge pattern X-CL and the second bridge pattern Y-CL intersect with each other in the touch electrode line intersection area, the first bridge pattern X-CL and the second bridge pattern Y-CL should be located on different layers.

In order to dispose the plurality of first touch electrode lines X-TEL and the plurality of second touch electrode lines Y-TEL so as to intersect with each other, the plurality of first touch electrodes X-TE, the plurality of first bridge patterns X-CL, the plurality of second touch electrodes Y-TE, and the plurality of second bridge patterns Y-CL can be located in two or more layers.

The touch sensor metal constituting the touch sensor can include two different kinds of metals. For example, the touch sensor metal can include an electrode metal included in the plurality of first touch electrodes X-TE and the plurality of second touch electrodes Y-TE, a bridge metal included in the plurality of first bridge patterns X-CL and the plurality of second bridge patterns Y-CL, and the like.

The plurality of first touch routing lines X-TRW and the plurality of second touch routing lines Y-TRW can be formed of the electrode metal, or the plurality of first touch routing lines X-TRW and the plurality of second touch routing lines Y-TRW can be formed of the bridge metal. Alternatively, each of the plurality of first touch routing lines X-TRW and the plurality of second touch routing lines Y-TRW can be formed of the electrode metal or the bridge metal according to a layer at which the first touch routing line X-TRW and the second touch routing line Y-TRW are located.

Referring to FIGS. 4 to 6, each of the plurality of first touch electrode lines X-TEL is electrically connected to one or more first touch pads X-TP through one or more first touch routing lines X-TRW. Each of the plurality of second touch electrode lines Y-TEL is electrically connected to one or more second touch pads Y-TP through one or more second touch routing lines Y-TRW.

Referring to FIG. 4, the touch sensor components (the touch electrode lines X-TEL and Y-TEL, the touch routing lines X-TRW and Y-TRW, and the touch pads X-TP and Y-TP) included in the display panel DISP according to the embodiments of the present disclosure can be designed in a double routing structure.

The double routing structure refers to a structure capable of supplying a signal to one place (the touch electrode line) through two routes (the touch routing lines) or detecting a signal from one place (the touch electrode line) through two routes (the touch routing lines).

In the case of the double routing structure, each of the plurality of first touch electrode lines X-TEL can be supplied with a signal (or can detect a signal) through two first touch routing lines X-TRW. Each of the plurality of second touch electrode lines Y-TEL can detect a signal (or can be supplied with a signal) through two second touch routing lines Y-TRW.

When designed with the double routing structure and each of the plurality of first and second touch electrode lines X-TEL and Y-TEL has a bar shape, both ends of one first touch electrode line X-TEL can be electrically connected to two first touch pads X-TP through two first touch routing lines X-TRW. Both ends of one second touch electrode line Y-TEL can be electrically connected to two second touch pads Y-TP through two second touch routing lines Y-TRW.

When designed with the double routing structure and each of the plurality of first and second touch electrode lines X-TEL and Y-TEL has a structure as shown in FIG. 7, two first touch electrodes X-TE disposed at the outermost portion among the plurality of first touch electrodes X-TE included in one first touch electrode line X-TEL can be electrically connected to two first touch pads X-TP through two first touch routing lines X-TRW. Two second touch electrodes Y-TE disposed at the outermost portion of the plurality of second touch electrodes Y-TE included in one second touch electrode line Y-TEL can be electrically connected to two second touch pads Y-TP through two second touch routing lines Y-TRW.

When designed with the double routing structure and the touch sensor includes n (here n is a natural number greater than or equal to two) first touch electrode lines X-TEL and m (here m is a natural number greater than or equal to two) second touch electrode lines Y-TEL, the touch pad part TPA can include 2n first touch pads X-TP and 2m second touch pads Y-TP, and a touch routing line structure can include 2n first touch routing lines X-TRW and 2m second touch routing lines Y-TRW.

Referring to FIG. 5, the touch sensor components (the touch electrode lines X-TEL and Y-TEL, the touch routing lines X-TRW and Y-TRW, and the touch pads X-TP and Y-TP) included in the display panel DISP according to the embodiments of the present disclosure can be designed in a single routing structure.

The single routing structure refers to a structure capable of supplying a signal to one place (the touch electrode line) through one route (the touch routing line) or detecting a signal from one place (the touch electrode line) through one route (the touch routing line).

In the case of the single routing structure, each of the plurality of first touch electrode lines X-TEL can detect a signal (or can be supplied with a signal) through one first touch routing line X-TRW. Each of the plurality of second touch electrode lines Y-TEL can be supplied with a signal (or can detect a signal) through one second touch routing line Y-TRW.

When designed with the single routing structure and each of the plurality of first and second touch electrode lines X-TEL and Y-TEL has a bar shape, only one of both ends of one first touch electrode line X-TEL can be electrically connected to one first touch pad X-TP through one first touch routing line X-TRW. Only one of both ends of one second touch electrode line Y-TEL can be electrically connected to one second touch pad Y-TP through one second touch routing line Y-TRW.

When designed with the single routing structure and each of the plurality of first and second touch electrode lines X-TEL and Y-TEL has a structure as shown in FIG. 7, only one of two first touch electrodes X-TE disposed at the outermost portion among the plurality of first touch electrodes X-TE included in one first touch electrode line X-TEL can be electrically connected to the first touch pad X-TP through the first touch routing line X-TRW. Only one of two second touch electrodes Y-TE disposed at the outermost portion of the plurality of second touch electrodes Y-TE included in one second touch electrode line Y-TEL can be electrically connected to the second touch pad Y-TP through the second touch routing line Y-TRW.

When designed with the single routing structure and the touch sensor includes n (here n is a natural number greater than or equal to two) first touch electrode lines X-TEL and m (here m is a natural number greater than or equal to two) second touch electrode lines Y-TEL, the touch pad part TPA can include n first touch pads X-TP and m second touch pads Y-TP, and the touch routing line structure can include n first touch routing lines X-TRW and m second touch routing lines Y-TRW.

Referring to FIG. 6, the touch sensor components (the touch electrode lines X-TEL and Y-TEL, the touch routing lines X-TRW and Y-TRW, and the touch pads X-TP and Y-TP) included in the display panel DISP according to the embodiments of the present disclosure can be designed in a half-single routing structure (or a half-double routing structure) in which some thereof have a single routing structure and the others thereof have a double routing structure.

As an example of the half-single routing structure shown in FIG. 6, each of the plurality of first touch electrode lines X-TEL can detect a signal (or can be supplied with a signal) through one first touch routing line X-TRW, and each of the plurality of second touch electrode lines Y-TEL can be supplied with a signal (or can detect a signal) through two second touch routing lines Y-TRW. For example the plurality of first touch electrode lines X-TEL, the plurality of first touch routing lines X-TRW, and the plurality of first touch pads X-TP can have a single routing structure, and the plurality of second touch electrode lines Y-TEL, the plurality of second touch routing lines Y-TRW, and the plurality of second touch pads Y-TP can have a double routing structure.

As another example of the half-single routing structure, each of the plurality of second touch electrode lines Y-TEL can detect a signal (or can be supplied with a signal) through one second touch routing line Y-TRW, and each of the plurality of first touch electrode lines X-TEL can be supplied with a signal (or can detect a signal) through two first touch routing lines X-TRW. For example the plurality of second touch electrode lines Y-TEL, the plurality of second touch routing lines Y-TRW, and the plurality of second touch pads Y-TP can have a single routing structure, and the plurality of first touch electrode lines X-TEL, the plurality of first touch routing lines X-TRW, and the plurality of first touch pads X-TP can have a double routing structure.

When designed with the half-single routing structure shown in FIG. 6 and the touch sensor includes n (here n is a natural number greater than or equal to two) first touch electrode lines X-TEL and m (here m is a natural number greater than or equal to two) second touch electrode lines Y-TEL, the touch pad part TPA can include n first touch pads X-TP and 2m second touch pads Y-TP, and the touch routing line structure can include n first touch routing lines X-TRW and 2m second touch routing lines Y-TRW.

The plurality of first touch electrode lines X-TEL and the plurality of second touch electrode lines Y-TEL can be touch sensor components having a distinguished role (function).

The plurality of first touch electrode lines X-TEL can be transmission electrode lines (also referred to herein as driving electrode lines) to which a driving signal is applied by the touch sensing circuit TSC, and the plurality of second touch electrode lines Y-TEL can be receiving electrode lines (also referred to herein as sensing electrode lines) from which a signal is detected by the touch sensing circuit TSC.

In contrast, the plurality of first touch electrode lines X-TEL can be receiving electrode lines (also referred to herein as sensing electrode lines) from which a signal is detected by the touch sensing circuit TSC, and the plurality of second touch electrode lines Y-TEL can transmission electrode lines (also referred to herein as driving electrode lines) to which driving a signal is applied by the touch sensing circuit TSC.

Hereinafter, for convenience of description, in the case of the double routing structure of FIG. 4, it is assumed that the plurality of second touch electrode lines Y-TEL are receiving electrode lines (sensing electrode lines), and the plurality of first touch electrode lines X-TEL are transmission electrode lines (driving electrode lines).

However, under the double routing structure of FIG. 4, the plurality of second touch electrode lines Y-TEL can be transmission electrode lines (driving electrode lines), and the plurality of first touch electrode lines X-TEL can be transmission electrode lines (driving electrode lines).

Hereinafter, for convenience of description, in the case of the single routing structure of FIG. 5 and the half-single routing structure of FIG. 6, it is assumed that the plurality of second touch electrode lines Y-TEL are transmission electrode lines (driving electrode lines) and the plurality of first touch electrode lines X-TEL are receiving electrode lines (sensing electrode lines).

However, under the single-routing structure of FIG. 5 and the half-single routing structure of FIG. 6, the plurality of second touch electrode lines Y-TEL can be receiving electrode lines (sensing electrode lines), and the plurality of first touch electrode lines X-TEL can be transmission electrode lines (driving electrode lines).

Figure 8:
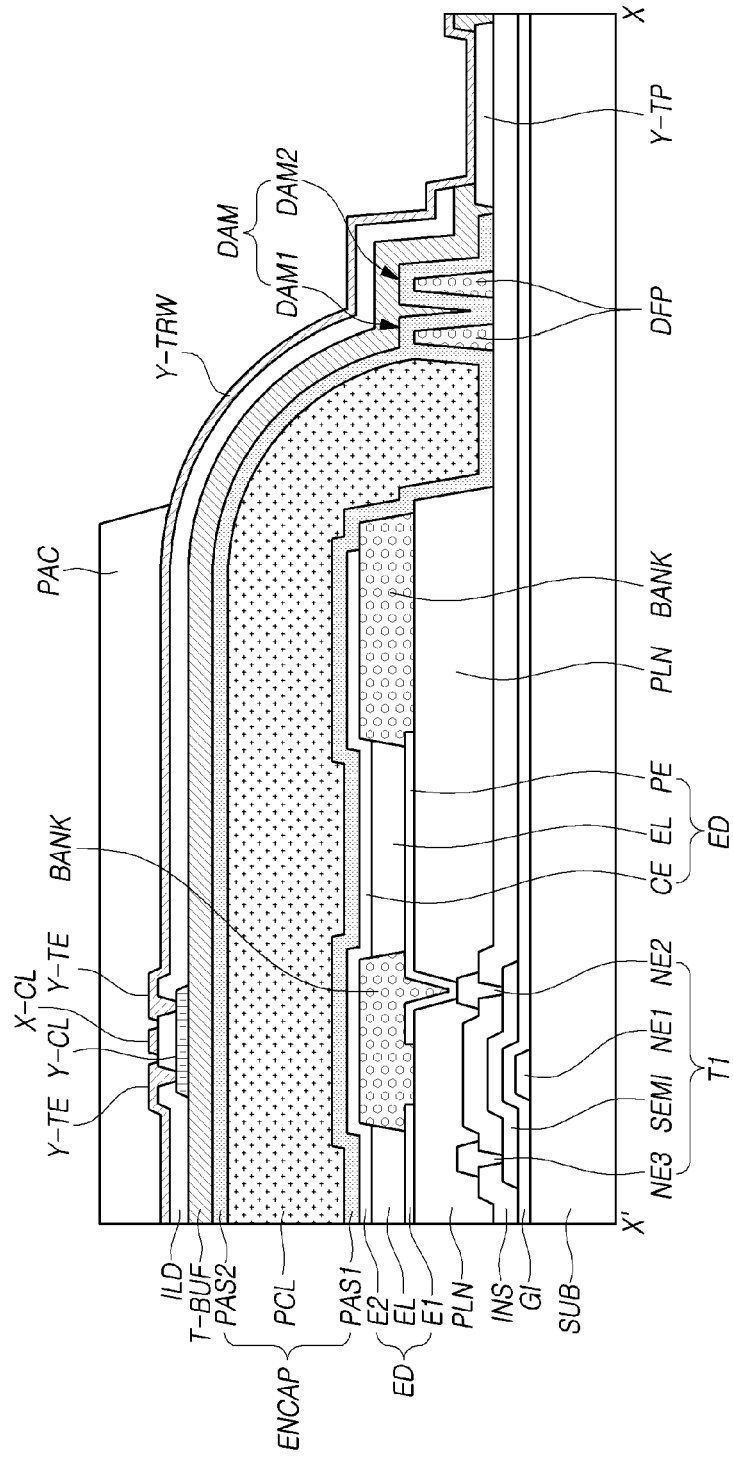
FIG. 8 is a partial cross-sectional view of the display panel according to embodiments of the present disclosure.

Meanwhile, as shown in FIG. 8, each of the plurality of first touch routing lines X-TRW can be disposed on the encapsulation layer ENCAP and connected to the plurality of first touch electrode lines X-TEL, and can come downward along the inclined surface of the encapsulation layer ENCAP and extend to the place without the encapsulation layer ENCAP to be connected to the plurality of first touch pads X-TP. Each of the plurality of second touch routing lines Y-TRW can be disposed on the encapsulation layer ENCAP and connected to the plurality of second touch electrode lines Y-TEL, and can come downward along the inclined surface of the encapsulation layer ENCAP and extend to the place without the encapsulation layer ENCAP to be connected to the plurality of second touch pads Y-TP. Here, the encapsulation layer ENCAP can be located in the display area AA, and in some cases, can be extended to the non-display area NA. The place without the encapsulation layer ENCAP is the non-display area NA, and the touch pad part TPA is present in the non-display area NA.

Referring to FIGS. 4 to 6, the display panel DISP can include a second non-display area NA2 located at an outer periphery of the display area AA in the second direction (in a right direction when viewed in the drawing).

The touch routing lines (one or more among X-TRW and Y-TRW) connected to one or more of the plurality of first touch electrode lines X-TEL and the plurality of second touch electrode lines Y-TEL, which are disposed in the display area AA, pass through the second non-display area NA2 in order to be connected to the touch pad part TPA in the first non-display area NA1.

Further, the touch routing lines (one or more among X-TRW and Y-TRW) connected to one or more of the plurality of first touch electrode lines X-TEL and the plurality of second touch electrode lines Y-TEL, which are disposed in the display area AA, can pass through a third non-display area NA3 (in FIG. 14, in a left direction when viewed in the drawing), which is present in the opposite direction of the second direction with respect to the display area AA, in order to be connected to the touch pad part TPA in the first non-display area NA1. However, hereinafter, for convenience of description, only the second non-display area NA2 of the second non-display area NA2 and the third non-display area NA3 (in FIG. 14) will be described as an example.

In the case of the double routing structure of FIG. 4, the plurality of first touch routing lines X-TRW and the plurality of second touch routing lines Y-TRW connected to the plurality of first touch electrode lines X-TEL and the plurality of second touch electrode lines Y-TEL, which are disposed in the display area AA, respectively, pass through the second non-display area NA2 to be connected to the touch pad part TPA in the first non-display area NA1.

In the single routing structure of FIG. 5 and the half-single routing structure of FIG. 6, the plurality of second touch routing lines Y-TRW connected to the plurality of second touch electrode lines Y-TEL disposed in the display area AA pass through the second non-display area NA2 to be connected to the touch pad part TPA in the first non-display area NA1.

As will be described below, referring to FIGS. 4 to 6, regardless of the routing structure, many touch routing lines have to be disposed in the second non-display area NA2, which becomes a critical factor making it difficult to implement a narrow bezel.

FIG. 8 is a partial cross-sectional view of the display panel DISP according to the embodiments of the present disclosure. However, FIG. 8 illustrates the case having the touch sensor structure as shown in FIG. 7 as an example.

The first transistor T1 that is a driving transistor in each subpixel SP in the display area AA can be disposed on the substrate SUB.

The first transistor T1 can include a first node electrode NE1 corresponding to a gate electrode, a second node electrode NE2 corresponding to a source electrode or a drain electrode, a third node electrode NE3 corresponding to the drain electrode or the source electrode, a semiconductor layer SEMI, and the like.

The first node electrode NE1 and the semiconductor layer SEMI can overlap each other with a gate insulating film GI interposed therebetween. The second node electrode NE2 can be formed on an insulating layer INS and can be in contact with one side of the semiconductor layer SEMI, and the third node electrode NE3 can be formed on the insulating layer INS and can be in contact with the other side of the semiconductor layer SEMI.

The light-emitting element ED can include a pixel electrode PE corresponding to an anode (or a cathode), a light-emitting layer EL formed on the pixel electrode PE, a common electrode CE corresponding to the cathode (or the anode) formed on the light-emitting layer EL, and the like.

The pixel electrode PE is electrically connected to the second node electrode NE2 of the first transistor T1 exposed through a pixel contact hole passing through a planarization film PLN.

The light-emitting layer EL can be formed on the pixel electrode PE of a light-emitting area provided by a bank BANK. The light-emitting layer EL can be formed by laminating a hole-related layer, a light-emitting layer, and an electron-related layer on the pixel electrode PE in this order or in reverse order. The common electrode CE can be formed to face the pixel electrode PE with the light-emitting layer EL therebetween.

The encapsulation layer ENCAP can block external moisture or oxygen from penetrating into the light-emitting element ED that is vulnerable to the external moisture or oxygen. The encapsulation layer ENCAP can be formed of a single layer, but the encapsulation layer ENCAP can also be formed of a plurality of layers (PAS1, PCL, and PAS2) as shown in FIG. 8.

For example, in the case that the encapsulation layer ENCAP is formed of the plurality of layers (PAS1, PCL, and PAS2), the encapsulation layer ENCAP can include one or more inorganic encapsulation layers (PAS1 and PAS2) and one or more organic encapsulation layers (PCL). As a specific example, the encapsulation layer ENCAP can have a structure in which a first inorganic encapsulation layer PAS1, an organic encapsulation layer PCL, and a second inorganic encapsulation layer PAS2 are sequentially laminated.

Here, the organic encapsulation layer PCL can further include at least one organic encapsulation layer or at least one inorganic encapsulation layer.

The first inorganic encapsulation layer PAS1 can be formed on the substrate SUB on which the common electrode CE corresponding to the cathode is formed so as to be closest to the light-emitting element ED. The first inorganic encapsulation layer PAS1 can be made of an inorganic insulating material capable of being deposited at a low-temperature such as silicon nitride ($SiN_x$), silicon oxide ($SiO_x$), silicon oxynitride (SiON), aluminum oxide ($Al_2O_3$), or the like. Since the first inorganic encapsulation layer PAS1 is deposited in a low-temperature atmosphere, the first inorganic encapsulation layer PAS1 can prevent the light-emitting layer EL containing an organic material vulnerable to a high-temperature atmosphere from being damaged during the deposition process.

The organic encapsulation layer PCL can be formed to have an area smaller than that of the first inorganic encapsulation layer PAS1, and in this case, the organic encapsulation layer PCL can be formed to expose both ends of the first inorganic encapsulation layer PAS1. The organic encapsulation layer PCL can serve as a buffer to mitigate the stress between the respective layers due to bending of the touch display device that is an organic light-emitting display device, and thus can serve to enhance planarization performance. The organic encapsulation layer PCL can be, for example, made of an organic insulating material such as an acrylic resin, an epoxy resin, polyimide, polyethylene, or silicon oxycarbon (SiOC). As an example, the organic encapsulation layer PCL can be formed through an inkjet method.

As described above, the display panel DISP can include the dam area DA.

The dam area DA can be located at the boundary point between the display area AA and the non-display area NA or near the boundary point. For example, the dam area DA can be a peripheral area of a point that goes inward from the outer periphery and then suddenly rises. Alternatively, the dam area DA can refer to a peripheral area of a point that is lowered along the inclined surface of the encapsulation layer and changed in a direction in which the slope of the encapsulation layer suddenly becomes gentle or increases again.

As shown in FIG. 8, one or more dams DAM located in the dam area DA can be disposed between the touch pad part TPA and the display area AA. The one or more dams DAM can be formed of a dam forming pattern DFP including the same material as the bank BANK, or the like.

Although the dam area DA can be located only in the non-display area NA or can be present mostly in the non-display area NA, some of the dam area DA can be present across the display area AA.

One or two or more dams can be formed in the dam area DA. For example, as shown in FIG. 8, two dams DAM1 and DAM2 can be present in the dam area DA. The dam (DM1) closer to the display area AA among the two dams DAM1 and DAM2 is referred to herein as a first dam DAM1, and the dam (DAM2) located closer to the touch pad part TPA is referred to herein as a second dam DAM2.

One or more dams DAM disposed in the dam area DA can prevent the organic encapsulation layer PCL in a liquid state from collapsing in a direction of the non-display area NA to invade the touch pad part TPA or the like when the organic encapsulation layer PCL in a liquid state is loaded into the display area AA.

Such an effect can be greater when two or more dams DAM1 and DAM2 are formed, as shown in FIG. 8.

The first dam DAM1 and/or the second dam DAM2 can have a single-layer structure or a multi-layer structure.

The first dam DAM1 and/or the second dam DAM2 can be basically made of the dam forming pattern DFP. The dam forming pattern DFP can have a height greater than that of the touch pads X-TP and Y-TP disposed in the touch pad part TPA.

The dam forming pattern DFP can be made of the same material as the bank BANK configured to separate the subpixels SP in the display area AA. In some cases, the dam forming pattern DFP can be made of the same material as a spacer or the like configured to maintain interlayer spacing. In this case, the dam forming pattern DFP can be formed at the same time as the bank BANK or the spacer, and accordingly, the dam structure can be formed without an additional masking process and increasing costs.

Referring to FIG. 8, the first dam DAM1 and/or the second dam DAM2 can be formed in a structure in which the first inorganic encapsulation layer PAS1 and/or the second inorganic encapsulation layer PAS2 are laminated on the dam forming pattern DFP.

The organic encapsulation layer PCL containing an organic material can be located only on an inner surface of the first dam DAM1 at an innermost side. Alternatively, the organic encapsulation layer PCL containing an organic material can be located at an upper portion of at least the first dam DAM1 of the first dam DAM1 and the second dam DAM2.

The second inorganic encapsulation layer PAS2 can be formed on the substrate SUB on which the organic encapsulation layer PCL is formed so as to cover an upper surface and side surfaces of each of the organic encapsulation layer PCL and the first inorganic encapsulation layer PAS1. The second inorganic encapsulation layer PAS2 can minimize or block external moisture or oxygen from penetrating into the first inorganic encapsulation layer PAS1 and the organic encapsulation layer PCL. The second inorganic encapsulation layer PAS2 can be made of an inorganic insulating material such as silicon nitride ($SiN_x$), silicon oxide ($SiO_x$), silicon oxynitride (SiON), aluminum oxide ($Al_2O_3$), or the like.

A touch buffer film T-BUF can be disposed on the encapsulation layer ENCAP.

The first and second touch electrodes X-TE and Y-TE, and the first and second bridge patterns X-CL and Y-CL can be located on the touch buffer film T-BUF.

All or some of each of the first and second touch routing lines X-TRW and Y-TRW can also be located on the touch buffer film T-BUF.

The touch buffer film T-BUF is located between the touch sensor and the common electrode CE and can be designed such that the distance between the touch sensor and the common electrode CE of the light-emitting element ED maintains a predetermined minimum separation distance (for example, 5 µm). Accordingly, it is possible to reduce or prevent parasitic capacitance formed between the touch sensor and the common electrode CE, thereby preventing a decrease in touch sensitivity caused by the parasitic capacitance.

The first and second touch electrodes X-TE and Y-TE, and the first and second bridge patterns X-CL and Y-CL can be disposed directly on the encapsulation layer ENCAP without the touch buffer film T-BUF.

The touch buffer film T-BUF can prevent a chemical solution (developer, etchant, or the like) used in the manufacturing process of a touch sensor metal disposed on the touch buffer film T-BUF or external moisture or the like from penetrating into the light-emitting layer EL containing an organic material. Accordingly, the touch buffer film T-BUF can prevent the light-emitting layer EL vulnerable to the chemical solution or moisture from being damaged.

The touch buffer film T-BUF can be formed at a low temperature below a predetermined temperature (for example, 100° C.) to prevent the light-emitting layer EL containing an organic material vulnerable to high temperature from being damaged, and can be made of an organic insulating material having a low dielectric constant of 1 to 3. For example, the touch buffer film T-BUF can be made of an acrylic-based material, an epoxy-based material, or a siloxane-based material. The touch buffer film T-BUF having planarization performance as an organic insulating material can prevent each encapsulation layer PAS1, PCL, or PAS2 from being damaged and the touch sensor metal formed on the touch buffer film T-BUF in the encapsulation layer ENCAP from being broken due to bending of the organic light-emitting display device.

According to a mutual capacitance-based touch sensor structure, the first touch electrode line X-TEL and the second touch electrode line Y-TEL are disposed on the touch buffer film T-BUF, and the first touch electrode line X-TEL and the second touch electrode line Y-TEL can be disposed so as to intersect with each other.

The second touch electrode line Y-TEL can include the plurality of second touch electrodes Y-TE and the plurality of second bridge patterns Y-CL electrically connecting the plurality of second touch electrodes Y-TE. As shown in FIG. 8, the plurality of second touch electrodes Y-TE and the plurality of second bridge patterns Y-CL can be located on different layers with a touch insulating film ILD interposed therebetween.

Referring to FIGS. 7 and 8 together, the plurality of second touch electrodes Y-TE can be spaced apart from each other at regular intervals along a y-axis direction (the first direction in FIG. 7). Each of the plurality of second touch electrodes Y-TE can be electrically connected to another second touch electrode Y-TE adjacent in the y-axis direction through the second bridge pattern Y-CL.

The second bridge pattern Y-CL can be formed on the touch buffer film T-BUF and can be exposed through a touch contact hole passing through the touch insulating film ILD to be electrically connected to two second touch electrodes Y-TE adjacent in the y-axis direction.

The second bridge pattern Y-CL can be disposed so as to overlap the bank BANK. Accordingly, it is possible to prevent an aperture ratio from being lowered by the second bridge pattern Y-CL.

Referring to FIGS. 7 and 8 together, the first touch electrode line X-TEL can include the plurality of first touch electrodes X-TE and the plurality of first bridge patterns X-CL electrically connecting the plurality of first touch electrodes X-TE. The plurality of first touch electrodes X-TE and the plurality of first bridge patterns X-CL can be located on different layers with the touch insulating film ILD therebetween, but the plurality of first bridge patterns X-CL and the plurality of first touch electrodes X-TE can be integrally formed and located on the same layer.

Referring to FIGS. 7 and 8 together, the plurality of first touch electrodes X-TE can be spaced apart from each other at regular intervals along the x-axis direction on the touch insulating film ILD. Each of the plurality of first touch electrodes X-TE can be electrically connected to another first touch electrode X-TE adjacent in the x-axis direction through the first bridge pattern X-CL.

The first bridge pattern X-CL can be disposed on the same plane as the first touch electrode X-TE. Thus, the first bridge pattern X-CL can be electrically connected to two first touch electrodes X-TE adjacent to each other in the x-axis direction without an additional contact hole or can be integrated with two first touch electrodes X-TE adjacent to each other in the x-axis direction.

The first bridge pattern X-CL can be disposed so as to overlap the bank BANK. Accordingly, it is possible to prevent the aperture ratio from being lowered by the first bridge pattern X-CL.

Referring to FIG. 8, the second touch electrode line Y-TEL can be electrically connected to the second touch pad Y-TP, which is present in the touch pad part TPA in the first non-display area NA1, through the second touch routing line Y-TRW. The second touch pad Y-TP can be electrically connected to the touch driving circuit TDC.

Like this structure, the first touch electrode line X-TEL can be electrically connected to the first touch pad X-TP, which is present in the touch pad part TPA in the first non-display area NA1, through the first touch routing line X-TRW. The first touch pad X-TP can be electrically connected to the touch driving circuit TDC.

A pad cover electrode covering the first touch pad X-TP and the second touch pad Y-TP can be further disposed.

The first touch pad X-TP can be formed separately from the first touch routing line X-TRW or can be formed by extending the first touch routing line X-TRW. The second touch pad Y-TP can be formed separately from the second touch routing line Y-TRW or can be formed by extending the second touch routing line Y-TRW.

In the case that the first touch pad X-TP is formed by extending the first touch routing line X-TRW and the second touch pad Y-TP is formed by extending the second touch routing line Y-TRW, the first touch pad X-TP, the first touch routing line X-TRW, the second touch pad Y-TP, and the second touch routing line Y-TRW can be made of the same first conductive material. Here, the first conductive material can have a single-layer structure or a multi-layer structure using a metal having high corrosion resistance and acid resistance, and good conductivity properties, such as Al, Ti, Cu, and Mo.

For example, the first touch pad X-TP, the first touch routing line X-TRW, the second touch pad Y-TP, and the second touch routing line Y-TRW, which are made of the first conductive material, can include a laminated three-layer structure such as Ti/Al/Ti or Mo/Al/Mo.

The pad cover electrode capable of covering the first touch pad X-TP and the second touch pad Y-TP can be made of the same second conductive material as the first and second touch electrodes X-TE and Y-TE. Here, the second conductive material can be a transparent conductive material such as indium tin oxide (ITO) or indium zinc oxide (IZO) having high corrosion resistance and acid resistance properties. The pad cover electrode can be bonded to the touch driving circuit TDC or can be bonded to a circuit film on which the touch driving circuit TDC is mounted by being formed to be exposed by the touch buffer film T-BUF.

Here, the touch buffer film T-BUF is formed to cover the encapsulation layer ENCAP, thereby preventing the light-emitting element ED (e.g., organic light-emitting diode (OLED)) under the encapsulation layer ENCAP from being corroded by external moisture or the like. As an example, the touch buffer film T-BUF can be made of an organic insulating material, or can be formed as a circular polarizer or a film of epoxy or acrylic material. The touch buffer film T-BUF may not be present on the encapsulation layer ENCAP. For example, the touch buffer film T-BUF may not be an essential element or may be an optional element.

The second touch routing line Y-TRW can be electrically connected to the second touch electrode Y-TE through a touch routing line contact hole or can be formed by being integrated with the second touch electrode Y-TE.

The second touch routing line Y-TRW can be extended to the non-display area NA and can be electrically connected to the second touch pad Y-TP present in the touch pad part TPA in the first non-display area NA1 by coming downward along the inclined surface of the encapsulation layer ENCAP and passing over one or more dams DAM. Accordingly, the second touch routing line Y-TRW can be electrically connected to the touch driving circuit TDC through the second touch pad Y-TP.

The second touch routing line Y-TRW can transmit the touch-sensing signal from the second touch electrode Y-TE to the touch driving circuit TDC, or can receive the touch driving signal from the touch driving circuit TDC and transmit the touch driving signal to the second touch electrode Y-TE.

The first touch routing line X-TRW can be electrically connected to the first touch electrode X-TE through the touch routing line contact hole, or can be formed by being integrated with the first touch electrode X-TE.

The first touch routing line X-TRW can be extended to the non-display area NA and can be electrically connected to the first touch pad X-TP present in the touch pad part TPA in the first non-display area NA1 by coming downward along the inclined surface of the encapsulation layer ENCAP and passing over one or more dams DAM. Accordingly, the first touch routing line X-TRW can be electrically connected to the touch driving circuit TDC through the first touch pad X-TP.

The first touch routing line X-TRW can receive the touch driving signal from the touch driving circuit TDC and can transmit the touch driving signal to the first touch electrode X-TE, or can transmit the touch-sensing signal from the first touch electrode X-TE to the touch driving circuit TDC.

The arrangement of the first touch routing line X-TRW and the second touch routing line Y-TRW can be variously modified depending on the design requirements of the panel.

A touch protection film PAC can be disposed on the first touch electrode X-TE and the second touch electrode Y-TE. The touch protection film PAC can be extended before or after one or more dams DAM so as to be also disposed on the first touch routing line X-TRW and the second touch routing line Y-TRW.

Meanwhile, the cross-sectional view of FIG. 8 conceptually illustrates the structure, and thus, the position, thickness or width of each pattern (various layers or electrodes) can vary according to the viewing direction or position. In addition, the connection structure of various patterns can also be changed, and there can be additional layers other than the illustrated several layers, and some of the illustrated layers can be omitted or integrated. For example, the width of the bank BANK can be narrower than the case in the drawing, and the height of the dam DAM can be lower or higher than the case in the drawing.

Figure 9:
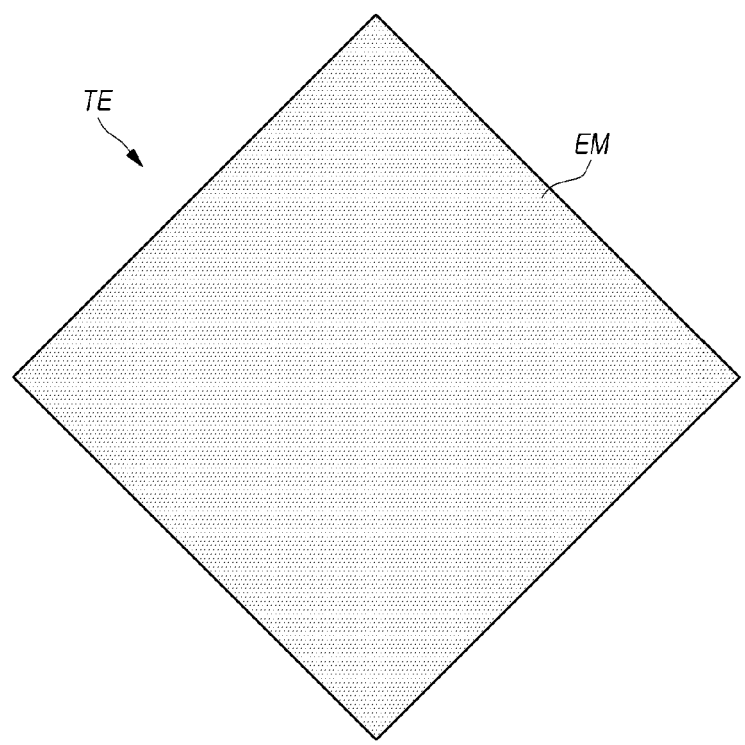
FIGS. 9 to 11 are exemplary diagrams illustrating touch electrodes disposed on the display panel according to embodiments of the present disclosure.
Figure 10:
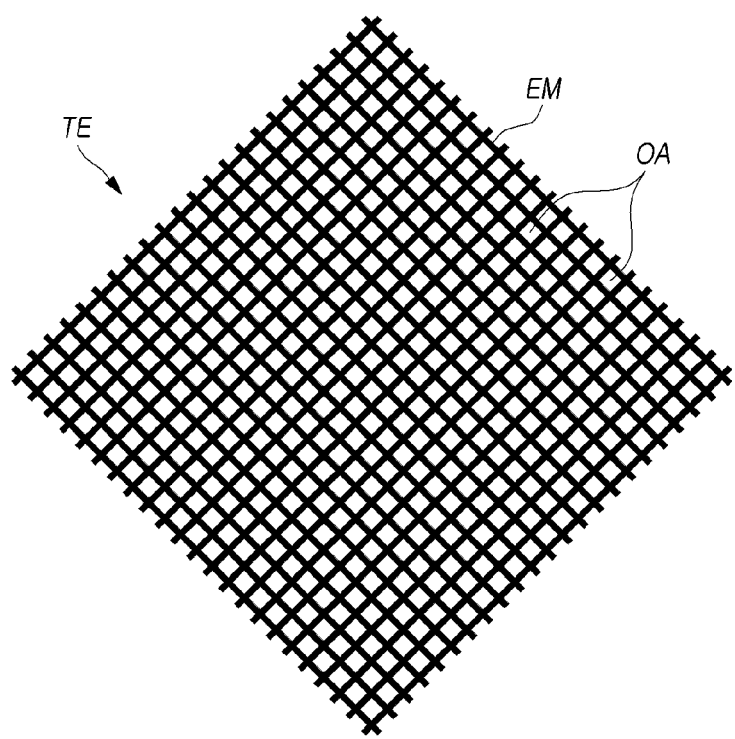
Figure 11:
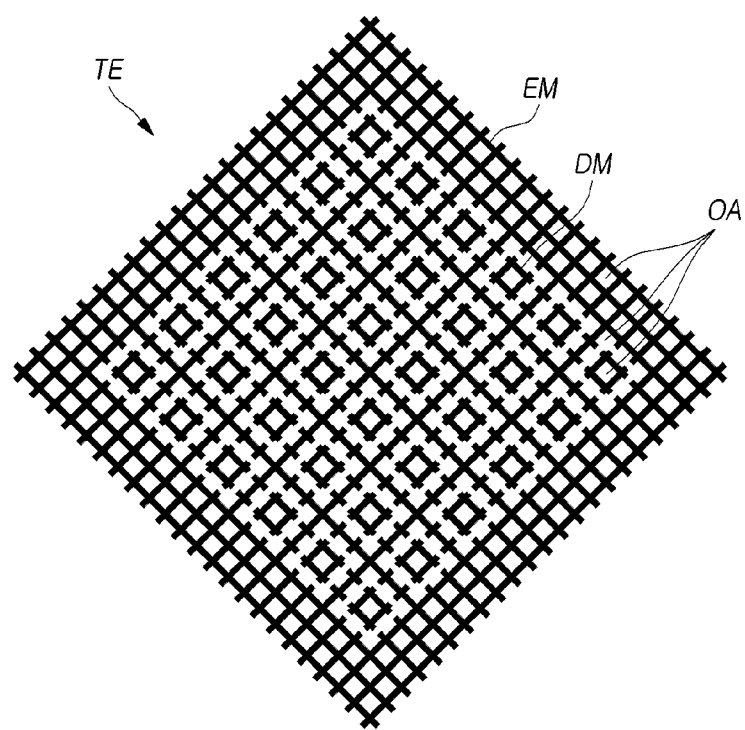

In the following description, when each of the first touch electrode line X-TEL and the second touch electrode line Y-TEL has the structure shown in FIG. 7, the structure such as a shape or the like for the first touch electrode X-TE included in the first touch electrode line X-TEL and the second touch electrode Y-TE included in the second touch electrode line Y-TEL will be described as an example. In FIGS. 9 to 11, the first touch electrode X-TE and the second touch electrode Y-TE are referred to herein as a touch electrode TE.

FIGS. 9 to 11 are exemplary diagrams illustrating touch electrodes disposed on the display panel DISP according to the embodiments of the present disclosure.

In one example, referring to FIG. 9, one touch electrode TE can be an electrode metal EM having a plate shape and no openings. In this case, the touch electrode TE can be a transparent electrode. For example, the touch electrode TE can be an electrode metal EM made of a transparent electrode material so that light emitted from the plurality of subpixels SP disposed therebelow can be transmitted upward.

In another example, referring to FIG. 10, one touch electrode TE can be formed in a mesh type having a plurality of open areas OA. For example, one touch electrode TE can be an electrode metal EM patterned into a mesh type to form the plurality of open areas OA. Here, the electrode metal EM is one of the touch sensor metals.

Each of the plurality of open areas OA present in one touch electrode TE can correspond to a light-emitting area of one or more subpixels SP. For example, the plurality of open areas OA can be routes through which light emitted from the plurality of subpixels SP disposed therebelow passes upward.

In the touch electrode TE, the actual electrode portion (i.e., the electrode metal EM) rather than the plurality of open areas OA can be located on the bank BANK.

When each of the first touch electrode line X-TEL and the second touch electrode line Y-TEL is a bar-shaped electrode, each of the first touch electrode line X-TEL and the second touch electrode line Y-TEL can be formed in a mesh type having the plurality of open areas OA. Each of the plurality of open areas OA can correspond to a light-emitting area of one or more subpixels SP.

As a method of forming a plurality of touch electrodes TE, the electrode metal EM is widely formed in a mesh type in an area for forming the plurality of touch electrodes TE, and then the electrode metal EM is cut into a predetermined pattern along boundary lines between the touch electrodes TE to form an electrically separated electrode metal EM. The electrically separated electrode metal EM forms a plurality of touch electrodes Y-TE.

As shown in FIGS. 9 to 11, the outline shape of the touch electrode Y-TE can be a square shape such as a diamond shape, a rhombus shape, or the like or various shapes such as a triangular shape, a pentagonal shape, a hexagonal shape, or the like.

In still another example, referring to FIG. 11, in the area occupied by the mesh type touch electrode TE of FIG. 10, there can be at least one dummy metal DM separated from the mesh type electrode metal EM.

The electrode metal EM is a portion corresponding to a substantial touch electrode TE and is a portion in which the touch driving signal is applied or the touch-sensing signal is detected, but the dummy metal DM is a portion in which the touch driving signal is not applied and the touch-sensing signal is not detected even though it is present in the area of the touch electrode TE. For example, the dummy metal DM can be an electrically floated metal.

Accordingly, the electrode metal EM can be electrically connected to the touch driving circuit TDC, but the dummy metal DM is not electrically connected to the touch driving circuit TDC.

At least one dummy metal DM can be present in a state of being disconnected from the electrode metal EM in an area of each of all the touch electrodes TE. Alternatively, at least one dummy metal DM can be present in a state of being disconnected from the electrode metal EM only in an area of each of some touch electrodes TE among all the touch electrodes TE. For example, the dummy metal DM may not be present in the area of some of the touch electrodes TE.

Meanwhile, with regard to the role of dummy metal DM, as shown in FIG. 10, when at least one dummy metal DM is not present in the area of the touch electrode TE and only the electrode metal EM is formed as the mesh type, a visibility issue in which the contour of the electrode metal EM is visible on the screen can occur.

In contrast, as shown in FIG. 11, when at least one dummy metal DM is present in the area of the touch electrode TE, the visibility issue in which the contour of the electrode metal EM is visible on the screen can be prevented.

Furthermore, the effective electrode area affecting the magnitude of the mutual capacitance per each touch electrode TE can be adjusted by controlling the presence or number (dummy metal ratio) of the dummy metal DM for each touch electrode TE. Thus, the magnitude of the mutual capacitance between the first touch electrode X-TE and the second touch electrode Y-TE can be adjusted to improve touch sensitivity.

Meanwhile, the cut electrode metal EM can be formed of the dummy metal DM by cutting some points on the electrode metal EM formed in the area of one touch electrode TE. For example, the electrode metal EM and the dummy metal DM can be the same material formed on the same layer.

Figure 12:
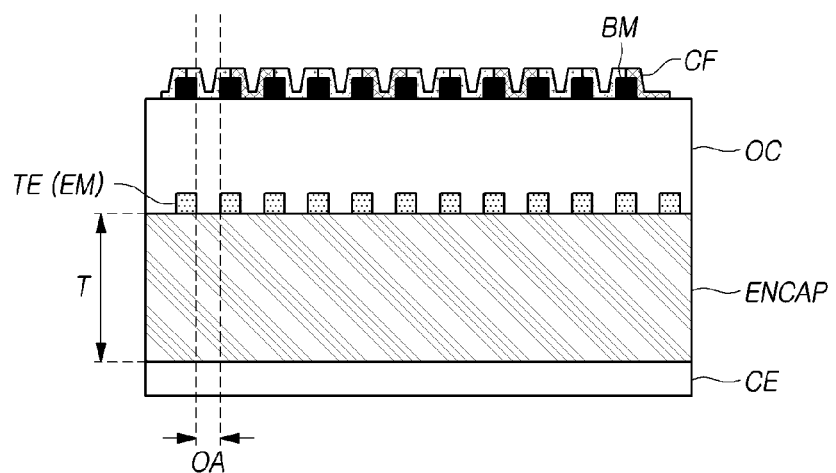
FIGS. 12 and 13 are exemplary diagrams illustrating a cross-sectional structure of the display panel including a color filter according to embodiments of the present disclosure.
Figure 13:
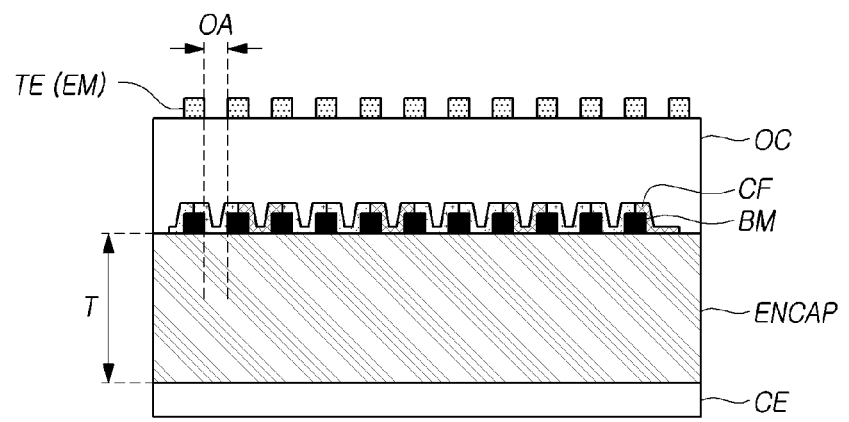

FIGS. 12 and 13 are exemplary diagrams illustrating a cross-sectional structure of the display panel DISP including a color filter according to the embodiments of the present disclosure; however, in FIGS. 12 and 13, the touch electrode TE refers to the first touch electrode X-TE and the second touch electrode Y-TE.

Referring to FIGS. 12 and 13, in the case that the touch panel TSP is embedded in the display panel DISP and the display panel DISP is implemented as an organic light-emitting display panel, the touch sensor such as the plurality of first touch electrodes X-TE, the plurality of second touch electrodes Y-TE, the plurality of first bridge patterns X-CL, and the plurality of second bridge patterns Y-CL can be located on the encapsulation layer ENCAP in the display panel DISP.

As described above, by forming the touch sensor on the encapsulation layer ENCAP, the touch sensor can be formed without greatly affecting display performance and display-related layer formation.

Meanwhile, referring to FIGS. 12 and 13, the common electrode CE which can be the cathode of the light-emitting element ED can be located below the encapsulation layer ENCAP.

A thickness T of the encapsulation layer ENCAP can be, for example, 5 μm or more. By designing the thickness of the encapsulation layer ENCAP to be 5 μm or more, it is possible to reduce parasitic capacitance formed between the common electrode CE and the touch electrodes TE. Thus, it is possible to prevent a decrease in touch sensitivity due to the parasitic capacitance.

Each of the plurality of open areas OA formed in each of the touch electrodes TE can correspond to the light-emitting area of one or more subpixels when viewed in a vertical direction. Accordingly, the light emission efficiency of the display panel DISP can be improved.

As shown in FIGS. 12 and 13, color filters CF can be disposed on the display panel DISP and a black matrix BM can further be disposed on the display panel DISP. The black matrix BM can be different from the color filter CF. Alternatively, the black matrix BM can be formed by overlapping two or more different color filters CF with different colors. A layer having the color filters CF is referred to herein as a color conversion layer.

The position of the black matrix BM can correspond to the position of the electrode metal EM of the touch electrode TE. The position of the color filter CF can correspond to the position of the open area OA of the touch electrode TE. Accordingly, the light-emitting performance of the display panel DISP can be enhanced.

Referring to FIG. 12, the color conversion layer including the plurality of color filters CF and the black matrix BM can be located over the plurality of touch electrodes TE. The color conversion layer including the plurality of color filters CF and the black matrix BM can be located on an overcoat layer OC disposed on the plurality of touch electrodes TE. Here, the overcoat layer OC can be the same layer as the touch protection film PAC or can be another layer.

Referring to FIG. 13, the color conversion layer including the plurality of color filters CF and the black matrix BM can be located under the plurality of touch electrodes TE. The overcoat layer OC can be disposed on the color conversion layer including the plurality of color filters CF and the black matrix BM, and the plurality of touch electrodes TE can be located on the overcoat layer OC.

Figure 14:
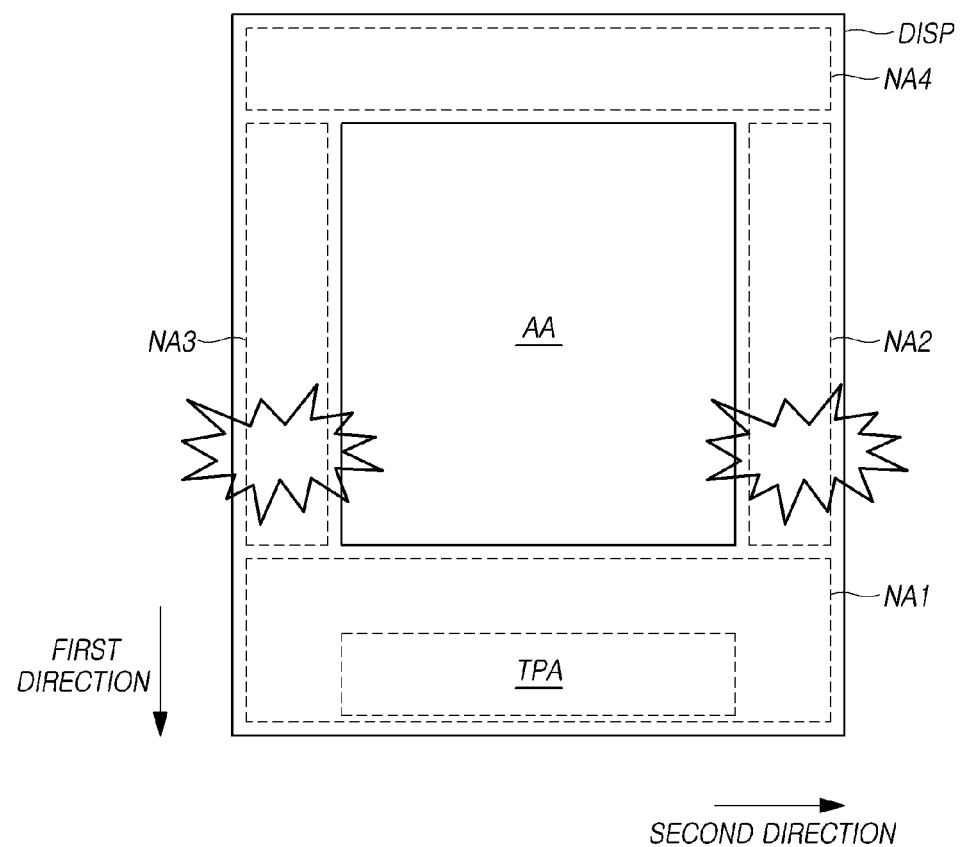
FIG. 14 is a view illustrating a display area and non-display areas of the display panel according to embodiments of the present disclosure.

FIG. 14 is a view illustrating a display area AA and non-display areas NA1, NA2, NA3, and NA4 of the display panel DISP according to the embodiments of the present disclosure.

Referring to FIG. 14, the display panel DISP according to the embodiments of the present disclosure can include a display area AA in which an image is displayed and a non-display area NA in which an image is not displayed, wherein the non-display area NA is an outer area of the display area AA.

For example, the non-display area NA can be divided into a first non-display area NA1, a second non-display area NA2, a third non-display area NA3, a fourth non-display area NA4, and the like.

The first non-display area NA1, the second non-display area NA2, the third non-display area NA3, and the fourth non-display area NA4 are merely areas in which the non-display area NA is divided for convenience of description, and may not have exact boundaries or may not be separated from each other.

The first non-display area NA1 is located on an outer periphery of the display area AA in a first direction (in a downward direction in the drawing). For example, the first non-display area NA1 is an area located below the display area AA among the entire non-display area NA.

The second non-display area NA2 is located on an outer periphery of the display area AA in a second direction (in a right direction in the drawing). For example, the second non-display area NA2 is an area located at a right side of the display area AA among the entire non-display area NA.

The third non-display area NA3 is located on an outer periphery of the display area AA in a direction opposite to the second direction (in a left direction in the drawing). For example, the third non-display area NA3 is an area located at a left side of the display area AA among the entire non-display area NA.

The fourth non-display area NA4 is located on an outer periphery of the display area AA in a direction opposite to the first direction (in an upward direction in the drawing). For example, the fourth non-display area NA4 is an area located above the display area AA among the entire non-display area NA.

The wiring arrangement structure in each of the first to fourth non-display areas NA1, NA2, NA3, and NA4 will be described by way of example. The following description is given with reference to FIGS. 4 to 6.

The plurality of second touch routing lines Y-TRW connected to the plurality of second touch electrode lines Y-TEL can pass through the fourth non-display area NA4.

The plurality of second touch routing lines Y-TRW passing through the fourth non-display area NA4 can pass through the second non-display area NA2 (see FIGS. 4 to 6). The plurality of first touch routing lines X-TRW connected to the plurality of first touch electrode lines X-TEL can also pass through the second non-display area NA2 (see FIG. 4).

The plurality of first touch routing lines X-TRW connected to the plurality of first touch electrode lines X-TEL can also pass through the third non-display area NA3 (see FIGS. 4 to 6). The plurality of second touch routing lines Y-TRW passing through the fourth non-display area NA4 can also pass through the third non-display area NA3.

The touch pad part TPA including the plurality of first touch pads X-TP and the plurality of second touch pads Y-TP is present in the first non-display area NA1.

All the touch routing lines X-TRW and Y-TRW passing through the second non-display area NA2 and/or the third non-display area NA3 are collected and connected to the touch pad part TPA in the first non-display area NA1.

A considerable number of touch routing lines X-TRW and Y-TRW are disposed in the first non-display area NA1 where the touch pad part TPA is present.

Many touch routing lines X-TRW and/or Y-TRW can also be disposed in the first non-display area NA1 and/or the third non-display area NA3 as well as the second non-display area NA2.

Further, the second non-display area NA2 and/or the third non-display area NA3 are areas in which the GIP-type gate driving circuit GDC is disposed, so that the width of the second non-display area NA2 and/or the third non-display area NA3 is inevitably increased.

When the width (size) of the second non-display area NA2 and/or the third non-display area NA3 increases, a bezel of the touch display device and the display panel DISP is increased. For example, it is difficult to implement a narrow bezel in the touch display device.

A power transmission pattern for transmitting the base voltage VSS to the common electrode CE can be disposed in the second non-display area NA2 and/or the third non-display area NA3. In this case, the bezel of the touch display device and the display panel DISP is further increased.

The increase in the bezel of the second non-display area NA2 and/or the third non-display area NA3 is a phenomenon that can occur regardless of the type of a routing structure, even though the increase in the bezel is greater in the double routing structure than in the single routing structure and the half-single routing structure.

Hereinafter, the phenomenon in which the bezel of the second non-display area NA2 and/or the third non-display area NA3 is increased and the phenomenon in which touch sensitivity is accordingly reduced will be described in more detail with reference to FIGS. 15 to 17. In addition, the structure by which the bezel of the second non-display area NA2 and/or the third non-display area NA3 can be reduced will be described in detail with reference to FIGS. 18 to 42.

However, hereinafter, for convenience of description, among the second non-display area NA2 and the third non-display area NA3, the second non-display area NA2 will be described as an example. In addition, the drawings (cross-sectional views), which are referenced below, are conceptually illustrated, and are illustrated without regard to the height, inclination, or the like of the layers. The drawings referred to below will be applied to the cross-sectional structure in FIG. 8.

Figure 15:
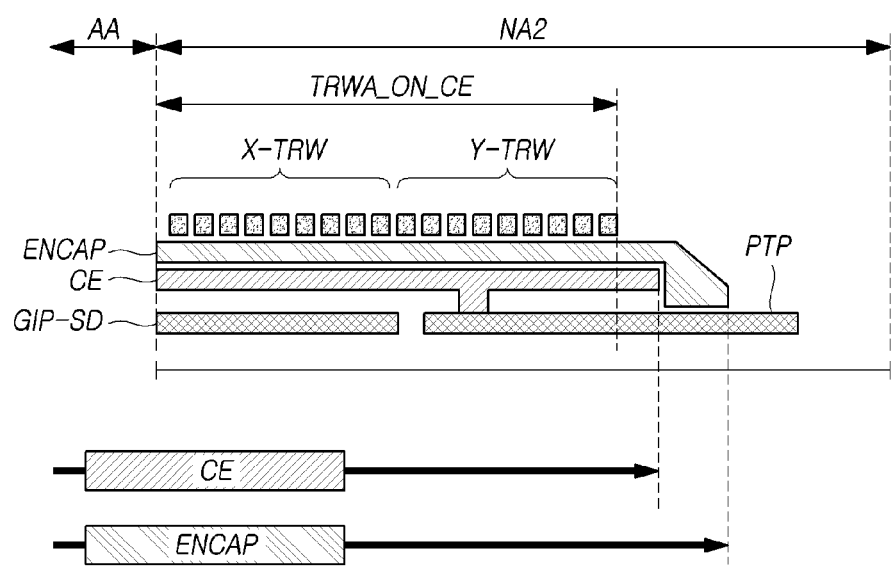
FIG. 15 is a schematic view illustrating an arrangement structure of touch routing lines in a second non-display area of the display panel according to embodiments of the present disclosure.

FIG. 15 is a schematic view illustrating an arrangement structure of the touch routing lines X-TRW and Y-TRW in the second non-display area NA2 of the display panel DISP according to the embodiments of the present disclosure.

More specifically, FIG. 15 is a cross-sectional view illustrating the structure in which the plurality of first touch routing lines X-TRW and the plurality of second touch routing lines Y-TRW are disposed in the second non-display area NA2 under the double routing structure of FIG. 4.

Referring to FIG. 15, the common electrode CE disposed in the display area AA can extend to a partial area of the non-display area NA. In addition, the encapsulation layer ENCAP disposed in the display area AA can also extend to a partial area of the non-display area NA. The encapsulation layer ENCAP is disposed by extending further outward than the common electrode CE. The encapsulation layer ENCAP has a lower height as it goes to an outer periphery and thus has an inclination. In addition, a dam can be present at the end portion of the inclined surface of the encapsulation layer ENCAP. This is also illustrated in FIG. 8, and is commonly applied to all the drawings referenced below.

However, in FIG. 15 and the drawings referenced below, the encapsulation layer ENCAP, the common electrode CE, the touch routing lines X-TRW and Y-TRW, and the like are conceptually and briefly illustrated only for the relative relationship of positions and can be different from actual ones. Accordingly, in FIG. 15 and all the drawings referenced below, the position, inclination angle, height, and the like of the inclined surface of the encapsulation layer ENCAP are also just conceptually illustrated.

Referring to FIG. 15, when the gate driving circuit GDC is implemented as a GIP type, the GIP-type gate driving circuit GDC can be disposed in the second non-display area NA2 and electrically connected to the plurality of gate lines GL disposed in the display area AA. The gate driving circuit GDC is disposed in the second non-display area NA2 and can be disposed to be adjacent to the display area AA.

Referring to FIG. 15, a power transmission pattern PTP for supplying the base voltage VSS to the common electrode CE can be disposed in the second non-display area NA2. The power transmission pattern PTP can be disposed further outward than the gate driving circuit GDC and can be connected to the common electrode CE extending from the display area AA and disposed in the second non-display area NA2.

Referring to FIG. 15, the plurality of first touch routing lines X-TRW and the plurality of second touch routing lines Y-TRW disposed in the second non-display area NA2 can overlap the common electrode CE.

In other words, in an area TRWA_ON_CE, in which the common electrode CE is present, in the second non-display area NA2, the plurality of first touch routing lines X-TRW and the plurality of second touch routing lines Y-TRW can be disposed to overlap the common electrode CE.

Referring to FIG. 15, when the plurality of first touch routing lines X-TRW and the plurality of second touch routing lines Y-TRW are disposed to overlap the common electrode CE, the bezel should be increased, and the bezel should be increased even more due to the formation of the power transmission pattern PTP.

Figure 16:
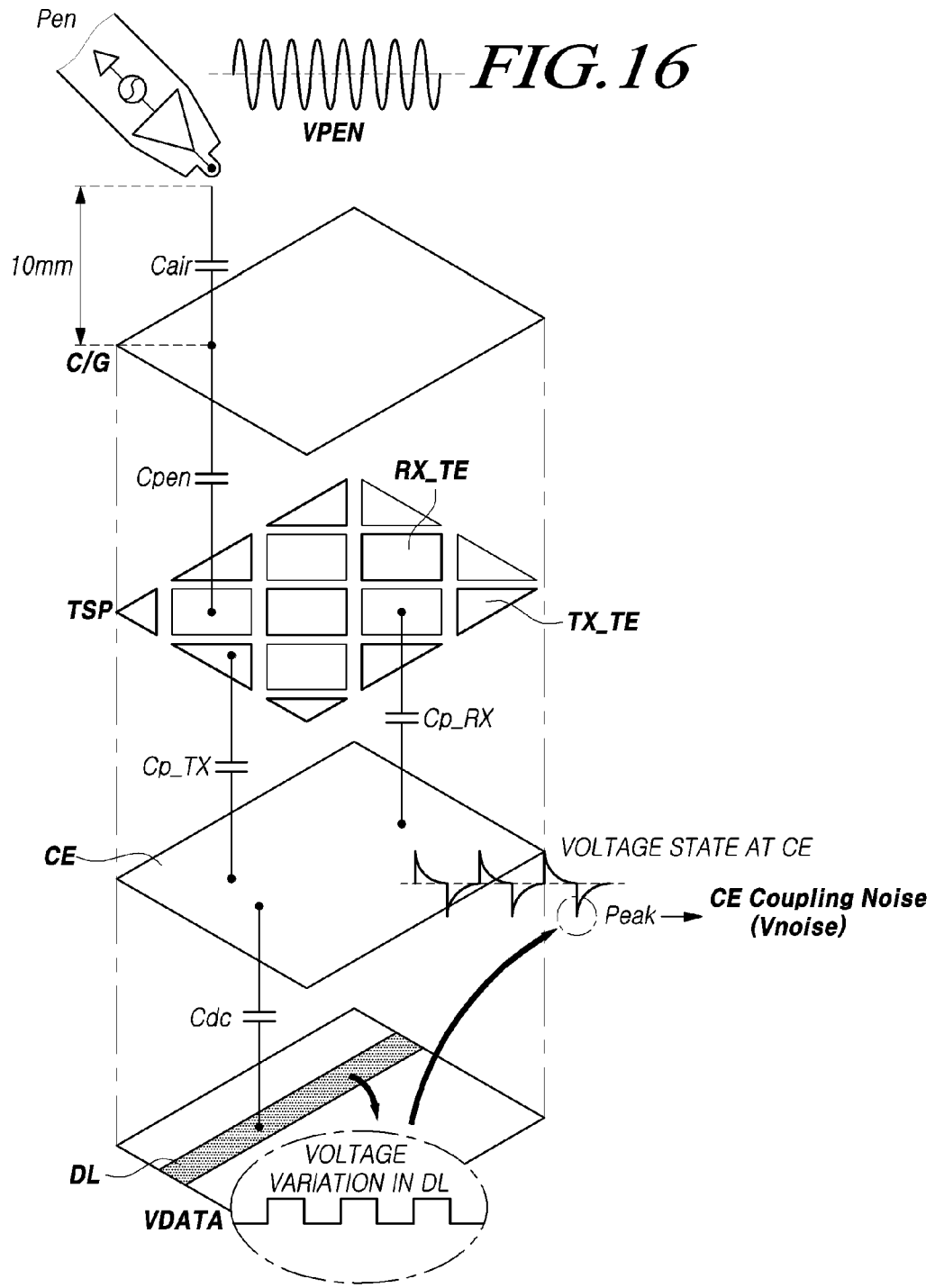
FIG. 16 a diagram illustrating noise generated from a common electrode on the display panel according to embodiments of the present disclosure.

FIG. 16 a diagram illustrating noise generated from the common electrode on the display panel DISP according to the embodiments of the present disclosure.

Referring to FIG. 16, in the touch display device according to the embodiments of the present disclosure, there can be various capacitances $C_{air}$, $C_{pen}$, Cp_TX, Cp_RX, and Cdc generated in connection with the sensing operation.

On the display panel DISP, subpixels SP including a light-emitting element ED, transistors T1 and T2, a storage capacitor Cst, and the like, and a plurality of data lines DL and a plurality of gate lines GL, and the like that are for driving the subpixels SP can be disposed. The light-emitting element ED can include a pixel electrode PE, a light-emitting layer EL, and a common electrode CE. The encapsulation layer ENCAP can be disposed on the common electrode CE, and the touch sensor can be disposed on the encapsulation layer ENCAP.

The touch sensor including a plurality of first touch electrode lines X-TEL and a plurality of second touch electrode lines Y-TEL can be disposed on the encapsulation layer ENCAP. The plurality of first touch electrode lines X-TEL can include a plurality of first touch electrodes X-TE, and the plurality of second touch electrode lines Y-TEL can include a plurality of second touch electrodes Y-TE.

In the case of mutual capacitance-based touch sensing, the plurality of first touch electrode lines X-TEL can be transmission electrode lines (also referred to herein as driving electrode lines), and the plurality of second touch electrode lines Y-TEL can be receiving electrode lines (also referred to herein as sensing electrode lines). In contrast, the plurality of first touch electrode lines X-TEL can be receiving electrode lines (also referred to herein as sensing electrode lines), and the plurality of second touch electrode lines Y-TEL can be transmission electrode lines (also referred to herein as driving electrode lines).

In the case of mutual capacitance-based touch sensing, from the touch electrode point of view, the plurality of first touch electrodes X-TE can be transmission touch electrodes TX_TE, and the plurality of second touch electrodes Y-TE can be receiving touch electrodes RX_TE. In contrast, the plurality of first touch electrodes X-TE can be receiving touch electrodes RX_TE, and the plurality of second touch electrodes Y-TE can be transmission touch electrodes TX_TE.

As described above, the transmission touch electrode TX_TE and the receiving touch electrode RX_TE corresponding to the touch sensor can be located on the encapsulation layer ENCAP. The plurality of data lines DL, the plurality of gate lines GL, the driving transistor T1, and the like can be located under the encapsulation layer ENCAP.

The common electrode CE can be disposed on the data line DL, the transmission touch electrode TX_TE and the receiving touch electrode RX_TE can be disposed on the common electrode CE, and a cover glass C/G can be located on the transmission touch electrode TX_TE and the receiving touch electrode RX_TE.

Referring to FIG. 16, in the above-described stack structure, when a pen tip of a pen is brought into contact with the cover glass C/G to generate a pen touch, a pen capacitance Cpen can be formed between the pen and the receiving touch electrode RX_TE. Alternatively, when a finger comes into contact with the cover glass C/G to generate a finger touch, a finger capacitance can also be formed between the finger and the receiving touch electrode RX_TE.

Referring to FIG. 16, in the case that a hover type pen touch occurs in which the pen tip of the pen is separated from the cover glass C/G by a predetermined distance (e.g., about 10 mm) without being brought into contact with the cover glass C/G, the receiving touch electrode RX_TE receives a pen signal VPEN output from the pen tip of the pen. Here, the capacitance formed between the pen and the receiving touch electrode RX_TE can be divided into an air capacitance Cair and the pen capacitance Cpen. For example, the air capacitance Cair can be formed between the pen and the cover glass C/G, and the pen capacitance Cpen can be formed between the cover glass C/G and the receiving touch electrode RX_TE. Here, for example, the pen signal VPEN can have various signal forms such as a sine wave, a triangle wave, and a square wave.

Referring to FIG. 16, a parasitic capacitance Cp_TX can be formed between the transmission touch electrode TX_TE and the common electrode CE, and a parasitic capacitance Cp_RX can be formed between the receiving touch electrode RX_TE and the common electrode CE.

Referring to FIG. 16, a parasitic capacitance Cdc can be formed between the data line DL to which the data voltage VDATA is applied and the common electrode CE to which the common voltage VSS is applied. In addition, parasitic capacitance can be formed between the gate line GL to which the scan signal SCAN is applied and the common electrode CE to which the common voltage VSS is applied.

The data voltage VDATA applied to the plurality of data lines DL and the scan signal SCAN applied to the plurality of gate lines GL do not have a constant voltage but are signals whose voltage level varies.

In particular, the data voltage VDATA applied to the plurality of data lines DL is a signal having a large degree of randomness, which is difficult to predict the timing, at which the voltage level varies, or the variation level, depending on the image to be updated every frame. Due to the data voltage VDATA having a high degree of randomness, the data line DL can have a voltage variation characteristic having a timing or level that is difficult to predict.

The voltage state at the common electrode CE coupled to the data line DL through the parasitic capacitance Cdc can be changed in accordance with the voltage variation in the data line DL. More specifically, at the timing when the voltage level of the data voltage VDATA changes, the common electrode CE coupled to the data line DL through the parasitic capacitance Cdc can generate a peak voltage according to the voltage level change of the data voltage VDATA.

Thus, in the common electrode CE, the common voltage VSS in the form of the applied DC voltage is not constantly maintained, but the peak voltage can be generated due to the voltage variation of the data line DL, thereby causing an undesired voltage variation.

An abnormal peak voltage generated at the common electrode CE is referred to herein as CE coupling noise and corresponds to a noise voltage Vnoise which can degrade display performance and touch performance.

The undesired voltage variation in the common electrode CE can also cause an undesired voltage variation in the transmission touch electrode TX_TE and the common electrode CE that correspond to the touch sensor overlapping the common electrode CE.

Further, as shown in FIG. 15, the undesired voltage variation in the common electrode CE can also cause an undesired voltage variation in the first touch routing line X-TRW and the second touch routing line Y-TRW overlapping the common electrode CE. Such a phenomenon can adversely affect touch sensing (pen sensing or touch sensing) as well as display performance.

Accordingly, as shown in FIG. 15, in the second non-display area NA2, when the plurality of first touch routing lines X-TRW and the plurality of second touch routing lines Y-TRW are disposed to overlap the common electrode CE, in addition to the increase in the bezel, touch sensing can be deteriorated due to the noise caused by the common electrode CE.

Figure 17:
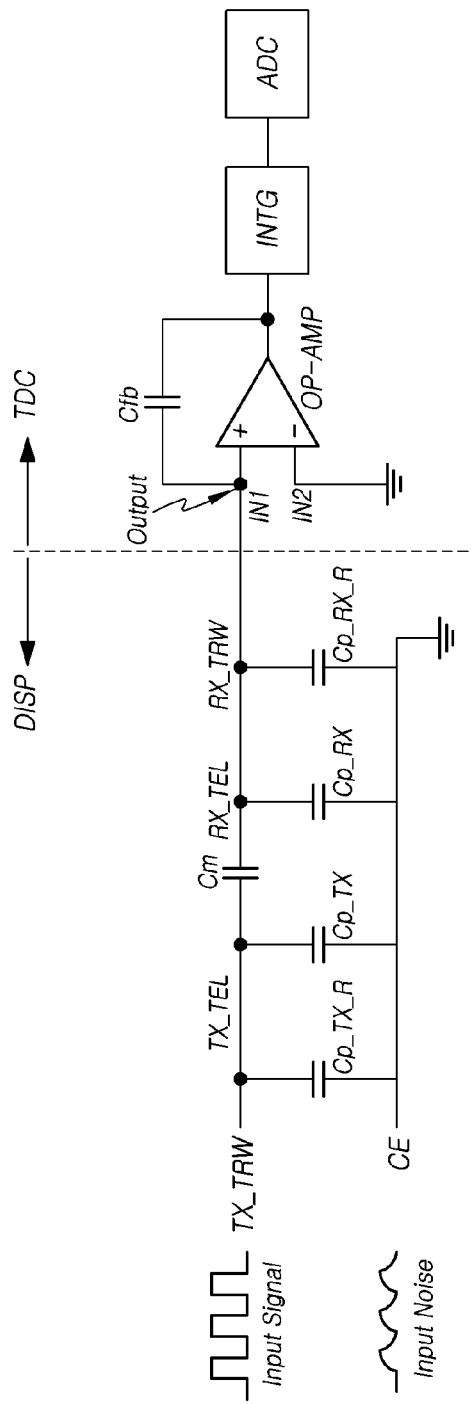
FIG. 17 is a diagram illustrating an equivalent circuit of a sensing system of the touch display device according to embodiments of the present disclosure.

FIG. 17 is a diagram illustrating an equivalent circuit of a sensing system of the touch display device according to the embodiments of the present disclosure.

The sensing system of the touch display device according to the embodiments of the present disclosure can be obtained by modeling the touch sensor, the common electrode CE, various capacitances Cm, Cp_TX_R, Cp_TX, Cp_RX, and Cp_RX_R, the touch driving circuit TDC, and the like in the display panel DISP and can be represented by the equivalent circuit as shown in FIG. 17.

The touch sensor can include a transmission touch routing line TX_TRW, a transmission touch electrode line TX_TEL, a receiving touch routing line RX_TRW, a receiving touch electrode line RX_TEL, and the like.

The transmission touch routing line TX_TRW can be the first touch routing line X-TRW or the second touch routing line Y-TRW. The receiving touch routing line RX_TRW can be the second touch routing line Y-TRW or the first touch routing line X-TRW.

The transmission touch electrode line TX_TEL can be the first touch electrode line X-TEL or the second touch electrode line Y-TEL. The receiving touch electrode line RX_TEL can be the second touch electrode line Y-TEL or the first touch electrode line X-TEL.

In the display area AA, a mutual capacitance Cm required for touch sensing can be formed between the transmission touch electrode line TX_TEL and the receiving touch electrode line RX_TEL.

In the display area AA, a transmission side parasitic capacitance Cp_TX can be formed between the transmission touch electrode line TX_TEL and the common electrode CE, and a receiving side second parasitic capacitance Cp_RX can be formed between the receiving touch electrode line RX_TEL and the common electrode CE.

In the non-display area NA, a transmission side routing parasitic capacitance Cp_TX_R can be formed between the transmission touch routing line TX_TRW and the common electrode CE, and a receiving side routing second parasitic capacitance Cp_RX_R can be formed between the receiving touch routing line RX_TRW and the common electrode CE.

The touch driving circuit TDC can include an operational amplifier OP-AMP including a first input terminal IN1, a second input terminal IN2, and an output terminal, a feedback capacitor Cfb connected between the first input terminal IN1 and the output terminal of the operational amplifier OP-AMP, an integrator INTG connected to the output terminal of the operational amplifier OP-AMP, an analog-to-digital converter ADC connected to an output terminal of the integrator INTG, and the like.

The first input terminal IN1 of the operational amplifier OP-AMP can be a non-inverting (+) input terminal, and the second input terminal IN2 of the operational amplifier OP-AMP can be an inverting (−) input terminal. The first input terminal IN1 of the operational amplifier OP-AMP can be electrically connected to the receiving touch routing line RX_TRW through the touch pad X-TP or Y-TP. A reference voltage can be applied to the second input terminal IN2 of the operational amplifier OP-AMP. Here, for example, the reference voltage can be a DC voltage such as a ground voltage, and in some cases, can also be an AC voltage. The operational amplifier OP-AMP with the feedback capacitor Cfb is also referred to herein as a charge amplifier.

Referring to FIG. 17, in the touch driving circuit TDC, as an input signal, a driving signal for touch sensing is input to the transmission touch routing line TX_TRW through the touch pad Y-TP or X-TP. Thus, the input signal is applied to the transmission touch electrode line TX_TEL.

Referring to FIG. 17, the touch driving circuit TDC detects the signal in the receiving touch electrode line RX_TEL through the receiving touch routing line RX_TRW connected to the first input terminal IN1 of the operational amplifier OP-AMP.

Here, the node at which the signal is detected can be referred to herein as an output node. The output node can correspond to the first input terminal IN1 of the operational amplifier OP-AMP, the touch pad X-TP or Y-TP connected to the first input terminal IN1 of the operational amplifier OP-AMP, or the receiving touch routing line RX_TRW connected to the touch pad X-TP or Y-TP.

Referring to FIG. 17, undesired noise can be generated in the common electrode CE as described above with reference to FIG. 16.

Due to the abnormal noise generated in the common electrode CE, an undesired voltage variation (noise) can occur in the transmission touch routing line TX_TRW, the transmission touch electrode line TX_TEL, the receiving touch routing line RX_TRW, and the receiving touch electrode line RX_TEL, which are capacitively coupled to the common electrode CE, to lower sensing sensitivity.

Such a problem can be even more serious when the plurality of first touch routing lines X-TRW and the plurality of second touch routing lines Y-TRW are disposed to overlap the common electrode CE as shown in FIG. 15.

Hereinafter, the structure by which the bezel of the second non-display area NA2 and/or the third non-display area NA3 can be reduced and can withstand abnormal noise in the common electrode CE will be described in detail with reference to FIGS. 18 to 42.

However, hereinafter, for convenience of description, among the second non-display area NA2 and the third non-display area NA3, the second non-display area NA2 will be described as an example. In addition, the drawings (cross-sectional views), which are referenced below, are conceptually illustrated, and are illustrated without regard to the height, inclination, or the like of the layers. The drawings referred to below will be applied to the cross-sectional structure in FIG. 8. In addition, the difference from the description described above is mainly described below. Thus, for the contents not described below, the contents described above can be applied.

FIGS. 18 to 27 are views illustrating arrangement structures that do not allow the second touch routing lines Y-TRW among the first touch routing lines X-TRW and the second touch routing lines Y-TRW to overlap the common electrode CE in the second non-display area NA2 of the display panel DISP in order to implement a narrow bezel in the case that the touch display device according to the embodiments of the present disclosure has a double routing structure.

In the case of the arrangement structures shown in FIGS. 18 to 27, the second touch routing lines Y-TRW among the first touch routing lines X-TRW and the second touch routing lines Y-TRW do not overlap the common electrode CE. Accordingly, the narrow bezel can be easily implemented, and the parasitic capacitance can be prevented from being formed between the common electrode CE and the second touch routing lines Y-TRW to improve touch sensitivity. This will be described in more detail below.

The touch display device according to the embodiments of the present disclosure can include a substrate SUB, a plurality of pixel electrodes PE each disposed for each of a plurality of subpixel areas on the substrate SUB, a common electrode CE disposed on the plurality of pixel electrodes PE and having a common voltage VSS applied thereto, an encapsulation layer ENCAP disposed to cover the common electrode CE, a touch sensor including n first touch electrode lines X-TEL and m second touch electrode lines Y-TEL disposed on the encapsulation layer ENCAP in a display area AA, and the like.

When designed with a double routing structure, the touch display device can further include a touch pad part TPA including 2n first touch pads X-TP and 2m second touch pads Y-TP and disposed in a first non-display area NA1, which is located at an outer periphery of the display area AA in a first direction, among non-display areas NA that are outer areas of the display area AA.

When designed with a double routing structure, the touch display device can further include 2n first touch routing lines X-TRW configured to electrically connect one end and the other end of each of n first touch electrode lines X-TEL to each of the 2n first touch pads X-TP disposed in the first non-display area NA1 by coming downward along an inclined surface of the encapsulation layer ENCAP.

When designed with a double routing structure, the touch display device can further include 2m second touch routing lines Y-TRW configured to electrically connect one end and the other end of each of m second touch electrode lines Y-TEL to each of the 2m first touch pads X-TP disposed in the first non-display area NA1 by coming downward along the inclined surface of the encapsulation layer ENCAP.

In the touch display device according to the embodiments of the present disclosure, each of the n first touch electrode lines X-TEL and the m second touch electrode lines Y-TEL can include one or more touch sensor metals.

When designed with a double routing structure, some (for example, n) first touch routing lines X-TRW of the 2n first touch routing lines X-TRW and some (for example m) second touch routing lines Y-TRW of the 2m second touch routing lines Y-TRW can pass through a second non-display area NA2 disposed at an outer periphery of the display area AA in a second direction.

Two or more first touch routing lines X-TRW passing through the second non-display area NA2 can include a touch sensor metal.

Referring to FIGS. 18 to 27, the two or more first touch routing lines X-TRW passing through the second non-display area NA2 can be disposed to overlap the common electrode CE extending from the display area AA to the second non-display area NA2.

Referring to FIGS. 18 to 27, two or more second touch routing lines Y-TRW passing through the second non-display area NA2 can include one or more second touch routing lines Y-TRW_TSM including the touch sensor metal, and one or more second touch routing lines Y-TRW_SD including a first metal different from the touch sensor metal.

As described above, since the two or more second touch routing lines Y-TRW disposed in the second non-display area NA2 are divided and disposed in two or more layers (for example, three layers, four layers, or the like) instead of being disposed side by side on one layer, the size of the bezel area occupied by the two or more second touch routing lines Y-TRW in the second non-display area NA2 can be reduced.

The first metal is a metal different from the touch sensor metal and can include one or more metals. For example, the first metal can include one or more among a source-drain metal included in source and drain electrodes of transistors (T1, T2, and the like) disposed in the display area AA or a data line DL in the display area AA, and a gate metal included in gate electrodes of the transistors (T1, T2, and the like) or a gate line GL in the display area AA.

As described above, when the first metal includes the source-drain metal and the gate metal, the one or more second touch routing lines Y-TRW_SD including the first metal can be disposed in one layer. Alternatively, the first metal can include both the source-drain metal and the gate metal. In this case, the one or more second touch routing lines Y-TRW_SD including the first metal can be divided and disposed in two layers. Such content is applicable to all the structures described below.

The touch sensor metal can include one or more of an electrode metal and a bridge metal. When the second touch routing line Y-TRW_TSM includes one touch sensor metal among the electrode metal and the bridge metal, the one or more second touch routing lines Y-TRW_TSM including the touch sensor metal can be disposed in one layer. Alternatively, when the second touch routing line Y-TRW_TSM includes both touch sensor metals (electrode metal and bridge metal), the one or more second touch routing lines Y-TRW_TSM including the touch sensor metal can be divided and disposed in two layers. Such content is applicable to all the structures described below.

Referring to FIGS. 18 to 27, a gate driving circuit GDC implemented as a GIP type in the touch display device can be electrically connected to a plurality of gate lines GL disposed in the display area AA, and can be disposed to overlap the common electrode CE that is disposed in the second non-display area NA2 and extending from the display area AA to the second non-display area NA2.

Referring to FIGS. 18 to 27, the gate driving circuit GDC can include transistors (e.g., a pull-up transistor, a pull-down transistor, and the like) including a metal GIP-SD that is the same as the first metal. Here, the first metal is a metal included in the one or more second touch routing lines Y-TRW_SD among the two or more second touch routing lines Y-TRW passing through the second non-display area NA2.

Referring to FIGS. 18 to 27, the touch display device can further include a power transmission pattern PTP disposed in the second non-display area NA2 and configured to transmit the common voltage VSS to the common electrode CE.

Referring to FIGS. 18 to 27, the power transmission pattern PTP can include a first metal. Here, the first metal is the metal included in the one or more second touch routing lines Y-TRW_SD among the two or more second touch routing lines Y-TRW passing through the second non-display area NA2.

Figure 18:
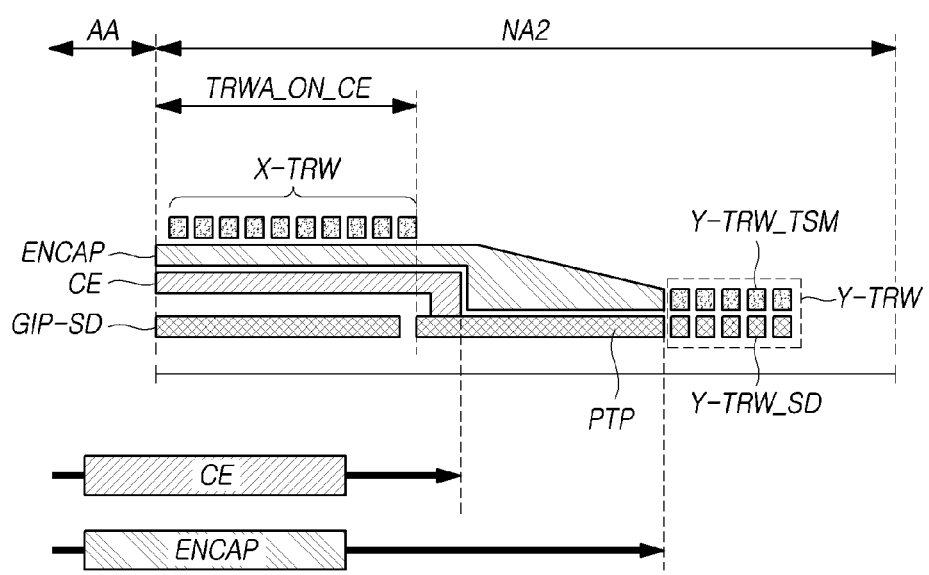
FIGS. 18 to 27 are views illustrating arrangement structures that do not allow second touch routing lines among first touch routing lines and the second touch routing lines to overlap a common electrode in a second non-display area of the display panel in order to implement a narrow bezel in the case that the touch display device according to embodiments of the present disclosure has a double routing structure.
Figure 19:
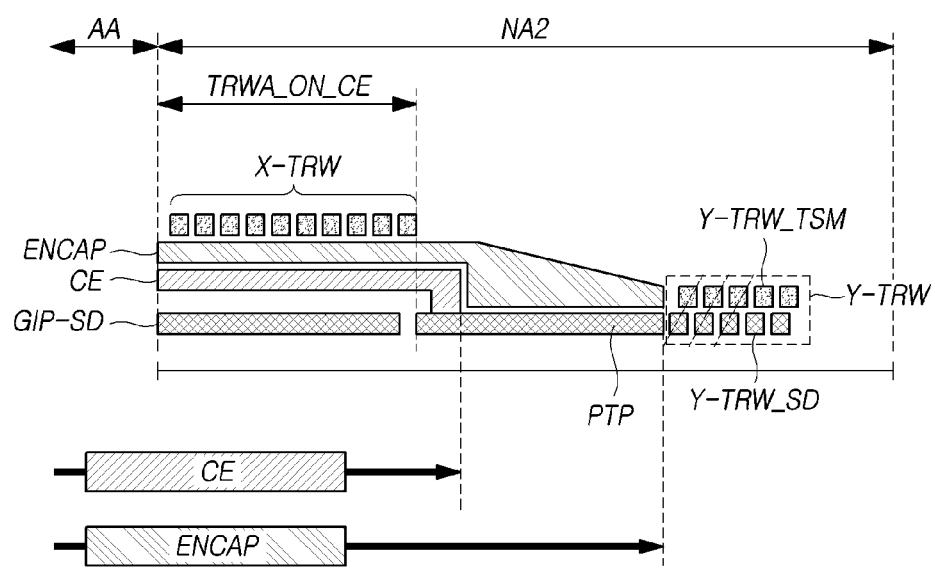
Figure 20:
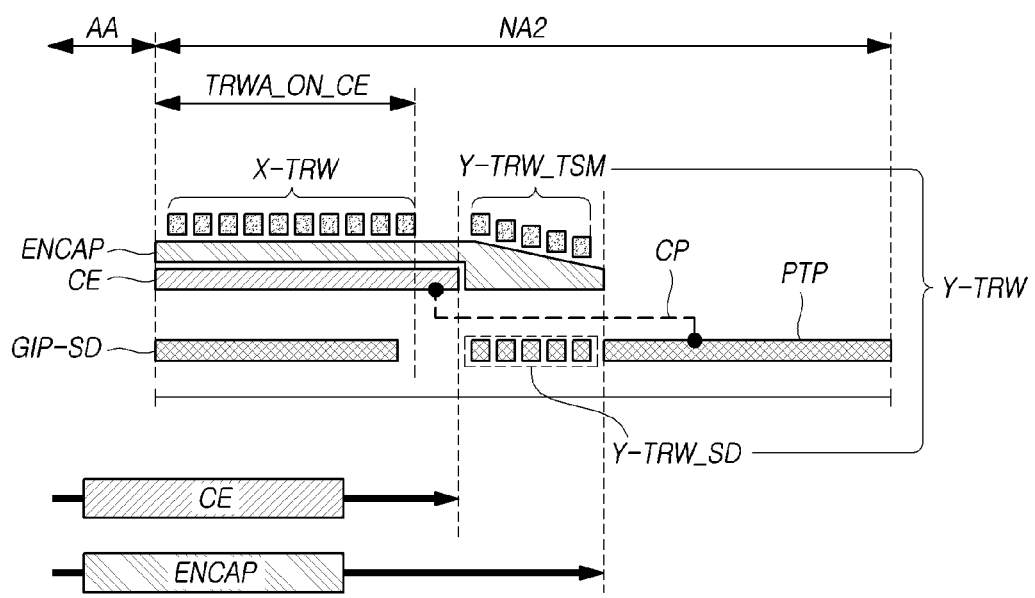
Figure 27:
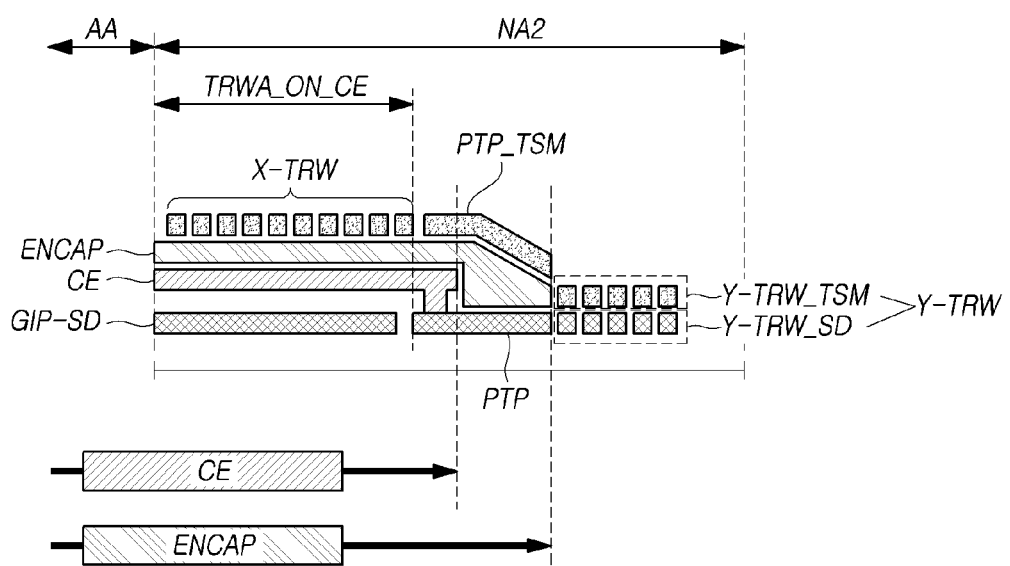

As an example of the position of the power transmission pattern PTP, the power transmission pattern PTP can be disposed between two or more second touch routing lines Y-TRW passing through the second non-display area NA2 and the gate driving circuit GDC, as shown in FIGS. 18, 19, and 27.

As another example of the position of the power transmission pattern PTP, the power transmission pattern PTP can be disposed further outward than two or more second touch routing lines Y-TRW passing through the second non-display area NA2, as shown in FIGS. 20 to 26.

Referring to FIGS. 18 and 19, two or more second touch routing lines Y-TRW passing through the second non-display area NA2 can be disposed without overlapping the common electrode CE extending from the display area AA to the second non-display area NA2.

Accordingly, the two or more second touch routing lines Y-TRW passing through the second non-display area NA2 do not form parasitic capacitance with the common electrode CE. When the two or more second touch routing lines Y-TRW passing through the second non-display area NA2 are receiving touch routing lines RX_TRW, the receiving side routing second parasitic capacitance Cp_RX_R is not formed between the receiving touch routing line RX_TRW and the common electrode CE. Accordingly, touch sensitivity can be improved.

Referring to FIG. 19, in the two or more second touch routing lines Y-TRW passing through the second non-display area NA2, the one or more second touch routing lines Y-TRW_TSM including the touch sensor metal and the one or more second touch routing lines Y-TRW_SD including the first metal can be disposed to be staggered on different layers.

Referring to FIG. 19, in the two or more second touch routing lines Y-TRW passing through the second non-display area NA2, a space between the two or more second touch routing lines Y-TRW_TSM including the touch sensor metal can overlap each of the two or more second touch routing lines Y-TRW_SD including the first metal.

The structure in which the one or more second touch routing lines Y-TRW_TSM including the touch sensor metal and the one or more second touch routing lines Y-TRW_SD including the first metal are disposed to be staggered on different layers can also be applied to all other cases in which two or more second touch routing lines Y-TRW passing through the second non-display area NA2 include one or more second touch routing lines Y-TRW_TSM including a touch sensor metal and one or more second touch routing lines Y-TRW_SD including a first metal different from the touch sensor metal.

Referring to FIGS. 20 to 26, the touch display device can further include a connection pattern CP electrically connecting the common electrode CE to the power transmission pattern PTP.

The connection pattern CP can be useful in the case that the power transmission pattern PTP is disposed further outward than the second touch routing line Y-TRW.

When the second touch routing lines Y-TRW are present between the common electrode CE and the power transmission pattern PTP, the connection pattern CP is disposed to overlap the second touch routing lines Y-TRW to electrically connect the common electrode CE to the power transmission pattern PTP.

The formation position or material type of the connection pattern CP can vary. The connection pattern CP can include at least one material (metal) among the same material as the common electrode CE, the same material as the pixel electrode PE in the display area AA, the same material (gate metal) as the gate electrodes of the transistors T1 and T2 in the display area AA, and the same material as the source and drain electrodes of the transistors T1 and T2 in the display area AA (source-drain metal), and can include one or more materials (metals) different from the first metal. Such content is applicable to the connection pattern CP in FIGS. 34 to 40 and the like.

Figure 21:
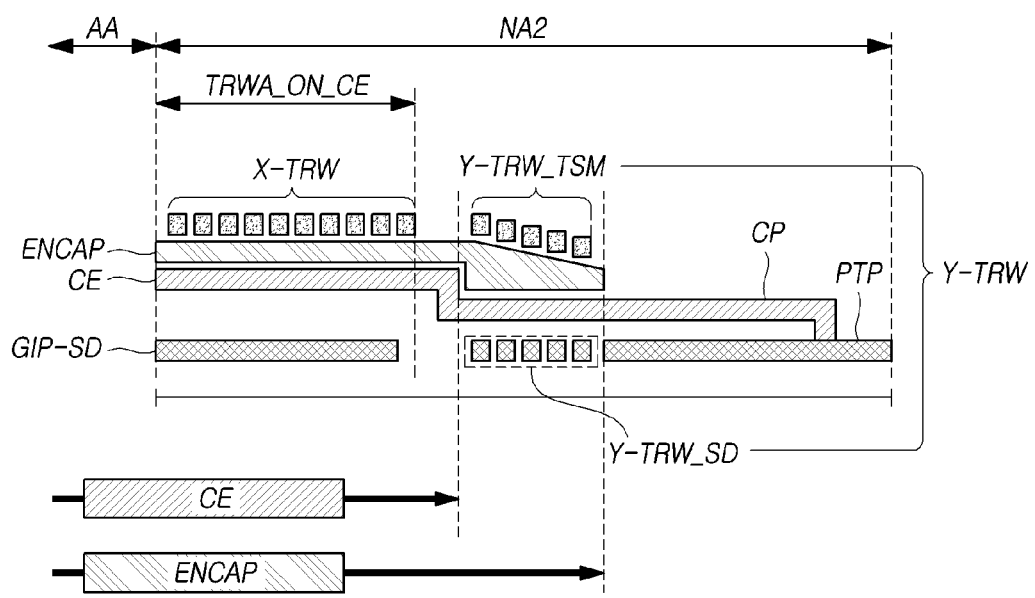
Figure 22:
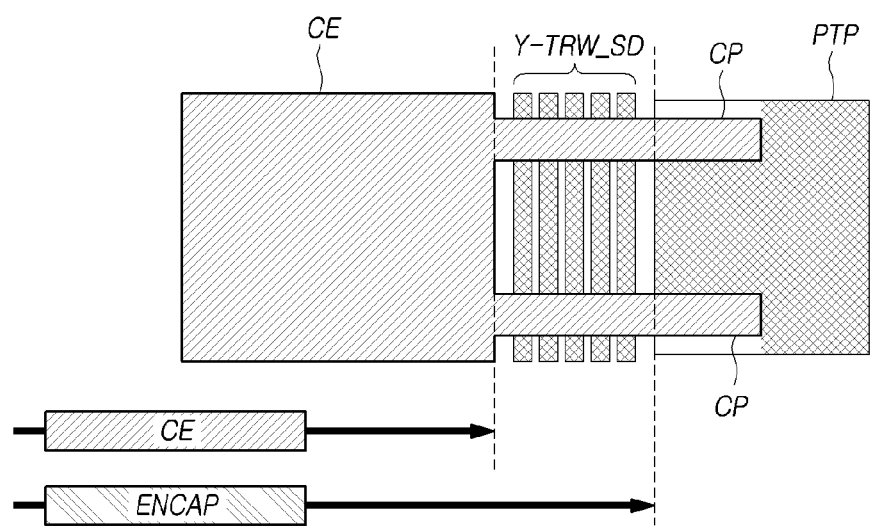
Figure 23:
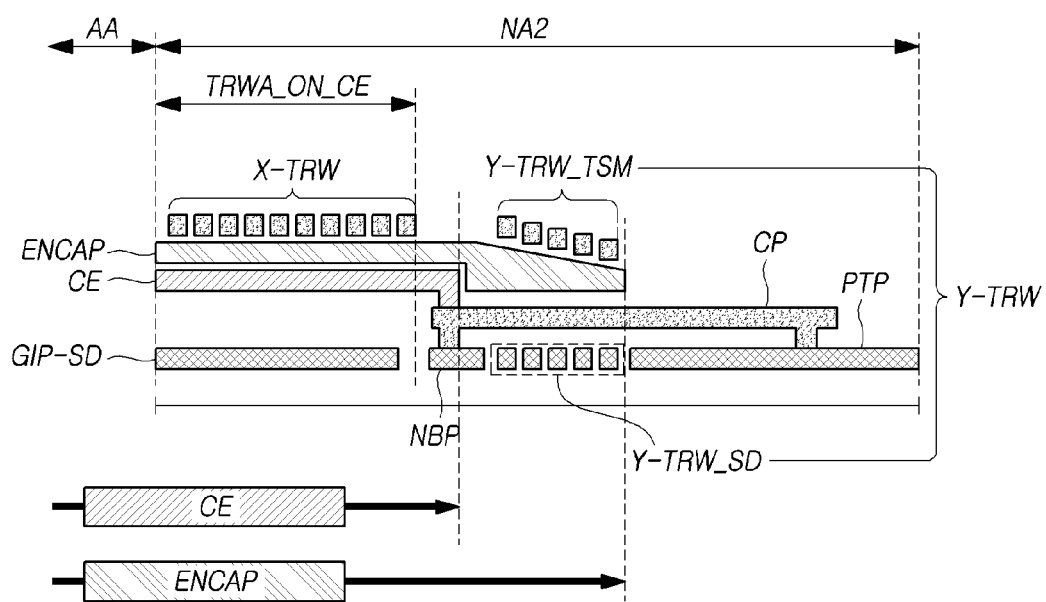
Figure 24:
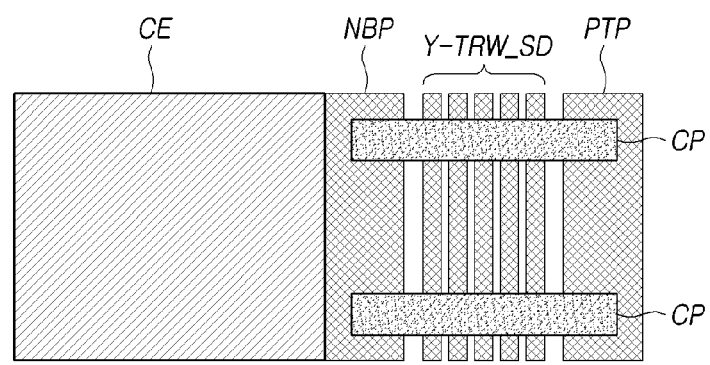
Figure 25:
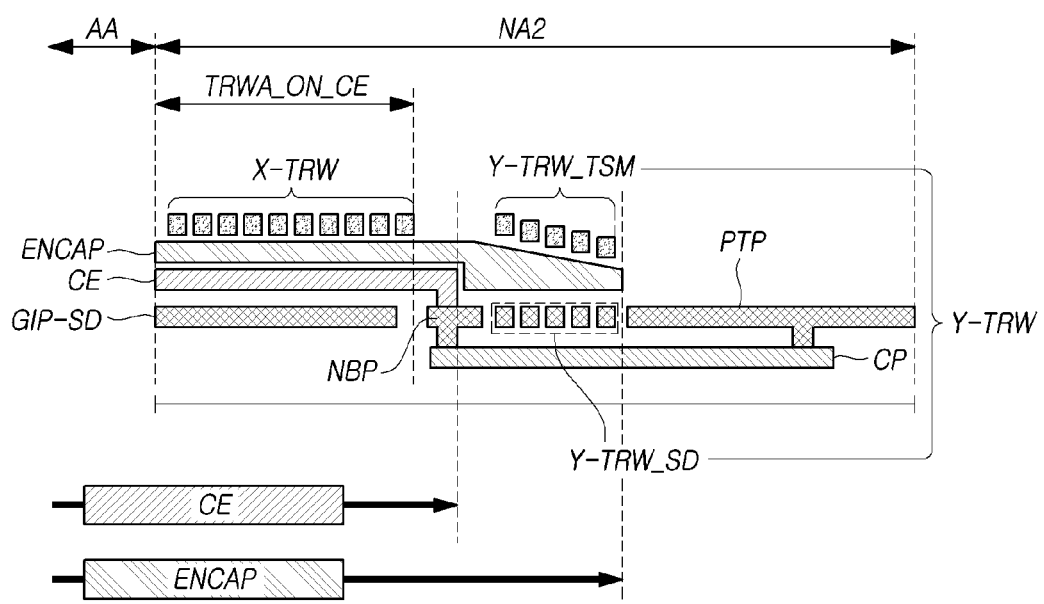
Figure 26:
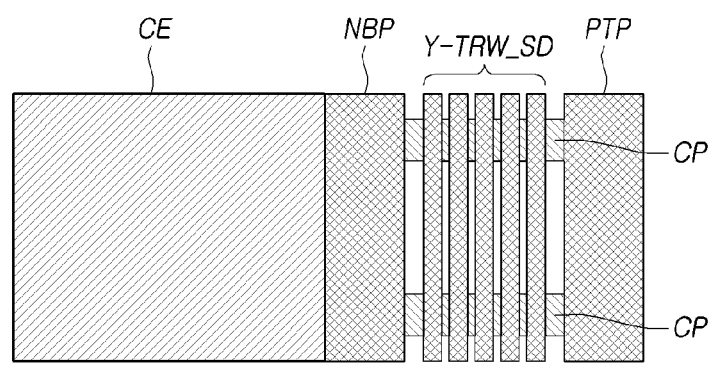

For example, as shown in FIG. 21 and FIG. 22 (a plan view of a portion of FIG. 21), the connection pattern CP can be made of the same material as the common electrode CE. For another example, as shown in FIG. 23 and FIG. 24 (a plan view of a portion of FIG. 23), the connection pattern CP can be made of the same material as the pixel electrode PE. For still another example, as shown in FIG. 25 and FIG. 26 (a plan view of a portion of FIG. 25), the connection pattern CP can be made of the same material as the gate electrode.

Referring to FIGS. 21 and 22, when the connection pattern CP is made of the same material as the common electrode CE, the connection pattern CP can be a portion protruding from the common electrode CE extending from the display area AA to the second non-display area NA2.

Referring to FIGS. 21 and 22, the connection pattern CP can overlap the encapsulation layer ENCAP. A portion of the connection pattern CP can be connected to the common electrode CE and can overlap the inclined surface of the encapsulation layer ENCAP, and another portion of the connection pattern CP can be connected to the power transmission pattern PTP disposed further outward than the second touch routing line Y-TRW and can overlap the power transmission pattern PTP.

Referring to FIGS. 21 and 22, two or more second touch routing lines Y-TRW passing through the second non-display area NA2 can be disposed to overlap the connection pattern CP. The second touch routing line Y-TRW_TSM, which includes the touch sensor metal, among the two or more second touch routing lines Y-TRW passing through the second non-display area NA2 overlaps the connection pattern CP above the connection pattern CP. The second touch routing line Y-TRW_SD, which includes the first metal, among the two or more second touch routing lines Y-TRW passing through the second non-display area NA2 overlaps the connection pattern CP under the connection pattern CP.

Referring to FIGS. 23 and 24, when the connection pattern CP includes the same material as the pixel electrode PE in the display area AA, the connection pattern CP can overlap the encapsulation layer ENCAP. A portion of the connection pattern CP can be connected to the common electrode CE and can overlap the inclined surface of the encapsulation layer ENCAP, and another portion of the connection pattern CP can be connected to the power transmission pattern PTP disposed further outward than the second touch routing line Y-TRW and can overlap the power transmission pattern PTP.

Referring to FIGS. 23 and 24, two or more second touch routing lines Y-TRW passing through the second non-display area NA2 can be disposed to overlap the connection pattern CP. The second touch routing line Y-TRW_TSM, which includes the touch sensor metal, among the two or more second touch routing lines Y-TRW passing through the second non-display area NA2 can overlap the connection pattern CP above the connection pattern CP. The second touch routing line Y-TRW_SD, which includes the first metal, among the two or more second touch routing lines Y-TRW passing through the second non-display area NA2 can overlap the connection pattern CP under the connection pattern CP.

Referring to FIGS. 25 and 26, when the connection pattern CP includes the same material as the gate electrodes of the transistors T1 and T2 in the display area AA, the connection pattern CP can overlap the encapsulation layer ENCAP. A portion of the connection pattern CP can be connected to the common electrode CE and can overlap the inclined surface of the encapsulation layer ENCAP, and another portion of the connection pattern CP can be connected to the power transmission pattern PTP, which is disposed further outward than the second touch routing line Y-TRW, and can overlap the power transmission pattern PTP.

Referring to FIGS. 25 and 26, two or more second touch routing lines Y-TRW passing through the second non-display area NA2 can be disposed to overlap the connection pattern CP. The second touch routing line Y-TRW_TSM, which includes the touch sensor metal, among the two or more second touch routing lines Y-TRW passing through the second non-display area NA2 can overlap the connection pattern CP above the connection pattern CP. The second touch routing line Y-TRW_SD, which includes the first metal, among the two or more second touch routing lines Y-TRW passing through the second non-display area NA2 can overlap the connection pattern CP above the connection pattern CP.

Referring to FIGS. 23 to 26, the touch display device can further include a noise-blocking pattern NBP disposed between two or more second touch routing lines Y-TRW passing through the second non-display area NA2 and the gate driving circuit GDC, and having the common voltage VSS applied thereto.

As the noise-blocking pattern NBP is formed, unnecessary parasitic capacitance can be prevented from being formed between the second touch routing line Y-TRW and the gate driving circuit GDC. The noise-blocking pattern NBP can prevent the second touch routing line Y-TRW from being affected by the gate driving circuit GDC.

Referring to FIGS. 20 to 26, at least one of the two or more second touch routing lines Y-TRW passing through the second non-display area NA2 can overlap the inclined surface of the encapsulation layer ENCAP in the second non-display area NA2.

Referring to FIG. 27, two or more second touch routing lines Y-TRW passing through the second non-display area NA2 can be disposed without overlapping the common electrode CE extending from the display area AA to the second non-display area NA2.

Accordingly, the two or more second touch routing lines Y-TRW passing through the second non-display area NA2 do not form parasitic capacitance with the common electrode CE. When the two or more second touch routing lines Y-TRW passing through the second non-display area NA2 are receiving touch routing lines RX_TRW, the receiving side routing second parasitic capacitance Cp_RX_R is not formed between the receiving touch routing lines RX_TRW and the common electrode CE. Accordingly, touch sensitivity can be improved.

Referring to FIG. 27, in order to transmit the common voltage VSS to the common electrode CE, the touch display device can further include an additional power transmission pattern PTP_TSM different from the power transmission pattern PTP.

Referring to FIG. 27, the power transmission pattern PTP can be disposed in the second non-display area NA2 and can include a first metal (e.g., a source-drain metal) different from the touch sensor metal. In contrast, the additional power transmission pattern PTP_TSM can be disposed in the second non-display area NA2 and can include the touch sensor metal.

Referring to FIG. 27, the touch display device is further provided with the additional power transmission pattern PTP_TSM to transmit the common voltage VSS to the common electrode CE, so that the width of the power transmission pattern PTP can be reduced.

Referring to FIG. 27, since the additional power transmission pattern PTP_TSM includes the touch sensor metal, the additional power transmission pattern PTP_TSM can be formed together with the first touch routing line X-TRW made of the touch sensor metal and the second touch routing line Y-TRW_TSM made of the touch sensor metal. Further, the additional power transmission pattern PTP_TSM can also be formed together with the first and second touch electrode lines X-TEL and Y-TEL.

Referring to FIG. 27, the additional power transmission pattern PTP_TSM can be disposed on the encapsulation layer ENCAP, and in some cases, all or some of the additional power transmission pattern PTP_TSM can overlap the inclined surface of the encapsulation layer ENCAP.

Figure 28:
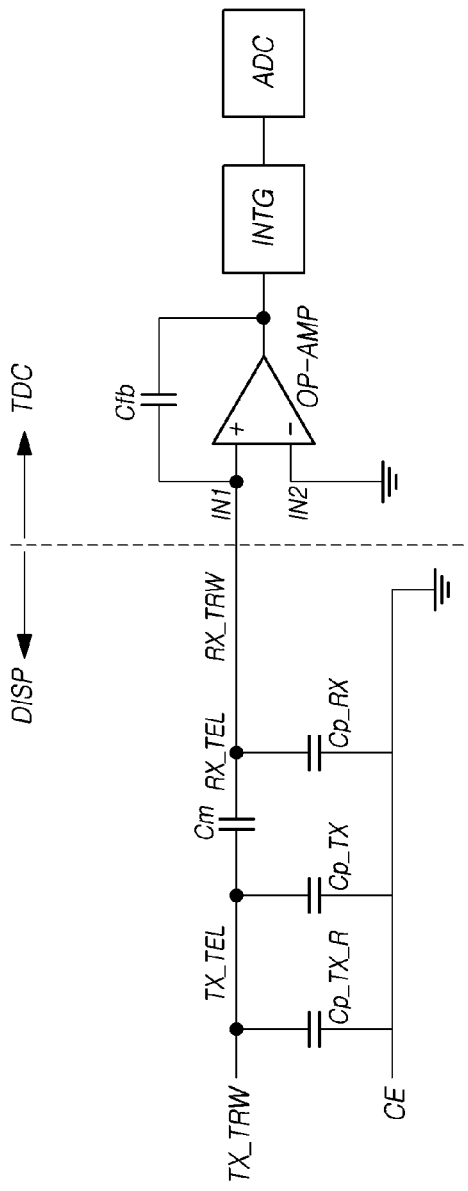
FIG. 28 is an equivalent circuit of a sensing system according to the arrangement structures of FIGS. 18 to 27.

FIG. 28 is an equivalent circuit of a sensing system according to the arrangement structures of FIGS. 18 to 27.

Referring to FIG. 28, the second touch routing lines Y-TRW do not overlap the common electrode CE according to the arrangement structures of FIGS. 18 to 27. Accordingly, parasitic capacitance is not formed between the second touch routing lines Y-TRW and the common electrode CE. When the second touch routing lines Y-TRW are receiving touch routing lines RX_TRW, the parasitic capacitance Cp_RX_R is not formed between the receiving touch routing lines RX_TRW and the common electrode CE in the non-display area NA (compare with FIG. 17). Accordingly, touch sensitivity can be improved.

Figure 29:
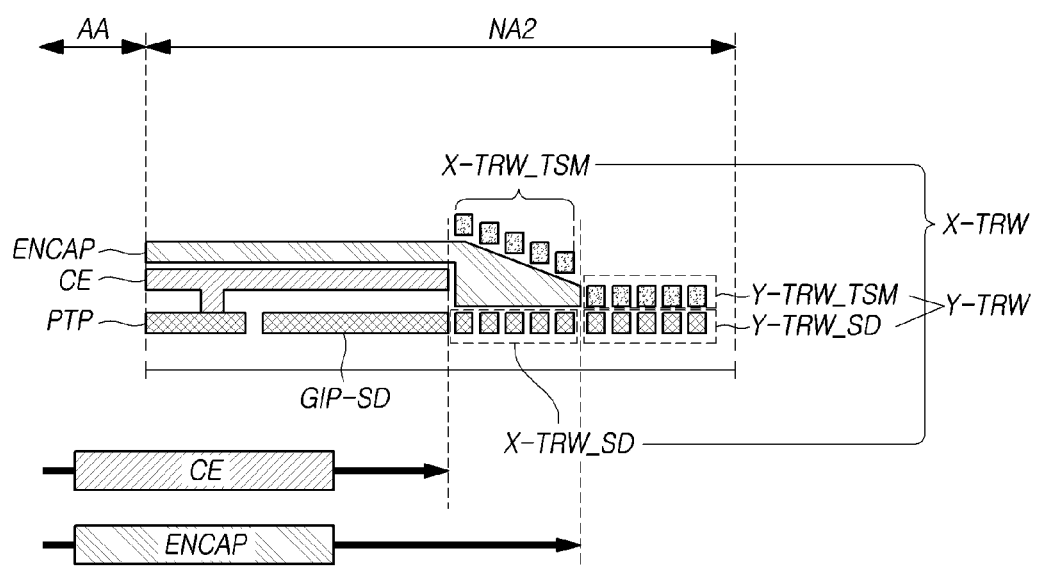
FIGS. 29 to 31 are views illustrating arrangement structures that do not allow the first touch routing lines and the second touch routing lines to overlap the common electrode in the second non-display area of the display panel in order to implement a narrow bezel in the case that the touch display device according to embodiments of the present disclosure has a double routing structure.
Figure 30:
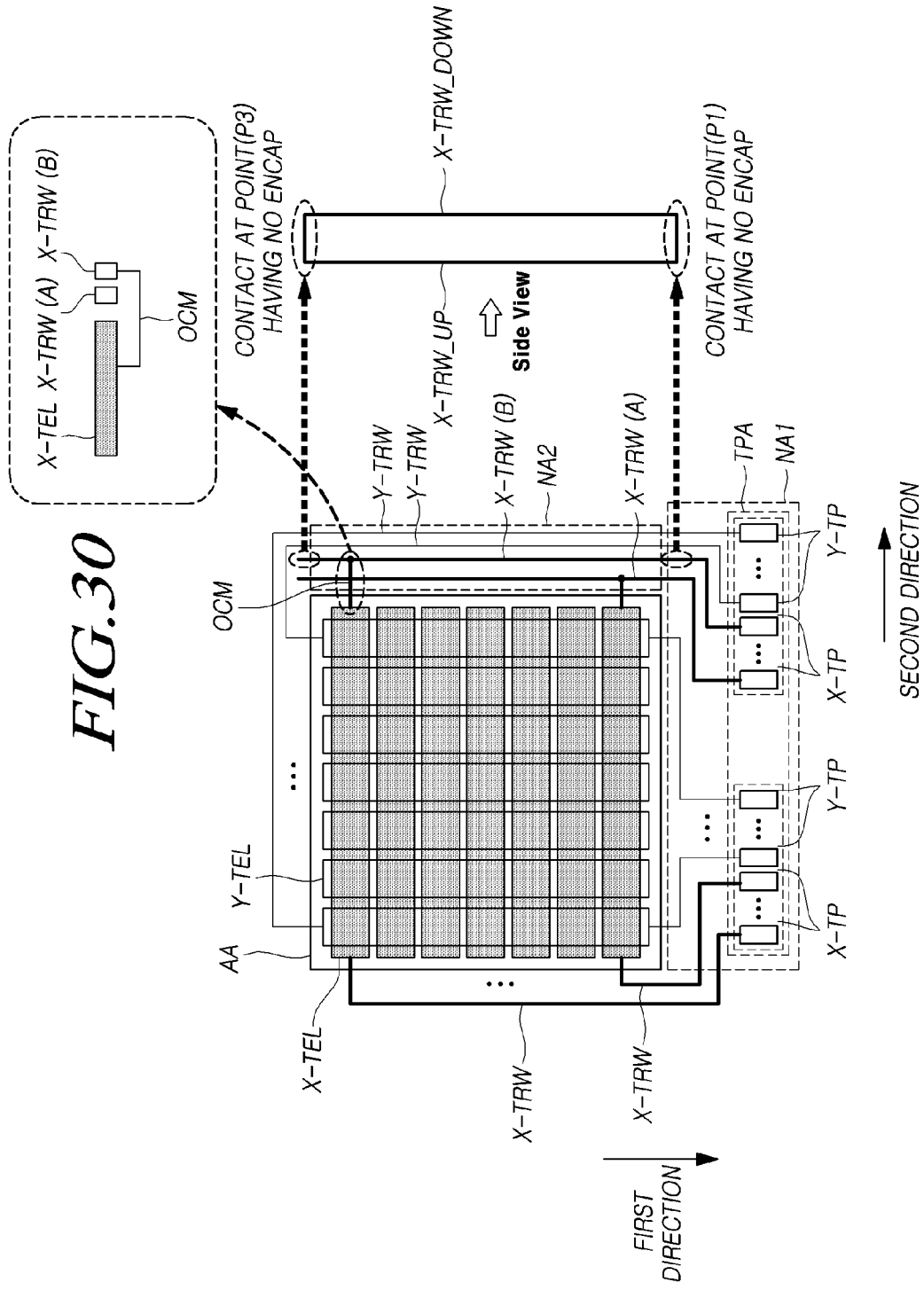
Figure 31:
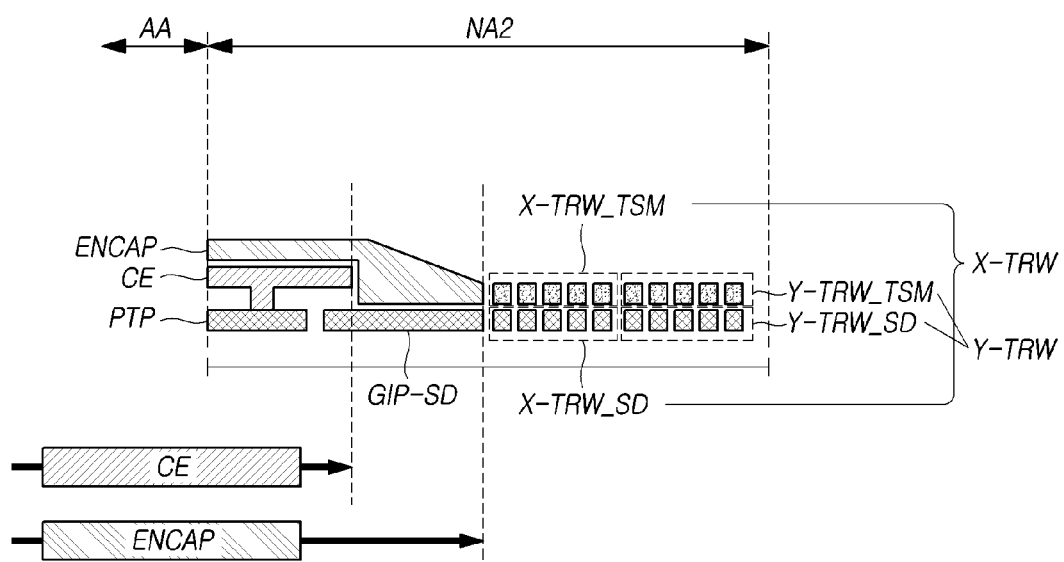

FIGS. 29 to 31 are views illustrating arrangement structures that do not allow the first touch routing lines X-TRW and the second touch routing lines Y-TRW to overlap the common electrode CE in the second non-display area NA2 of the display panel DISP in order to implement a narrow bezel in the case that the touch display device according to the embodiments of the present disclosure has a double routing structure. Reference is also made to the double routing structure of FIG. 4.

In the case of the arrangement structures of FIGS. 29 to 31, unlike the arrangement structures of FIGS. 18 to 27, all of the first touch routing lines X-TRW and the second touch routing lines Y-TRW do not overlap the common electrode CE. Accordingly, the narrow bezel can be easily implemented, and parasitic capacitance can be prevented from being formed between the common electrode CE and the touch routing lines X-TRW and Y-TRW to improve touch sensitivity. This will be described in more detail below.

As described above, the touch sensor of the touch display device can include n first touch electrode lines X-TEL and m second touch electrode lines Y-TEL disposed on the encapsulation layer ENCAP in the display area AA. The n first touch electrode lines X-TEL and the m second touch electrode lines Y-TEL can each include one or more touch sensor metals.

When designed with a double routing structure, the touch pad part TPA can include 2n first touch pads X-TP and 2m second touch pads Y-TP disposed in a first non-display area NA1, which is located at an outer periphery of the display area AA in a first direction, among non-display areas NA that are outer areas of the display area AA.

When designed with a double routing structure, the touch display device can include 2n first touch routing lines X-TRW coming downward along the inclined surface of the encapsulation layer ENCAP and electrically connecting one end and the other end of each of the n first touch electrode lines X-TEL to each of the 2n first touch pads X-TP disposed in the first non-display area NA1.

When designed with a double routing structure, the touch display device can further include 2m second touch routing lines Y-TRW coming downward along the inclined surface of the encapsulation layer ENCAP and electrically connecting one end and the other end of each of the m second touch electrode lines Y-TEL to each of the 2m second touch pads Y-TP disposed in the first non-display area NA1.

When designed with a double routing structure, two or more first touch routing lines X-TRW of the 2n first touch routing lines X-TRW and two or more second touch routing lines Y-TRW of the 2m second touch routing lines Y-TRW can pass through a second non-display area NA2 located at an outer periphery of the display area AA in a second direction.

Referring to FIGS. 29 to 31, the two or more first touch routing lines X-TRW passing through the second non-display area NA2 can include one or more first touch routing lines X-TRW_TSM including a touch sensor metal, and one or more first touch routing lines X-TRW_SD including a first metal different from the touch sensor metal.

As described above, since the two or more first touch routing lines X-TRW disposed in the second non-display area NA2 are divided and disposed in two or more layers (for example, three layers, four layers, or the like) instead of being disposed side by side on one layer, the size of the bezel area occupied by the two or more first touch routing lines X-TRW in the second non-display area NA2 can be reduced.

Referring to FIGS. 29 to 31, the two or more second touch routing lines Y-TRW passing through the second non-display area NA2 can include one or more second touch routing lines Y-TRW_TSM including the touch sensor metal, and one or more second touch routing lines Y-TRW_SD including the first metal.

As described above, since the two or more second touch routing lines Y-TRW disposed in the second non-display area NA2 are divided and disposed in two or more layers (for example, three layers, four layers, or the like) instead of being disposed side by side on one layer, the size of the bezel area occupied by the two or more second touch routing lines Y-TRW in the second non-display area NA2 can be reduced.

Referring to FIGS. 29 to 31, for example, the first metal can be a metal different from the touch sensor metal included in the touch sensor and can include one or more metals. For example, the first metal can include one or more among a source-drain metal included in the source and drain electrodes of the transistors (T1, T2, and the like) disposed in the display area AA or the data line DL in the display area AA, and a gate metal included in the gate electrodes of the transistors (T1, T2, and the like) or the gate line GL in the display area AA.

As described above, when the first metal includes the source-drain metal or the gate metal, the one or more first touch routing lines X-TRW_SD including the first metal and the one or more second touch routing lines Y-TRW_SD including the first metal can be disposed in one layer. Alternatively, the first metal can include both the source-drain metal and the gate metal. In this case, the one or more first touch routing lines X-TRW_SD including the first metal are divided and disposed in two layers, and the one or more second touch routing lines Y-TRW_SD including the first metal can be divided and disposed in two layers.

The touch sensor metal can include one or more of an electrode metal and a bridge metal. When the first touch routing line X-TRW_TSM and the second touch routing line Y-TRW_TSM include one touch sensor metal among the electrode metal and the bridge metal, the one or more first touch routing lines X-TRW_TSM including the touch sensor metal and the one or more second touch routing lines Y-TRW_TSM including the touch sensor metal can be disposed in one layer. Alternatively, when the first touch routing line X-TRW_TSM includes both touch sensor metals (the electrode metal and the bridge metal), the one or more first touch routing lines X-TRW_TSM including the touch sensor metal can be divided and disposed in two layers. In addition, when the second touch routing line Y-TRW_TSM includes both touch sensor metals (the electrode metal and the bridge metal), the one or more second touch routing lines Y-TRW_TSM including the touch sensor metal can be divided and disposed in two layers.

Referring to FIGS. 29 to 31, in the two or more first touch routing lines X-TRW passing through the second non-display area NA2, the one or more first touch routing lines X-TRW_TSM including the touch sensor metal and the one or more first touch routing lines X-TRW_SD including the first metal can be disposed to overlap each other in two different layers. In the two or more second touch routing lines Y-TRW passing through the second non-display area NA2, the one or more second touch routing lines Y-TRW_TSM including the touch sensor metal and the one or more second touch routing lines Y-TRW_SD including the first metal can be disposed to overlap each other on different layers.

Referring to FIGS. 29 to 31, in the two or more first touch routing lines X-TRW passing through the second non-display area NA2, the one or more first touch routing lines X-TRW_TSM including the touch sensor metal and the one or more first touch routing lines X-TRW_SD including the first metal can be disposed to be staggered on two different layers. In the two or more second touch routing lines Y-TRW passing through the second non-display area NA2, the one or more second touch routing lines Y-TRW_TSM including the touch sensor metal and the one or more second touch routing lines Y-TRW_SD including the first metal can be disposed to be staggered on different layers.

Referring to FIGS. 29 to 31, the touch display device can further include a GIP-type gate driving circuit GDC that is electrically connected to a plurality of gate lines GL disposed in the display area AA, is disposed in the second non-display area NA2, and includes transistors including a first metal.

Referring to FIGS. 29 to 31, the touch display device can further include a power transmission pattern PTP disposed in the second non-display area NA2 and configured to transmit the common voltage VSS to the common electrode CE. The power transmission pattern PTP can include the first metal different from the touch sensor metal.

Referring to FIGS. 29 to 31, the power transmission pattern PTP can be disposed to be closer to the display area AA than the gate driving circuit GDC.

Referring to FIG. 29, the common electrode CE extending from the display area AA to the second non-display area NA2 can overlap the gate driving circuit GDC.

Referring to FIG. 31, the common electrode CE extending from the display area AA to the second non-display area NA2 may not completely overlap the gate driving circuit GDC and can be open so that the gate driving circuit GDC is exposed.

Referring to FIGS. 29 and 31, the two or more first touch routing lines X-TRW passing through the second non-display area NA2 can be disposed without overlapping the common electrode CE extending from the display area AA to the second non-display area NA2. The two or more second touch routing lines Y-TRW passing through the second non-display area NA2 can be disposed without overlapping the common electrode CE extending from the display area AA to the second non-display area NA2.

Accordingly, parasitic capacitance between the first touch routing line X-TRW and the common electrode CE may not be formed, and parasitic capacitance between the second touch routing line Y-TRW and the common electrode CE may not be formed.

Referring to FIGS. 29 to 31, the two or more second touch routing lines Y-TRW passing through the second non-display area NA2 can be disposed further outward than the two or more first touch routing lines X-TRW passing through the second non-display area NA2.

Referring to FIGS. 29 and 30, one or more first touch routing lines X-TRW_TSM, which include the touch sensor metal, among the two or more first touch routing lines X-TRW passing through the second non-display area NA2 can be disposed on the encapsulation layer ENCAP.

In contrast, one or more first touch routing lines X-TRW_SD, which include the first metal, among the two or more first touch routing lines X-TRW passing through the second non-display area NA2 can be disposed below the encapsulation layer ENCAP.

Referring to FIGS. 29 and 30, all or some of the one or more first touch routing lines X-TRW_TSM, which include the touch sensor metal, among the two or more first touch routing lines X-TRW passing through the second non-display area NA2 can overlap the inclined surface of the encapsulation layer ENCAP in the second non-display area NA2.

Referring to FIG. 30, each of the two or more first touch routing lines X-TRW passing through the second non-display area NA2 can include an upper line X-TRW_UP including the touch sensor metal and a lower line X-TRW_DOWN including the first metal.

Referring to FIG. 30, one end of the upper line X-TRW_UP can be in contact with one end of the lower line X-TRW_DOWN at a first point P1 located at an outer periphery of the encapsulation layer ENCAP in the first direction.

The other end of the upper line X-TRW_UP can be in contact with the other end of the lower line X-TRW_DOWN at a third point P3 located at an outer periphery of the encapsulation layer ENCAP in a direction opposite to the first direction. The first point P1 and the third point P3 are points having no encapsulation layer ENCAP and points further outward than a point at which the encapsulation layer ENCAP ends.

Referring to FIG. 30, one first touch routing line X-TRW (B) among the two or more first touch routing lines X-TRW passing through the second non-display area NA2 can be connected to the corresponding first touch electrode line X-TEL through a metal OCM disposed above or below another first touch routing line X-TRW(A).

Figure 32:
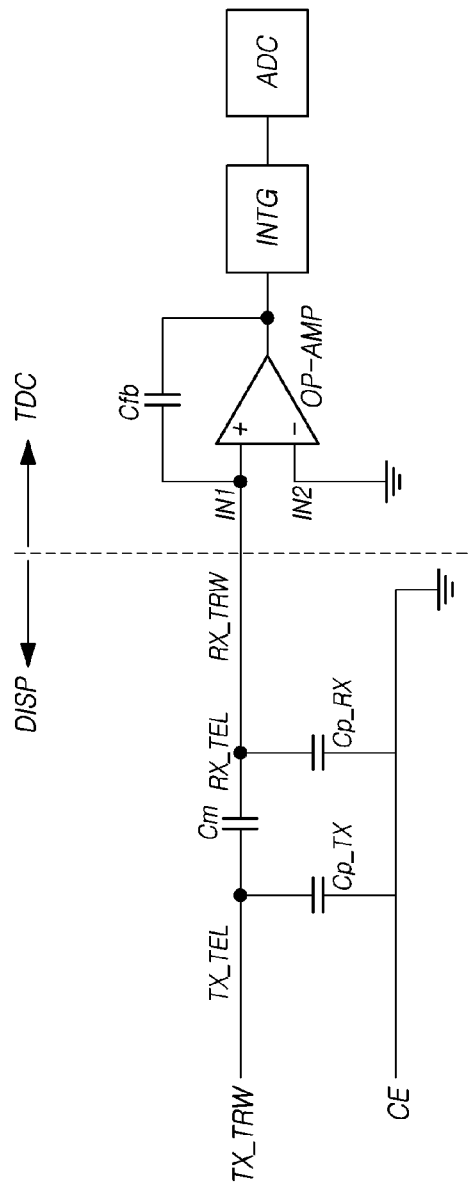
FIG. 32 is an equivalent circuit of the sensing system according to the arrangement structures of FIGS. 29 to 31.

FIG. 32 is an equivalent circuit of a sensing system according to the arrangement structures of FIGS. 29 to 31.

Referring to FIG. 32, the two or more first touch routing lines X-TRW and the two or more second touch routing lines Y-TRW passing through the second non-display area NA2 can be disposed without overlapping the common electrode CE according to the arrangement structures of FIGS. 29 to 31. Accordingly, the parasitic capacitance between the first touch routing line X-TRW and the common electrode CE may not be formed, and the parasitic capacitance between the second touch routing line Y-TRW and the common electrode CE may not be formed.

When the first touch routing lines X-TRW is a receiving touch routing line RX_TRW and the second touch routing line Y-TRW is a transmission touch routing line TX_TRW, in the non-display area NA, the parasitic capacitance Cp_RX_R between the receiving touch routing line RX_TRW and the common electrode CE and the parasitic capacitance Cp_TX_R between the transmission touch routing line TX_TRW and the common electrode CE are not formed (compare with FIG. 17). Accordingly, touch sensitivity can be improved.

FIGS. 33 to 40 are views illustrating arrangement structures that do not allow the first touch routing lines X-TRW and the second touch routing lines Y-TRW to overlap the common electrode CE in the second non-display area NA2 of the display panel DISP in order to implement a narrow bezel in the case that the touch display device according to the embodiments of the present disclosure has a single routing structure or a half-single routing structure. In the following, reference is made together to FIG. 5 illustrating the case of a single routing structure, FIG. 6 illustrating the case of a half-single routing structure, and FIG. 14 illustrating various non-display areas NA1, NA2, NA3, and NA4.

In the case of the arrangement structures shown in FIGS. 33 to 40, all the first touch routing lines X-TRW and the second touch routing lines Y-TRW do not overlap the common electrode CE. Accordingly, the narrow bezel can be easily implemented, and parasitic capacitance can be prevented from being formed between the common electrode CE and the touch routing lines X-TRW and Y-TRW to improve touch sensitivity. This will be described in more detail below.

The touch sensor of the touch display device can include n first touch electrode lines X-TEL and m second touch electrode lines Y-TEL disposed on the encapsulation layer ENCAP in a display area AA. Here, the n first touch electrode lines X-TEL and the m second touch electrode lines Y-TEL can each include one or more touch sensor metals.

When a touch pad part TPA of the touch display device has a single routing structure for the n first touch electrode lines X-TEL and the m second touch electrode lines Y-TEL, the touch pad part TPA can be disposed in a first non-display area NA1, which is located at an outer periphery of the display area AA in a first direction, among non-display areas NA that are outer areas of the display area AA and can include n first touch pads X-TP and m second touch pads Y-TP.

When the touch display device has a single routing structure for the n first touch electrode lines X-TEL, the touch display device can include n first touch routing lines X-TRW coming downward along the inclined surface of the encapsulation layer ENCAP and electrically connecting the n first touch electrode lines X-TEL to the n first touch pads X-TP disposed in the first non-display area NA1.

When the touch display device has a single routing structure for the m second touch electrode lines Y-TEL, the touch display device can include m second touch routing lines Y-TRW coming downward along the inclined surface of the encapsulation layer ENCAP and electrically connecting the m second touch electrode lines Y-TEL to the m second touch pads Y-TP disposed in the first non-display area NA1.

The n first touch routing lines X-TRW can pass through a third non-display area NA3 located at an outer periphery of the display area AA in a direction opposite to a second direction. The n first touch routing lines X-TRW passing through the third non-display area NA3 can include one or more first touch routing lines X-TRW including the touch sensor metal and one or more first touch routing lines X-TRW including the first metal different from the touch sensor metal.

The m second touch routing lines Y-TRW can pass through a second non-display area NA2 located at an outer periphery of the display area AA in the second direction. The m second touch routing lines Y-TRW passing through the second non-display area NA2 can include one or more second touch routing lines Y-TRW_TSM including the touch sensor metal and one or more second touch routing lines Y-TRW_SD including a first metal different from the touch sensor metal.

The first metal is a metal different from the touch sensor metal and can include one or more metals. For example, the first metal can include one or more among a source-drain metal included in the source and drain electrodes of the transistors (T1, T2, and the like) disposed in the display area AA or the data line DL in the display area AA, and a gate metal included in the gate electrodes of the transistors (T1, T2, and the like) or the gate line GL in the display area AA.

As described above, when the first metal includes the source-drain metal or the gate metal, the one or more second touch routing lines Y-TRW_SD including the first metal can be disposed in one layer. Alternatively, the first metal can include both the source-drain metal and the gate metal. In this case, the one or more second touch routing lines Y-TRW_SD including the first metal can be divided and disposed in two layers.

The touch sensor metal can include one or more of an electrode metal and a bridge metal. When the second touch routing line Y-TRW_TSM includes one touch sensor metal among the electrode metal and the bridge metal, the one or more second touch routing lines Y-TRW_TSM including the touch sensor metal can be disposed in one layer. Alternatively, when the second touch routing line Y-TRW_TSM includes both touch sensor metals (the electrode metal and the bridge metal), the one or more second touch routing lines Y-TRW_TSM including the touch sensor metal can be divided and disposed in two layers.

Referring to FIGS. 33 to 40, in the m second touch routing lines Y-TRW passing through the second non-display area NA2, the one or more second touch routing lines Y-TRW_TSM including the touch sensor metal and the one or more second touch routing lines Y-TRW_SD including the first metal can be disposed to overlap each other in two different layers. Similarly, in the n first touch routing lines X-TRW passing through the third non-display area NA3, one or more first touch routing lines X-TRW including the touch sensor metal and one or more first touch routing lines X-TRW including the first metal can be disposed to overlap each other on different layers.

Unlike such an overlapping structure, in the m second touch routing lines Y-TRW passing through the second non-display area NA2, the one or more second touch routing lines Y-TRW_TSM including the touch sensor metal and the one or more second touch routing lines Y-TRW_SD including the first metal can be disposed to be staggered on different layers. Similarly, in the n first touch routing lines X-TRW passing through the third non-display area NA3, the one or more first touch routing lines X-TRW including the touch sensor metal and the one or more first touch routing lines X-TRW including the first metal can be disposed to be staggered on different layers.

Referring to FIGS. 33 to 40, the touch display device can further include a GIP-type gate driving circuit GDC that is electrically connected to a plurality of gate lines GL disposed in the display area AA, is disposed in the second non-display area NA2, and overlaps the common electrode CE extending from the display area AA to the second non-display area NA2.

Referring to FIGS. 33 to 40, the gate driving circuit GDC can include transistors (e.g., a pull-up transistor, a pull-down transistor, and the like) including a metal GIP-SD that is the same as the first metal. Here, the first metal is a metal included in the one or more second touch routing lines Y-TRW_SD passing through the second non-display area NA2.

Referring to FIGS. 33 to 40, the touch display device can further include a power transmission pattern PTP disposed in the second non-display area NA2 and configured to transmit the common voltage VSS to the common electrode CE.

Referring to FIGS. 33 to 40, the power transmission pattern PTP can include a first metal different from the touch sensor metal.

Figure 33:
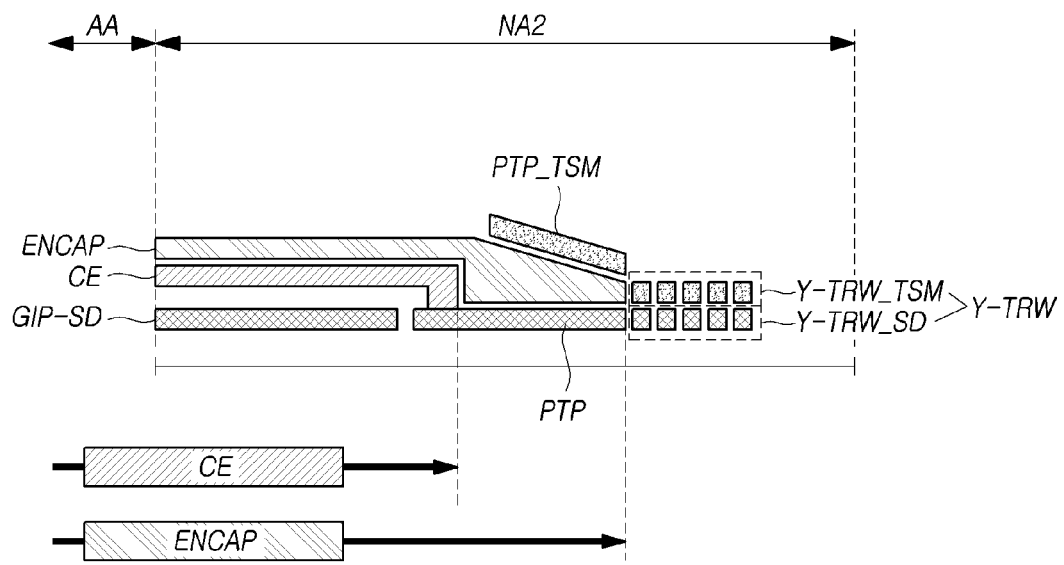
FIGS. 33 to 40 are views illustrating arrangement structures that do not allow the first touch routing lines and the second touch routing lines to overlap the common electrode in the second non-display area of the display panel in order to implement a narrow bezel in the case that the touch display device according to embodiments of the present disclosure has a single routing structure or a half-single routing structure.
Figure 34:
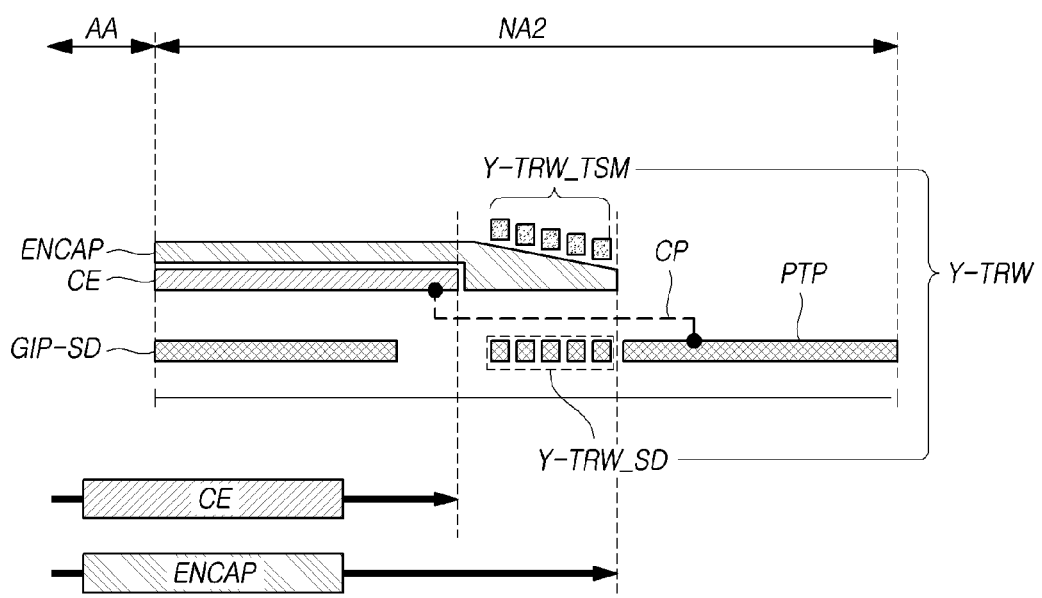

Referring to FIG. 33, the power transmission pattern PTP can be disposed between the m second touch routing lines Y-TRW passing through the second non-display area NA2 and the gate driving circuit GDC and can overlap a portion of the encapsulation layer ENCAP.

Referring to FIG. 33, the m second touch routing lines Y-TRW passing through the second non-display area NA2 can be disposed without overlapping the common electrode CE extending from the display area AA to the second non-display area NA2.

Referring to FIGS. 34 to 40, the power transmission pattern PTP can be disposed further outward than the M second touch routing lines Y-TRW passing through the second non-display area NA2. In this case, the touch display device can further include a connection pattern CP electrically connecting the power transmission pattern PTP to the common electrode CE.

Referring to FIGS. 34 to 40, the connection pattern CP can be useful when the power transmission pattern PTP is disposed further outward than the second touch routing line Y-TRW.

The m second touch routing lines Y-TRW are present between the power transmission pattern PTP and the common electrode CE. Accordingly, the connection pattern CP is disposed to overlap the M second touch routing lines Y-TRW. One end of the connection pattern CP is electrically connected to the common electrode CE, and the other end of the connection pattern CP is electrically connected to the power transmission pattern PTP.

Referring to FIGS. 34 to 40, the one or more second touch routing lines Y-TRW_TSM, which include the touch sensor metal, among the m second touch routing lines Y-TRW passing through the second non-display area NA2 can be disposed on the encapsulation layer ENCAP.

Referring to FIGS. 34 to 40, the one or more second touch routing lines Y-TRW_SD, which include the first metal, among the m second touch routing lines Y-TRW passing through the second non-display area NA2 can be disposed under the encapsulation layer ENCAP.

Referring to FIGS. 34 to 40, all or some of the one or more second touch routing lines Y-TRW_TSM, which include the touch sensor metal, among the m second touch routing lines Y-TRW passing through the second non-display area NA2 can overlap the inclined surface of the encapsulation layer ENCAP in the second non-display area NA2.

Referring to FIGS. 34 to 40, the m second touch routing lines Y-TRW passing through the second non-display area NA2 can be disposed without overlapping the common electrode CE extending from the display area AA to the second non-display area NA2.

The formation location or material type of the above-described connection pattern CP can vary. The connection pattern CP can include at least one material (metal) among the same material as the common electrode CE, the same material as the pixel electrode PE in the display area AA, the same material (gate metal) as the gate electrodes of the transistors T1 and T2 in the display area AA, and the same material as the source and drain electrodes of the transistors T1 and T2 in the display area AA (source-drain metal), and can include one or more materials (metals) different from the first metal.

Figure 35:
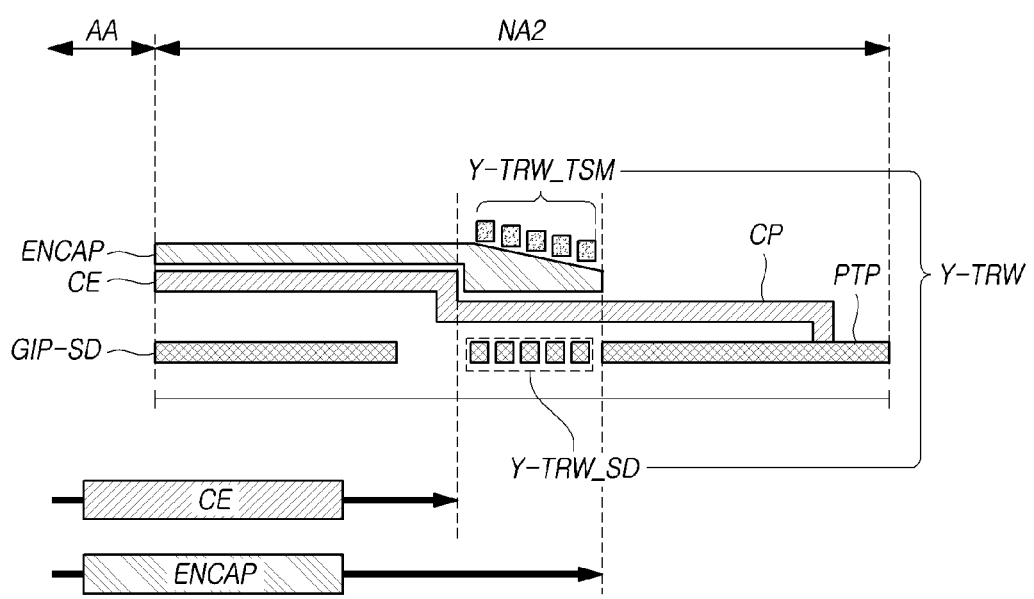
Figure 36:
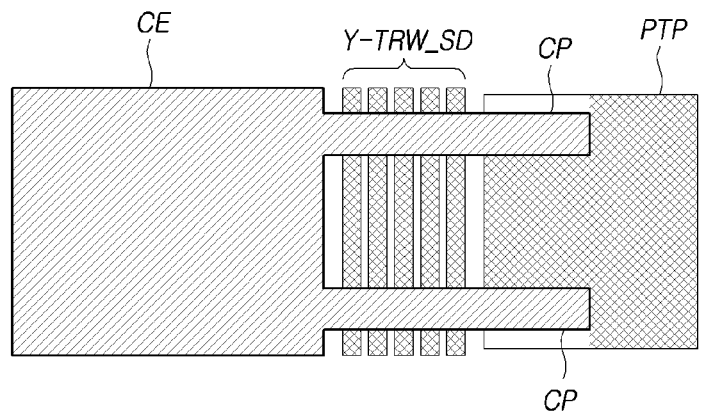
Figure 37:
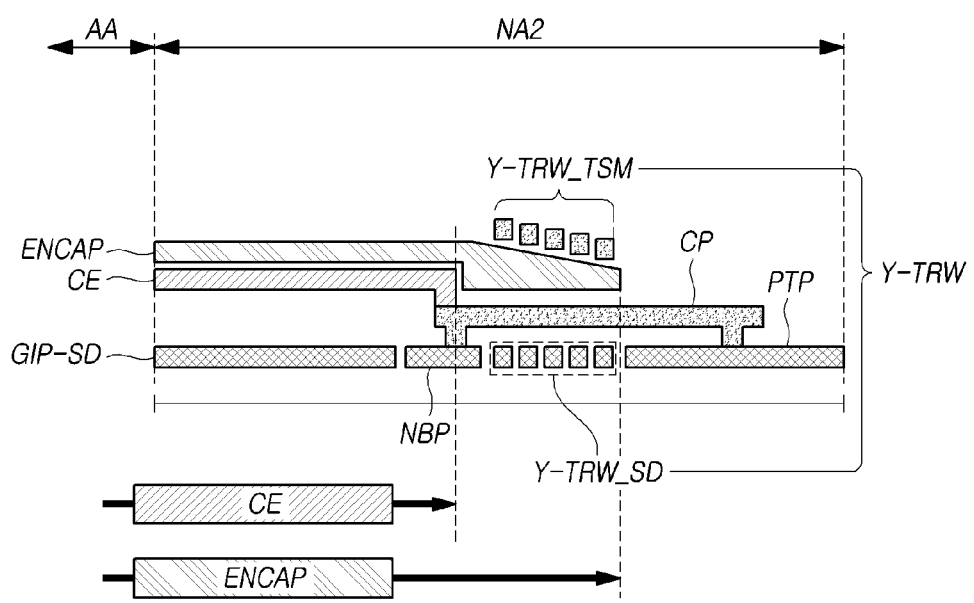
Figure 38:
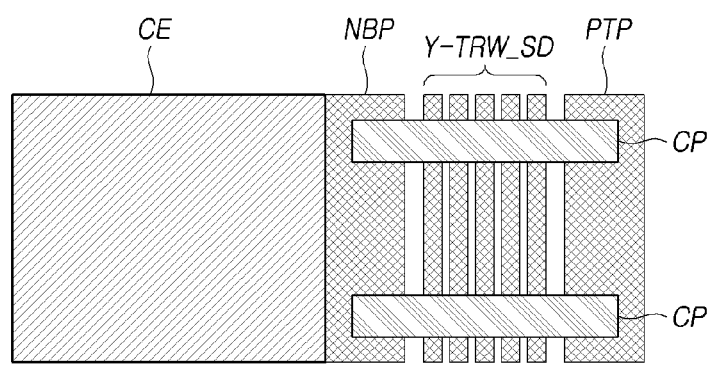

For example, as shown in FIG. 35 and FIG. 36 (a plan view of a portion of FIG. 36), the connection pattern CP can be made of the same material as the common electrode CE. For another example, as shown in FIG. 37 and FIG. 38 (a plan view of a portion of FIG. 37), the connection pattern CP can be made of the same material as the pixel electrode PE.

Figure 39:
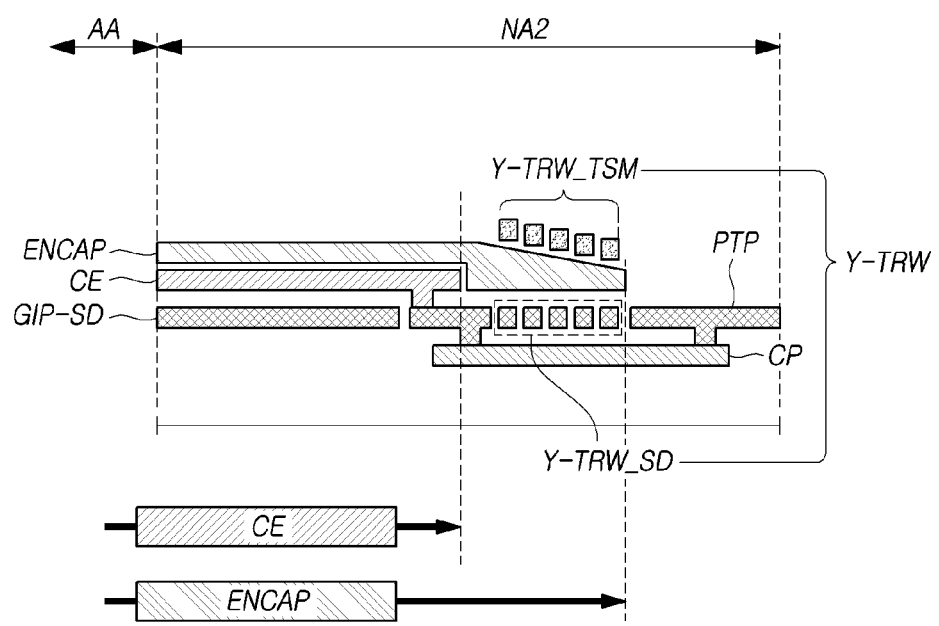
Figure 40:
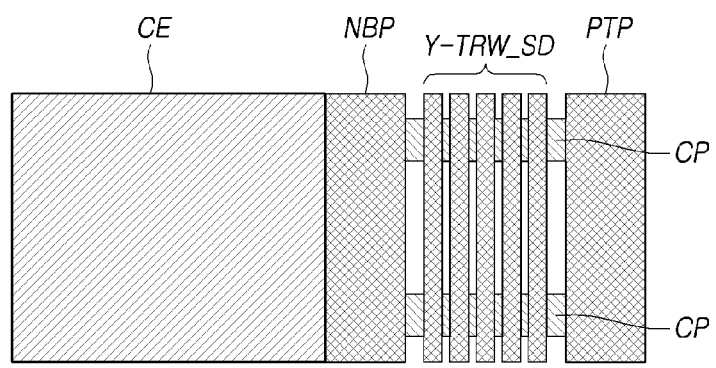

For still another example, as shown in FIG. 39 and FIG. 40 (a plan view of a portion of FIG. 39), the connection pattern CP can be made of the same material as the gate electrode.

Referring to FIGS. 35 and 36, the connection pattern CP can be a portion protruding from the common electrode CE extending from the display area AA to the second non-display area NA2.

Referring to FIGS. 35 and 36, the m second touch routing lines Y-TRW passing through the second non-display area NA2 can be disposed to overlap the connection pattern CP made of the same material as the common electrode CE. The encapsulation layer ENCAP and the connection pattern CP can be present between the second touch routing line Y-TRW_TSM including the touch sensor metal and the second touch routing line Y-TRW_SD including the first metal, which are included in the m second touch routing lines Y-TRW passing through the second non-display area NA2.

Referring to FIGS. 37 and 38, the connection pattern CP can include the same material as the pixel electrode PE in the display area AA.

Referring to FIGS. 37 and 38, the m second touch routing lines Y-TRW passing through the second non-display area NA2 can be disposed to overlap the connection pattern CP made of the same material as the pixel electrode PE. The encapsulation layer ENCAP and the connection pattern CP that is made of the same material as the pixel electrode PE can be present between the second touch routing line Y-TRW_TSM including the touch sensor metal and the second touch routing line Y-TRW_SD including the first metal, which are included in the m second touch routing lines Y-TRW passing through the second non-display area NA2.

Referring to FIGS. 39 and 40, the connection pattern CP can include the same material as the gate electrode of the transistor (e.g., T1 or T2) in the display area AA, and can include the same material as the gate line GL in the display area AA.

Referring to FIGS. 39 and 40, the m second touch routing lines Y-TRW passing through the second non-display area NA2 can be disposed to overlap the connection pattern CP made of the same material as the gate electrode or the gate line GL.

Referring to FIGS. 39 and 40, the encapsulation layer ENCAP is disposed between the second touch routing line Y-TRW_TSM including the touch sensor metal and the second touch routing line Y-TRW_SD including the first metal, which are included in the m second touch routing lines Y-TRW passing through the second non-display area NA2. The connection pattern CP made of the same material as the gate electrode or the gate line GL can be located under the second touch routing line Y-TRW_SD including the first metal.

Referring to FIGS. 37 to 40, the touch display device can further include a noise-blocking pattern NBP disposed between the m second touch routing lines Y-TRW passing through the second non-display area NA2 and the gate driving circuit GDC, and having the common voltage VSS applied thereto.

The noise-blocking pattern NBP can be electrically connected to the power transmission pattern PTP through the connection pattern CP. The noise-blocking pattern NBP can also be electrically connected to the common electrode CE.

As the noise-blocking pattern NBP is formed, unnecessary parasitic capacitance can be prevented from being formed between the second touch routing line Y-TRW and the gate driving circuit GDC. The noise-blocking pattern NBP can prevent the second touch routing line Y-TRW from being affected by the gate driving circuit GDC.

Referring to FIGS. 6 and 14, in the case of a half-single routing structure, the touch pad part TPA can further include m additional second touch pads Y-TP disposed in the first non-display area NA1. The touch display device can further include m additional second touch routing lines Y-TRW electrically connecting the m second touch electrode lines Y-TEL to the m additional second touch pads Y-TP disposed in the first non-display area NA1.

Referring to FIGS. 6 and 14, the m second touch routing lines Y-TRW electrically connect one ends of the m second touch electrode lines Y-TEL to m second touch pads Y-TP disposed in the first non-display area NA1, respectively. The m additional second touch routing lines Y-TRW electrically connect the other ends of the m second touch electrode lines to the m additional second touch pads Y-TP disposed in the first non-display area NA1, respectively.

Referring to FIGS. 6 and 14, the m second touch routing lines Y-TRW can pass through the second non-display area NA2, and the m additional second touch routing lines Y-TRW can pass through the third non-display area NA3.

Figure 41:
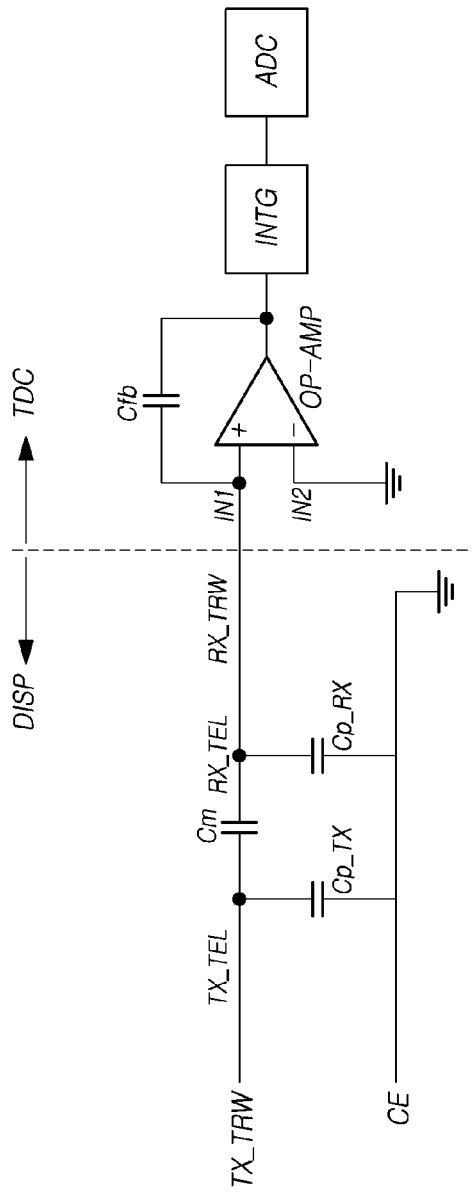
FIG. 41 is an equivalent circuit of the sensing system according to the arrangement structures of FIGS. 33 to 40.

FIG. 41 is an equivalent circuit of a sensing system according to the arrangement structures of FIGS. 33 to 40.

Referring to FIG. 41, in the case of a single-routing structure or a half-single routing structure, the second touch routing line Y-TRW passing through the second non-display area NA2 can be disposed without overlapping the common electrode CE according to the arrangement structures of FIGS. 33 to 40. Accordingly, parasitic capacitance between the second touch routing lines Y-TRW and the common electrode CE may not be formed.

In the case of a single-routing structure or a half-single routing structure, the first touch routing line X-TRW can be disposed without overlapping the common electrode CE even in the third non-display area NA3. Accordingly, parasitic capacitance between the first touch routing line X-TRW and the common electrode CE may not be formed.

In the case of a half-single routing structure, the two or more second touch routing lines Y-TRW can be disposed without overlapping the common electrode CE even in the third non-display area NA3. Accordingly, parasitic capacitance between the second touch routing line Y-TRW and the common electrode CE may not be formed.

In the case that the first touch routing lines X-TRW are receiving touch routing line RX_TRW and the second touch routing lines Y-TRW are transmission touch routing line TX_TRW, in the non-display area NA, the parasitic capacitance Cp_RX_R between the receiving touch routing line RX_TRW and the common electrode CE and the parasitic capacitance Cp_TX_R between the transmission touch routing line TX_TRW and the common electrode CE are not formed according to the arrangement structures of FIGS. 33 to 40 (compare with FIG. 17). Accordingly, touch sensitivity can be improved.

Figure 42:
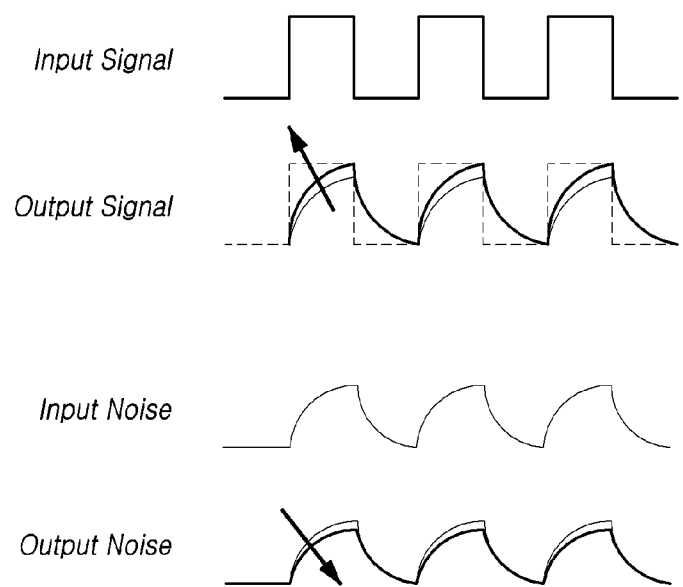
FIG. 42 is a view illustrating touch signals and noise changed according to the arrangement structures for implementing a narrow bezel in the touch display device according to embodiments of the present disclosure.

FIG. 42 is a view illustrating touch signals (an input signal and an output signal) and noise changed according to the arrangement structures for implementing a narrow bezel in the touch display device according to the embodiments of the present disclosure.

Referring to FIG. 42, a driving signal, which is an input signal applied to the transmission touch electrode line TX_TEL, can be a signal of various forms such as a sine wave, a triangle wave, a square wave, and the like, but for convenience of description, it is assumed that the driving signal is in the form of a square wave. It is assumed that input noise is generated in the common electrode CE.

When the arrangement structures described above with reference to FIGS. 18 to 41 are utilized, noise is reduced at an output point (corresponding to the IN1 of the OP-AMP) at which an output signal is output to the touch driving circuit TDC through the receiving touch routing line RX_TRW in the display panel DISP. With such a reduction in noise, the signal strength of the output signal can be increased at the output point. Thus, a signal-to-noise ratio is increased so that touch sensitivity can be improved.

According to the embodiments of the present disclosure, the bezel size can be reduced through the multilayer structure of the touch routing lines connecting the touch sensor to the touch sensing circuit even when the touch routing lines are disposed in the non-display area.

According to the embodiments of the present disclosure, by changing the arrangement structure of the touch routing lines connecting the touch sensor and the touch sensing circuit in consideration of the location of the common electrode, parasitic capacitance due to the touch routing lines can be prevented from being formed, so that touch sensitivity can be improved.

According to the embodiments of the present disclosure, it is possible to provide the touch display device having the arrangement structure of the touch routing lines suitable for a double routing structure.

According to the embodiments of the present disclosure, it is possible to provide the touch display device having the arrangement structure of the touch routing lines suitable for a single routing structure.

According to the embodiments of the present disclosure, it is possible to provide the touch display device having the arrangement structure of the touch routing lines suitable for a half-single routing structure.

The above description has been presented to enable any person skilled in the art to make and use the technical idea of the present disclosure, and has been provided in the context of a particular application and its requirements. Various modifications, additions, and substitutions to the described embodiments will be readily apparent to those skilled in the art, and the general principles defined herein can be applied to other embodiments and applications without departing from the spirit and scope of the present disclosure. The above description and the accompanying drawings provide an example of the technical idea of the present disclosure for illustrative purposes only. For example, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A touch display device comprising:
a plurality of pixel electrodes each disposed for each of a plurality of subpixel areas on a substrate;
a common electrode disposed on the plurality of pixel electrodes and to which a common voltage is applied;
an encapsulation layer disposed to cover the common electrode;
a touch sensor including n first touch electrode lines and m second touch electrode lines disposed on the encapsulation layer in a display area, where n and m are natural numbers, wherein each of the n first touch electrode lines and the m second touch electrode lines includes one or more touch sensor metals;
a touch pad part disposed in a first non-display area, which is located at an outer periphery of the display area in a first direction, among non-display areas that are outer areas of the display area and including 2n first touch pads and 2m second touch pads;
2n first touch routing lines extending downward along an inclined surface of the encapsulation layer and electrically connecting one ends and other ends of the n first touch electrode lines to the 2n first touch pads disposed in the first non-display area, respectively; and
2m second touch routing lines extending downward along the inclined surface of the encapsulation layer and electrically connecting one ends and other ends of the m second touch electrode lines to the 2m second touch pads disposed in the first non-display area, respectively,
wherein two or more first touch routing lines among the 2n first touch routing lines and two or more second touch routing lines among the 2m second touch routing lines pass through a second non-display area located at an outer periphery of the display area in a second direction,
the two or more first touch routing lines passing through the second non-display area include one or more first touch routing lines including the touch sensor metal and one or more first touch routing lines including a first metal different from the touch sensor metal, and
the two or more second touch routing lines passing through the second non-display area include one or more second touch routing lines including the touch sensor metal and one or more second touch routing lines including the first metal, and
wherein
in the two or more first touch routing lines passing through the second non-display area, the one or more first touch routing lines including the touch sensor metal and the one or more first touch routing lines including the first metal are disposed to be staggered on different layers, or
in the two or more second touch routing lines passing through the second non-display area, the one or more second touch routing lines including the touch sensor metal and the one or more second touch routing lines including the first metal are disposed to be staggered on different layers.

2. The touch display device of claim 1, wherein the first metal includes at least one of:
a source-drain metal included in source and drain electrodes of transistors disposed in the display area, and
a gate metal included in gate electrodes of the transistors disposed in the display area.

3. The touch display device of claim 1, further comprising a gate driving circuit electrically connected to a plurality of gate lines disposed in the display area, disposed in the second non-display area, and including transistors including the first metal.

4. The touch display device of claim 3, further comprising a power transmission pattern disposed in the second non-display area and configured to transmit the common voltage to the common electrode.

5. The touch display device of claim 4, wherein the power transmission pattern includes the first metal.

6. The touch display device of claim 4, wherein the power transmission pattern is disposed to be closer to the display area than the gate driving circuit.

7. The touch display device of claim 3, wherein the common electrode extending from the display area to the second non-display area overlaps the gate driving circuit.

8. The touch display device of claim 4, wherein the common electrode is open so that the gate driving circuit is exposed.

9. The touch display device of claim 1, wherein the two or more first touch routing lines passing through the second non-display area and the two or more second touch routing lines passing through the second non-display area are disposed without overlapping the common electrode extending from the display area to the second non-display area.

10. The touch display device of claim 1, wherein the two or more second touch routing lines passing through the second non-display area are disposed further outward than the two or more first touch routing lines passing through the second non-display area.

11. The touch display device of claim 10, wherein
the one or more first touch routing lines, which include the touch sensor metal, among the two or more first touch routing lines passing through the second non-display area are disposed on the encapsulation layer, and
the one or more first touch routing lines, which include the first metal, among the two or more first touch routing lines passing through the second non-display area are disposed below the encapsulation layer.

12. The touch display device of claim 11, wherein some of the one or more first touch routing lines, which include the touch sensor metal, among the two or more first touch routing lines passing through the second non-display area overlap the inclined surface of the encapsulation layer in the second non-display area.

13. The touch display device of claim 11, wherein
each of the two or more first touch routing lines passing through the second non-display area includes an upper line including the touch sensor metal and a lower line including the first metal,
one end of the upper line is in contact with one end of the lower line at a first point located at an outer periphery of an end portion of the encapsulation layer in the first direction, and
another end of the upper line is in contact with another end of the lower line at a third point located at an outer periphery of an opposite end portion of the encapsulation layer in a direction opposite to the first direction.

14. The touch display device of claim 1, wherein the n first touch electrode lines are transmission electrode lines to which a driving signal is applied by a touch sensing circuit, and the m second touch electrode lines are receiving electrode lines from which a signal is detected by the touch sensing circuit.

15. The touch display device of claim 1, wherein the n first touch electrode lines are receiving electrode lines from which a signal is detected by a touch sensing circuit, and the m second touch electrode lines are transmission electrode lines to which a driving signal is applied by the touch sensing circuit.

16. The touch display device of claim 1, wherein each of the n first touch electrode lines is one bar-shaped line, and each of the m second touch electrode lines is one bar-shaped line.

17. The touch display device of claim 1, wherein
each of the n first touch electrode lines includes a plurality of first touch electrodes connected through a first bridge pattern, wherein the first bridge pattern is a pattern located on the same layer as the plurality of first touch electrodes and integrated with the plurality of first touch electrodes or a pattern located on a different layer from the plurality of first touch electrodes and connected to the plurality of first touch electrodes, or
each of the m second touch electrode lines includes a plurality of second touch electrodes connected through a second bridge pattern, wherein the second bridge pattern is a pattern located on the same layer as the plurality of second touch electrodes and integrated with the plurality of second touch electrodes or a pattern located on a different layer from the plurality of second touch electrodes and connected to the plurality of second touch electrodes.

18. The touch display device of claim 17, wherein the touch sensor metal includes an electrode metal included in the plurality of first touch electrodes and the plurality of second touch electrodes, or a bridge metal included in the first bridge pattern or the second bridge pattern.

19. The touch display device of claim 1, wherein
each of the n first touch electrode lines and the m second touch electrode lines is a mesh type having a plurality of open areas, and
each of the plurality of open areas corresponds to a light-emitting area of one or more subpixels.

20. The touch display device of claim 1, further comprising one or more dams disposed between the display area and the touch pad part, having a height greater than a height of the touch pad part, and including the same material as a bank disposed in the display area.

21. The touch display device of claim 1, wherein
the common electrode is disposed in the display area and extends to a partial area of the non-display area, and
the encapsulation layer is disposed in the display area and extends to a partial area of the non-display area further outward than the common electrode.

22. The touch display device of claim 1, wherein common electrode extends into the second non-display area, and
wherein none of the first and second touch routing lines overlap with the common electrode.

23. The touch display device of claim 1, wherein the encapsulation layer is disposed between at least two of the first touch routing lines.

24. A touch display device comprising:
a plurality of pixel electrodes each disposed for each of a plurality of subpixel areas on a substrate;
a common electrode disposed on the plurality of pixel electrodes and to which a common voltage is applied;
an encapsulation layer disposed to cover the common electrode;
a touch sensor including n first touch electrode lines and m second touch electrode lines disposed on the encapsulation layer in a display area, where n and m are natural numbers, wherein each of the n first touch electrode lines and the m second touch electrode lines includes one or more touch sensor metals;
a touch pad part disposed in a first non-display area, which is located at an outer periphery of the display area in a first direction, among non-display areas that are outer areas of the display area and including 2n first touch pads and 2m second touch pads;
2n first touch routing lines extending downward along an inclined surface of the encapsulation layer and electrically connecting one ends and other ends of the n first touch electrode lines to the 2n first touch pads disposed in the first non-display area, respectively; and
2m second touch routing lines extending downward along the inclined surface of the encapsulation layer and electrically connecting one ends and other ends of the m second touch electrode lines to the 2m second touch pads disposed in the first non-display area, respectively, wherein two or more first touch routing lines among the 2n first touch routing lines and two or more second touch routing lines among the 2m second touch routing lines pass through a second non-display area located at an outer periphery of the display area in a second direction, the two or more first touch routing lines passing through the second non-display area include one or more first touch routing lines including the touch sensor metal and one or more first touch routing lines including a first metal different from the touch sensor metal, and the two or more second touch routing lines passing through the second non-display area include one or more second touch routing lines including the touch sensor metal and one or more second touch routing lines including the first metal, wherein the touch display device further comprises:
  a gate driving circuit electrically connected to a plurality of gate lines disposed in the display area, disposed in the second non-display area, and including transistors including the first metal; and
  a power transmission pattern disposed in the second non-display area and configured to transmit the common voltage to the common electrode, and wherein the power transmission pattern is disposed to be closer to the display area than the gate driving circuit.

25. A touch display device comprising:
a plurality of pixel electrodes each disposed for each of a plurality of subpixel areas on a substrate;
a common electrode disposed on the plurality of pixel electrodes and to which a common voltage is applied;
an encapsulation layer disposed to cover the common electrode;
a touch sensor including n first touch electrode lines and m second touch electrode lines disposed on the encapsulation layer in a display area, where n and m are natural numbers, wherein each of the n first touch electrode lines and the m second touch electrode lines includes one or more touch sensor metals;
a touch pad part disposed in a first non-display area, which is located at an outer periphery of the display area in a first direction, among non-display areas that are outer areas of the display area and including 2n first touch pads and 2m second touch pads;
2n first touch routing lines extending downward along an inclined surface of the encapsulation layer and electrically connecting one ends and other ends of the n first touch electrode lines to the 2n first touch pads disposed in the first non-display area, respectively; and
2m second touch routing lines extending downward along the inclined surface of the encapsulation layer and electrically connecting one ends and other ends of the m second touch electrode lines to the 2m second touch pads disposed in the first non-display area, respectively, wherein two or more first touch routing lines among the 2n first touch routing lines and two or more second touch routing lines among the 2m second touch routing lines pass through a second non-display area located at an outer periphery of the display area in a second direction, the two or more first touch routing lines passing through the second non-display area include one or more first touch routing lines including the touch sensor metal and one or more first touch routing lines including a first metal different from the touch sensor metal, and the two or more second touch routing lines passing through the second non-display area include one or more second touch routing lines including the touch sensor metal and one or more second touch routing lines including the first metal, wherein the touch display device further comprises a gate driving circuit electrically connected to a plurality of gate lines disposed in the display area, disposed in the second non-display area, and including transistors including the first metal, and wherein the common electrode extending from the display area to the second non-display area overlaps the gate driving circuit.

26. A touch display device comprising:
a plurality of pixel electrodes each disposed for each of a plurality of subpixel areas on a substrate;
a common electrode disposed on the plurality of pixel electrodes and to which a common voltage is applied;
an encapsulation layer disposed to cover the common electrode;
a touch sensor including n first touch electrode lines and m second touch electrode lines disposed on the encapsulation layer in a display area, where n and m are natural numbers, wherein each of the n first touch electrode lines and the m second touch electrode lines includes one or more touch sensor metals;
a touch pad part disposed in a first non-display area, which is located at an outer periphery of the display area in a first direction, among non-display areas that are outer areas of the display area and including 2n first touch pads and 2m second touch pads;
2n first touch routing lines extending downward along an inclined surface of the encapsulation layer and electrically connecting one ends and other ends of the n first touch electrode lines to the 2n first touch pads disposed in the first non-display area, respectively; and
2m second touch routing lines extending downward along the inclined surface of the encapsulation layer and electrically connecting one ends and other ends of the m second touch electrode lines to the 2m second touch pads disposed in the first non-display area, respectively, wherein two or more first touch routing lines among the 2n first touch routing lines and two or more second touch routing lines among the 2m second touch routing lines pass through a second non-display area located at an outer periphery of the display area in a second direction, the two or more first touch routing lines passing through the second non-display area include one or more first touch routing lines including the touch sensor metal and one or more first touch routing lines including a first metal different from the touch sensor metal, and the two or more second touch routing lines passing through the second non-display area include one or more second touch routing lines including the touch sensor metal and one or more second touch routing lines including the first metal, wherein the two or more second touch routing lines passing through the second non-display area are disposed further outward than the two or more first touch routing lines passing through the second non-display area, wherein the one or more first touch routing lines, which include the touch sensor metal, among the two or more first touch routing lines passing through the second non-display area are disposed on the encapsulation layer, and wherein the one or more first touch routing lines, which include the first metal, among the two or more first touch routing lines passing through the second non-display area are disposed below the encapsulation layer.

* * * * *